(12) United States Patent
Miyata et al.

(10) Patent No.: US 12,170,519 B2
(45) Date of Patent: Dec. 17, 2024

(54) SEMICONDUCTOR DEVICE

(71) Applicant: SEMICONDUCTOR ENERGY LABORATORY CO., LTD., Atsugi (JP)

(72) Inventors: Shoki Miyata, Kanagawa (JP); Yuto Yakubo, Kanagawa (JP); Yoshiyuki Kurokawa, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 50 days.

(21) Appl. No.: 17/847,241

(22) Filed: Jun. 23, 2022

(65) Prior Publication Data

US 2023/0018223 A1 Jan. 19, 2023

(30) Foreign Application Priority Data

Jul. 7, 2021 (JP) .................................. 2021-112793
Jul. 7, 2021 (JP) .................................. 2021-112798

(51) Int. Cl.
*H03K 19/096* (2006.01)
*H03K 19/20* (2006.01)
*H03M 1/46* (2006.01)

(52) U.S. Cl.
CPC ......... *H03K 19/0963* (2013.01); *H03K 19/20* (2013.01); *H03M 1/462* (2013.01)

(58) Field of Classification Search
None
See application file for complete search history.

(56) References Cited

U.S. PATENT DOCUMENTS

| | | | |
|---|---|---|---|
| 9,012,949 | B2 | 4/2015 | Yamazaki et al. |
| 9,716,852 | B2 | 7/2017 | Kurokawa |
| 9,773,832 | B2 | 9/2017 | Kurokawa |
| 9,851,942 | B2 | 12/2017 | Kurokawa |
| 10,141,069 | B2 | 11/2018 | Ikeda et al. |
| 10,319,743 | B2 | 6/2019 | Kurokawa |

(Continued)

FOREIGN PATENT DOCUMENTS

| | | |
|---|---|---|
| WO | WO-2020/254909 | 12/2020 |
| WO | WO-2022/084782 | 4/2022 |
| WO | WO-2022/248972 | 12/2022 |

OTHER PUBLICATIONS

Josephsen.S, "An Ultra-Low Power SAR-ADC in 65 nm CMOS Technology", NTNU-Trondheim, Jun. 1, 2013, pp. 1-63.

*Primary Examiner* — Jany Richardson
(74) *Attorney, Agent, or Firm* — NIXON PEABODY LLP; Jeffrey L. Costellia

(57) ABSTRACT

A semiconductor device with reduced power consumption can be provided. The semiconductor device includes a first transistor and a second transistor. The first transistor is a p-channel transistor including silicon in a channel formation region and the second transistor is an n-channel transistor including a metal oxide in a channel formation region. The metal oxide includes indium, an element M (e.g., gallium), and zinc. A gate of the first transistor is electrically connected to a gate of the second transistor, and one of a source and a drain of the first transistor is electrically connected to one of a source and a drain of the second transistor. The first transistor and the second transistor can each operate in a subthreshold region.

12 Claims, 20 Drawing Sheets

(56) References Cited

U.S. PATENT DOCUMENTS

| | | |
|---|---|---|
| 11,037,525 B2 | 6/2021 | Shiokawa et al. |
| 2016/0293643 A1 | 10/2016 | Kim et al. |
| 2017/0317085 A1 | 11/2017 | Kurokawa |
| 2018/0004881 A1 | 1/2018 | Li et al. |
| 2018/0005588 A1 | 1/2018 | Kurokawa |
| 2020/0028498 A1* | 1/2020 | Kimura ................ G11C 13/003 |
| 2022/0254401 A1 | 8/2022 | Kurokawa. et al. |
| 2023/0380175 A1 | 11/2023 | Yamazaki et al. |

* cited by examiner

FIG. 17A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 17B
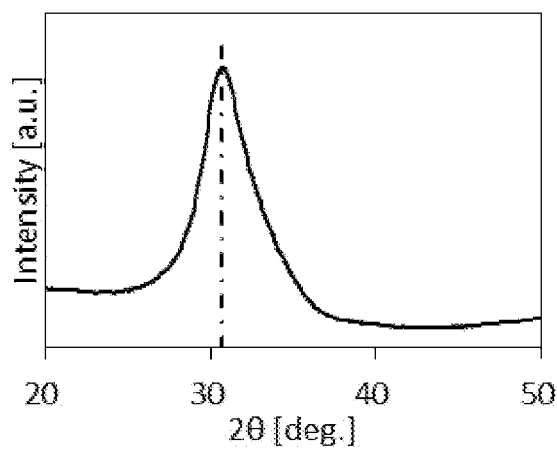
FIG. 17C
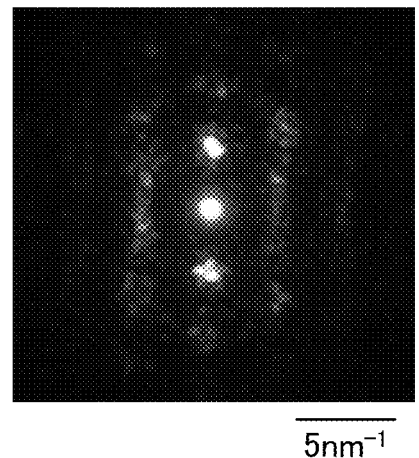

SEMICONDUCTOR DEVICE

BACKGROUND OF THE INVENTION

1. Field of the Invention

One embodiment of the present invention relates to a semiconductor device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display apparatus, a liquid crystal display apparatus, a light-emitting apparatus, a power storage device, an imaging device, a memory device, a signal processing device, a processor, an electronic device, a system, a driving method thereof, a manufacturing method thereof, and a testing method thereof.

2. Description of the Related Art

A variety of semiconductor devices such as CPUs and memory devices are used in information terminals such as smartphones, tablet terminals, and desktop personal computers (PCs). In addition, the quantity of data processed in information terminals such as smartphones, tablet terminals, and desktop personal PCs are increasing with the development of information technology and such information terminals desirably include semiconductor devices capable of high-speed processing for a large quantity of data. Thus, the increase of the data quantity results in an increase of power consumption of information terminals. On the other hand, for example, it is known that the amount of current used in IoT electronic devices, circuits for energy harvest, or sensors used in biomedical fields is small and the power consumption in such devices, circuits, or sensors is small. In addition, in such devices, circuits, or sensors, successive approximation register analog-to-digital converter circuits (SAR-ADCs) having low power consumption are used in some cases. Non-Patent Document 1 discloses a SAR-ADC in which a flip flop circuit and a latch circuit each include only a logic circuit.

REFERENCE

Non-Patent Document

Non-Patent Document 1: S. Josephsen, "An Ultra-Low Power SAR-ADC in 65 nm CMOS Technology," [online], June, 2013. Norwegian University of Science and Technology. [searched on Jun. 25, 2021], Internet <URL:https://ntnuopen.ntnu.no/ntnu-xmlui/bitstream/handle/11250/2433737/8707_FULLTEXT.pdf>

SUMMARY OF THE INVENTION

As described above, the SAR-ADC has a circuit configuration including a logic circuit, for example. Note that in this specification and the like, a SAR-ADC including a logic circuit is referred to as a SAR-ADC logic circuit.

The logic circuit includes a CMOS circuit, for example. Although the driving speed of a CMOS circuit is preferably high, the driving voltage input to the CMOS circuit is required to be high so as to have a faster driving speed. However, when the driving voltage is high, the amount of current flowing in a CMOS circuit increases, leading to higher power consumption.

In IoT electronic devices, circuits for energy harvest, or sensors used in biomedical fields, CMOS circuits are not necessarily to be driven at high speed. In other words, CMOS circuits capable of operating at low driving voltages are used in such devices, circuits, or sensors, whereby the power consumption of SAR-ADC logic circuits can be reduced in some cases.

An object of one embodiment of the present invention is to provide a semiconductor device with reduced power consumption. Another object of one embodiment of the present invention is to provide a novel semiconductor device. Another object of one embodiment of the present invention is to provide an electronic device including a novel semiconductor device.

Note that the objects of one embodiment of the present invention are not limited to the objects listed above. The objects listed above do not preclude the existence of other objects. Note that the other objects are objects that are not described in this section and are described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

One embodiment of the present invention is a semiconductor device including a first transistor and a second transistor. In the semiconductor device, the first transistor is a p-channel transistor including silicon in a channel formation region; the second transistor is an n-channel transistor including a metal oxide in a channel formation region; the metal oxide includes indium, an element M (M is one kind or a plurality of kinds of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, and magnesium), and zinc; a gate of the first transistor is electrically connected to a gate of the second transistor; one of a source and a drain of the first transistor is electrically connected to one of a source and a drain of the second transistor; and each of the first transistor and the second transistor can operate in a subthreshold region.

Another embodiment of the present invention is a semiconductor device including a third transistor, a fourth transistor, a fifth transistor, and a sixth transistor. In the semiconductor device, each of the third transistor and the fifth transistor is a p-channel transistor including silicon in a channel formation region; each of the fourth transistor and the sixth transistor is an n-channel transistor including a metal oxide in a channel formation region; the metal oxide includes indium, an element M (M is one kind or a plurality of kinds of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, and magnesium), and zinc; a gate of the third transistor is electrically connected to a gate of the fourth transistor; one of a source and a drain of the third transistor is electrically connected to one of a source and a drain of the fifth transistor; one of a source and a drain of the fourth transistor is electrically connected to one of a source and a drain of the sixth transistor; the other of the source and the drain of the fifth transistor is electrically connected to the other of the source and the drain of the sixth transistor; and each of the third transistor to the sixth transistor can operate in a subthreshold region.

Another embodiment of the present invention is a semiconductor device including a seventh transistor, an eighth transistor, a ninth transistor, a tenth transistor, an eleventh transistor, and a twelfth transistor. In the semiconductor device, each of the seventh transistor and the ninth transistor is a p-channel transistor including silicon in a channel formation region; each of the eighth transistor, the tenth transistor, and the eleventh transistor, and the twelfth transistor is an n-channel transistor including a metal oxide in a channel formation region; the metal oxide includes indium, an element M (M is one kind or a plurality of kinds of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, and magnesium), and zinc; a gate of the seventh transistor is electrically connected to a gate of the eighth transistor and a gate of the twelfth transistor; a gate of the ninth transistor is electrically connected to a gate of the tenth transistor and a gate of the eleventh transistor; one of a source and a drain of the seventh transistor is electrically connected to one of a source and a drain of the eighth transistor, one of a source and a drain of the ninth transistor, and one of a source and a drain of the tenth transistor; the other of the source and the drain of the eighth transistor is electrically connected to one of a source and a drain of the eleventh transistor; the other of the source and the drain of the tenth transistor is electrically connected to one of a source and a drain of the twelfth transistor; and each of the seventh transistor to the twelfth transistor can operate in a subthreshold region.

Another embodiment of the present invention is a semiconductor device including a thirteenth transistor, a fourteenth transistor, a fifteenth transistor, and a sixteenth transistor. In the semiconductor device, each of the thirteenth transistor and the fifteenth transistor is a p-channel transistor including silicon in a channel formation region; each of the fourteenth transistor and the sixteenth transistor is an n-channel transistor including a metal oxide in a channel formation region; the metal oxide includes indium, an element M (M is one kind or a plurality of kinds of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, and magnesium), and zinc; a gate of the thirteenth transistor is electrically connected to a gate of the fourteenth transistor; a gate of the fifteenth transistor is electrically connected to a gate of the sixteenth transistor; one of a source and a drain of the thirteenth transistor is electrically connected to one of a source and a drain of the fourteenth transistor and one of a source and a drain of the sixteenth transistor; the other of the source and the drain of the thirteenth transistor is electrically connected to one of a source and a drain of the fifteenth transistor; and each of the thirteenth transistor to the sixteenth transistor can operate in a subthreshold region.

Another embodiment of the present invention is a semiconductor device including a first circuit and a first inverter circuit. In the semiconductor device, the first circuit includes a first transistor and a first capacitor; the first transistor is an n-channel transistor including a metal oxide in a channel formation region; the metal oxide includes indium, an element M (M is one kind or a plurality of kinds of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, and magnesium), and zinc; an output terminal of the first circuit is electrically connected to an input terminal of the first inverter circuit; one of a source and a drain of the first transistor is electrically connected to a first terminal of the first capacitor and the output terminal of the first circuit; and a transistor included in the first inverter circuit can operate in a subthreshold region.

In the above embodiment of the present invention, the semiconductor device may further include a second circuit and a second inverter circuit. In particular, the second circuit preferably includes a second transistor and a second capacitor, and the second transistor is preferably the n-channel transistor including a metal oxide in a channel formation region. Preferably, an output terminal of the first inverter circuit is electrically connected to an input terminal of the second circuit; an output terminal of the second circuit is electrically connected to an input terminal of the second inverter circuit; and an output terminal of the second inverter circuit is electrically connected to an input terminal of the first circuit. Preferably, the other of the source and the drain of the first transistor is electrically connected to the input terminal of the first circuit; one of a source and a drain of the second transistor is electrically connected to a first terminal of the second capacitor and the output terminal of the second circuit; the other of the source and the drain of the second transistor is electrically connected to the input terminal of the second circuit; and a transistor included in the second inverter circuit can operate in a subthreshold region.

Another embodiment of the present invention is a semiconductor device including a first circuit and a first inverter circuit. In the semiconductor device, the first circuit includes a first transistor, a third transistor, a fourth transistor, a fifth transistor, a sixth transistor, and a first capacitor; each of the first transistor, the fourth transistor, and the sixth transistor is an n-channel transistor including a metal oxide in a channel formation region; the metal oxide includes indium, an element M (M is one kind or a plurality of kinds of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, and magnesium), and zinc; each of the third transistor and the fifth transistor is a p-channel transistor including silicon in a channel formation region; an output terminal of the first circuit is electrically connected to an input terminal of the first inverter circuit; one of a source and a drain of the first transistor is electrically connected to a first terminal of the first capacitor and a gate of the fourth transistor; one of a source and a drain of the third transistor is electrically connected to one of a source and a drain of the fourth transistor, a gate of the fifth transistor, and a gate of the sixth transistor; one of a source and a drain of the fifth transistor is electrically connected to one of a source and a drain of the sixth transistor and the output terminal of the first circuit; and each of a transistor included in the first inverter circuit, the third transistor, the fourth transistor, the fifth transistor, and the sixth transistor can operate in a subthreshold region.

In the above embodiment of the present invention, the semiconductor device may further include a second circuit and a second inverter circuit. In particular, the second circuit preferably includes a second transistor, a seventh transistor, an eighth transistor, a ninth transistor, a tenth transistor, and a second capacitor. Preferably, each of the second transistor, the eighth transistor, and the tenth transistor is an n-channel transistor including a metal oxide in a channel formation region; each of the seventh transistor and the ninth transistor is a p-channel transistor including silicon in a channel formation region; an output terminal of the first inverter circuit is electrically connected to an input terminal of the second circuit; an output terminal of the second circuit is electrically connected to an input terminal of the second inverter circuit; an output terminal of the second inverter circuit is electrically connected to an input terminal of the first circuit; the other of the source and the drain of the first transistor is electrically connected to the input terminal of the first circuit; one of a source and a drain of the second transistor is electrically connected to a first terminal of the second capacitor and a gate of the eighth transistor; one of a source and a drain of the seventh transistor is electrically connected to one of a source and a drain of the eighth transistor, a gate of the ninth transistor, and a gate of the tenth transistor; one of a source and a drain of the ninth transistor is electrically connected to one of a source and a drain of the tenth transistor and the output terminal of the first circuit; and each of a transistor included in the second inverter circuit, the seventh transistor, the eighth transistor, the ninth transistor, and the tenth transistor can operate in a subthreshold region.

In this specification and the like, a semiconductor device means a device that utilizes semiconductor characteristics, and refers to a circuit including a semiconductor element (e.g., a transistor, a diode, or a photodiode) and a device including the circuit. The semiconductor device also means any device that can function by utilizing semiconductor characteristics. For example, an integrated circuit, a chip including an integrated circuit, and an electronic component including a chip in a package are examples of the semiconductor device. Moreover, a memory device, a display apparatus, a light-emitting apparatus, a lighting device, an electronic device, and the like themselves might be semiconductor devices, or might each include a semiconductor device.

In the case in which there is a description "X and Y are connected" in this specification and the like, the case in which X and Y are electrically connected, the case in which X and Y are functionally connected, and the case in which X and Y are directly connected are regarded as being disclosed in this specification and the like. Accordingly, without being limited to a predetermined connection relation, for example, a connection relation illustrated in drawings or texts, a connection relation other than one illustrated in drawings or texts is regarded as being disclosed in the drawings or the texts. Each of X and Y denotes an object (e.g., a device, an element, a circuit, a wiring, an electrode, a terminal, a conductive film, or a layer).

For example, in the case in which X and Y are electrically connected, one or more elements that allow(s) electrical connection between X and Y (e.g., a switch, a transistor, a capacitor element, an inductor, a resistor element, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether a current flows or not.

For example, in the case in which X and Y are functionally connected, one or more circuits that can make a functional connection between X and Y (e.g., a logic circuit such has an inverter, a NAND circuit and a NOR circuit; a signal converter circuit such as a digital-to-analog converter circuit, an analog-to-digital converter circuit, and a gamma correction circuit; a potential level converter circuit such as a power supply circuit such as a step-up circuit or a step-down circuit, and a level shifter circuit for changing the potential level of a signal; a voltage source; a current source; a switching circuit; an amplifier circuit such as a circuit that can increase signal amplitude, the amount of a current, or the like, an operational amplifier, a differential amplifier circuit, a source follower circuit, and a buffer circuit; a signal generation circuit; a memory circuit; and a control circuit) can be connected between X and Y. For example, even when another circuit is provided between X and Y, X and Y are functionally connected to each other when a signal output from X is transmitted to Y.

Note that an explicit description, X and Y are electrically connected, includes the case in which X and Y are electrically connected (i.e., the case in which X and Y are connected with another element or another circuit interposed therebetween) and the case in which X and Y are directly connected (i.e., the case in which X and Y are connected without another element or another circuit interposed therebetween).

This specification describes a circuit configuration in which a plurality of elements are electrically connected to a wiring (a wiring for supplying a constant potential or a wiring for transmitting a signal). For example, in the case in which X is directly connected to a wiring and Y is directly connected to the wiring, this specification may describe that X and Y are directly and electrically connected to each other.

It can be expressed as, for example, "X, Y, a source (sometimes called one of a first terminal and a second terminal) of a transistor, and a drain (sometimes called the other of the first terminal and the second terminal) of the transistor are electrically connected to each other, and X, the source of the transistor, the drain of the transistor, and Y are electrically connected to each other in this order". Alternatively, it can be expressed as "a source of a transistor is electrically connected to X; a drain of the transistor is electrically connected to Y; and X, the source of the transistor, the drain of the transistor, and Y are electrically connected to each other in this order". Alternatively, it can be expressed as "X is electrically connected to Y through a source and a drain of a transistor, and X, the source of the transistor, the drain of the transistor, and Y are provided in this connection order". When the connection order in a circuit configuration is defined by an expression similar to the above examples, a source and a drain of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also serves as an electrode, one conductive film has functions of both components: a function of the wiring and a function of the electrode. Thus, electrical connection in this specification includes, in its category, such a case in which one conductive film has functions of a plurality of components.

In this specification and the like, a "resistor element" can be, for example, a circuit element or a wiring having a resistance higher than 0Ω. Therefore, in this specification and the like, a "resistor element" includes a wiring having a resistance, a transistor in which a current flows between its source and drain, a diode, a coil, and the like. Thus, the term "resistor element" can be sometimes replaced with the terms "resistor", "load", or "region having a resistance"; conversely, the terms "resistor", "load", or "region having a resistance" can be sometimes replaced with the term "resistor element". The resistance can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance may be higher than or equal to 1Ω and lower than or equal to $1 \times 10^9 \Omega$.

In this specification and the like, a "capacitor element" can be, for example, a circuit element having an electrostatic capacitance higher than 0 F, a region of a wiring having an electrostatic capacitance higher than 0 F, parasitic capacitance, or gate capacitance of a transistor. The terms such as "capacitor", "parasitic capacitance", and "gate capacitance" can be replaced with the term "capacitance" in some cases. Conversely, the term "capacitance" can be replaced with the terms "capacitor", "parasitic capacitance", and "gate capacitance". In addition, the "capacitor" (including a capacitor with three or more terminals) includes an insulator and a pair of conductors between which an insulator is interposed. The term "a pair of conductors" of a capacitor can be replaced with the terms "a pair of electrodes", "a pair of conductive regions" "a pair of regions", or "a pair of terminals". In addition, the terms "one of a pair of terminals" and "the other of the pair of terminals" are referred to as a first terminal and a second terminal, respectively, in some cases. Note that the electrostatic capacitance can be higher than or equal to 0.05 fF and lower than or equal to 10 pF, for example. For example, the electrostatic capacitance may be higher than or equal to 1 pF and lower than or equal to 10 µF.

In this specification and the like, a transistor includes three terminals called a gate, a source, and a drain. The gate is a control terminal for controlling the on/off state of the transistor. The two terminals serving as the source and the drain are input/output terminals of the transistor. Functions of the two input/output terminals of the transistor depend on the conductivity type (n-channel type or p-channel type) of the transistor and the levels of potentials applied to the three terminals of the transistor, and one of the two terminals serves as a source and the other serves as a drain. Therefore, the terms "source" and "drain" can be sometimes used interchangeably in this specification and the like. In this specification and the like, the terms "one of a source and a drain" (or a first electrode or a first terminal) and "the other of the source and the drain" (or a second electrode or a second terminal) are used to describe the connection relation of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case in which a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of an off-state current can be reduced, and the withstand voltage of the transistor can be increased (the reliability can be improved). Alternatively, with the multi-gate structure, a drain-source current does not change very much even if a drain-source voltage changes when the transistor operates in a saturation region, so that a flat slope of voltage-current characteristics can be obtained. By utilizing the flat slope of the voltage-current characteristics, an ideal current source circuit or an active load having an extremely high resistance can be obtained. Accordingly, a differential circuit, a current mirror circuit, and the like having excellent properties can be obtained.

A single circuit element illustrated in a circuit diagram may include a plurality of circuit elements. For example, a single resistor illustrated in a circuit diagram may be two or more resistors electrically connected to each other in series. For another example, a single capacitor illustrated in a circuit diagram may be two or more capacitors electrically connected to each other in parallel. For another example, a single transistor illustrated in a circuit diagram may be two or more transistors which are electrically connected to each other in series and whose gates are electrically connected to each other. Similarly, for another example, a single switch illustrated in a circuit diagram may be a switch including two or more transistors which are electrically connected to each other in series or in parallel and whose gates are electrically connected to each other.

In this specification and the like, a node can be referred to as a terminal, a wiring, an electrode, a conductive layer, a conductor, or an impurity region, depending on the circuit configuration and the device structure. Furthermore, a terminal or a wiring can be referred to as a node.

In this specification and the like, "voltage" and "potential" can be replaced with each other as appropriate. The term "voltage" refers to a potential difference from a reference potential. When the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, a potential output from a circuit and the like, for example, are changed with a change of the reference potential.

In this specification and the like, the term "high-level potential" or "low-level potential" does not mean a particular potential. For example, in the case in which two wirings are both described as "serving as a wiring for supplying a high-level potential", the levels of the high-level potentials that these wirings supply are not necessarily equal to each other. Similarly, in the case in which two wirings are both described as "serving as a wiring for supplying a low-level potential", the levels of the low-level potentials that these wirings supply are not necessarily equal to each other.

A current means an electric charge transfer (electrical conduction); for example, the expression "electrical conduction of positively charged particles is caused" can be rephrased as "electrical conduction of negatively charged particles is caused in the opposite direction". Therefore, unless otherwise specified, a current in this specification and the like refers to an electric charge transfer (electrical conduction) caused by carrier movement. Examples of a carrier here include an electron, a hole, an anion, a cation, and a complex ion, and the type of carrier differs between current flow systems (e.g., a semiconductor, a metal, an electrolyte solution, and a vacuum). The direction of a current in a wiring or the like refers to the direction in which a carrier with a positive electric charge moves, and the amount of a current is expressed as a positive value. In other words, the direction in which a carrier with a negative electric charge moves is opposite to the direction of a current, and the amount of a current is expressed as a negative value. Thus, in the case in which the polarity of a current (or the direction of a current) is not specified in this specification and the like, the expression "a current flows from an element A to an element B" can be replaced with "a current flows from an element B to an element A". The expression "a current is input to an element A" can be replaced with "a current is output from an element A".

Ordinal numbers such as "first," "second," and "third" in this specification and the like are used in order to avoid confusion among components. Thus, the terms do not limit the number of components. The terms do not limit the order of components, either. For example, a "first" component in one embodiment in this specification and the like can be referred to as a "second" component in other embodiments or claims. For another example, a "first" component in one embodiment in this specification and the like can be omitted in other embodiments or claims.

In this specification and the like, terms for describing arrangement, such as "over", "above", "under", and "below", are sometimes used for convenience to describe the positional relation between components with reference to drawings. The positional relation between components is changed as appropriate in accordance with the direction from which each component is described. Thus, the positional relation is not limited to that described with a term used in this specification and the like and can be explained with another term as appropriate depending on the situation. For example, the expression "an insulator over (on) a top surface of a conductor" can be replaced with the expression "an insulator on a bottom surface of a conductor" when the direction of a diagram illustrating these components is rotated by 180°.

The terms such as "over", "above", "under", and "below" do not necessarily mean that a component is placed directly on or under and directly in contact with another component. For example, the expression "electrode B over insulating layer A" does not necessarily mean that the electrode B is on and in direct contact with the insulating layer A, and can mean the case in which another component is provided between the insulating layer A and the electrode B. In a similar manner, for example, the expression "electrode B above insulating layer A" does not necessarily mean that the electrode B is over and in direct contact with the insulating layer A, and can mean the case in which another component is provided between the insulating layer A and the electrode B. In a similar manner, for example, the expression "electrode B below insulating layer A" does not necessarily mean that the electrode B is under and in direct contact with the insulating layer A, and can mean the case in which another component is provided between the insulating layer A and the electrode B.

In this specification and the like, components arranged in a matrix and their positional relation are sometimes described using terms such as "row" and "column". The positional relation between components is changed as appropriate in accordance with the direction from which each component is described. Thus, the positional relation is not limited to that described with a term used in this specification and the like and can be explained with another term as appropriate depending on the situation. For example, the term "row direction" can be replaced with the term "column direction" when the direction of the diagram is rotated by 90°.

In this specification and the like, the terms "film" and "layer" can be interchanged with each other depending on circumstances. For example, the term "conductive layer" can be changed into the term "conductive film" in some cases. Moreover, the term "insulating film" can be changed into the term "insulating layer" in some cases. Moreover, such terms can be replaced with a word not including the term "film" or "layer" depending on the case or circumstances. For example, the term "conductive layer" or "conductive film" can be changed into the term "conductor" in some cases. For example, in some cases, the term "insulating layer" or "insulating film" can be changed into the term "insulator" in some cases.

In this specification and the like, the terms such as "electrode", "wiring", and "terminal" do not have functional limitations. For example, an "electrode" is used as part of a wiring in some cases, and vice versa. Furthermore, the term "electrode" or "wiring" can also mean a combination of a plurality of electrodes or wirings provided in an integrated manner, for example. For another example, a "terminal" can be used as part of a wiring or an electrode, and a "wiring" and an "electrode" can be used as part of a terminal. Furthermore, the term "terminal" includes the case in which a plurality of electrodes, wirings, or terminals are formed in an integrated manner. Therefore, for example, an "electrode" can be part of a wiring or a terminal, and a "terminal" can be part of a wiring or an electrode. Moreover, the term such as "electrode", "wiring", or "terminal" is sometimes replaced with the term "region", for example.

In this specification and the like, the terms such as "wiring", "signal line", and "power supply line" can be interchanged with each other depending on the case or in accordance with circumstances. For example, the term "wiring" can be changed into the term "signal line" in some cases. Also, for example, the term "wiring" can be changed into the term "power supply line" in some cases. Conversely, the term "signal line" or "power supply line" can be changed into the term "wiring" in some cases. The term "power supply line" can be changed into the term "signal line" in some cases. Conversely, the term "signal line" or the like can be changed into the term "power supply line" in some cases. The term "potential" that is supplied to a wiring can be changed into the term "signal" or the like depending on the case or in accordance with circumstances. Conversely, the term "signal" or the like can be changed into the term "potential" in some cases.

In this specification and the like, an impurity in a semiconductor refers to, for example, elements other than the main components of a semiconductor layer. For instance, an element with a concentration lower than 0.1 atomic % is an impurity. When an impurity is contained, the density of defect states in the semiconductor may be increased, the carrier mobility may be decreased and the crystallinity may be decreased. When the semiconductor is an oxide semiconductor, examples of impurities that change the characteristics of the semiconductor include Group 1 elements, Group 2 elements, Group 13 elements, Group 14 elements, Group 15 elements, and transition metals other than the main components of the oxide semiconductor. Specific examples include hydrogen (also including water), lithium, sodium, silicon, boron, phosphorus, carbon, and nitrogen. Specifically, when the semiconductor is a silicon layer, examples of impurities that change the characteristics of the semiconductor include Group 1 elements, Group 2 elements, Group 13 elements, and Group 15 elements (with the exception of oxygen and hydrogen).

In this specification and the like, a switch is in a conduction state (on state) or in a non-conduction state (off state) to control whether a current flows therethrough or not. Alternatively, a switch has a function of selecting and changing a current path. Thus, a switch may have two or more terminals through which a current flows, in addition to a control terminal. For example, an electrical switch or a mechanical switch can be used. That is, a switch is not limited to a certain element and can be any element capable of controlling a current.

Examples of an electrical switch include a transistor (e.g., a bipolar transistor and a MOS transistor), a diode (e.g., a PN diode, a PIN diode, a Schottky diode, a metal-insulator-metal (MIM) diode, a metal-insulator-semiconductor (MIS) diode, and a diode-connected transistor), and a logic circuit in which such components are combined. In the case of using a transistor as a switch, the conduction state of the transistor refers to a state in which a source electrode and a drain electrode of the transistor are regarded as being electrically short-circuited or a state in which a current can flow between the source electrode and the drain electrode, for example. The non-conduction state of the transistor refers to a state in which the source electrode and the drain electrode of the transistor are regarded as being electrically disconnected. In the case in which a transistor operates just as a switch, there is no particular limitation on the polarity (conductivity type) of the transistor.

An example of a mechanical switch is a switch using a microelectromechanical systems (MEMS) technology. Such a switch includes an electrode that can be moved mechanically, and its conduction and non-conduction is controlled with movement of the electrode.

In this specification, "parallel" indicates a state where the angle formed between two straight lines is greater than or equal to −10° and less than or equal to 10°. Thus, the case in which the angle is greater than or equal to −5° and less than or equal to 5° is also included. The terms "approximately parallel" and "substantially parallel" indicate that the angle formed between two straight lines is greater than or equal to −30° and less than or equal to 30°. The term "perpendicular" indicates that the angle formed between two straight lines is greater than or equal to 80° and less than or equal to 100°. Thus, the case in which the angle is greater than or equal to 85° and less than or equal to 95° is also included. The terms "approximately perpendicular" and "substantially perpendicular" indicate that the angle formed between two straight lines is greater than or equal to 60° and less than or equal to 120°.

Alternatively, according to one embodiment of the present invention, a semiconductor device with reduced power consumption can be provided. According to another embodiment of the present invention, a novel semiconductor device and the like can be provided. According to another embodiment of the present invention, an electronic device including a novel semiconductor device can be provided.

Note that the effects of one embodiment of the present invention are not limited to the effects mentioned above. The effects described above do not preclude the existence of other effects. The other effects are the ones that are not described above and will be described below. Effects that are not described above will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF THE DRAWINGS

In the accompanying drawings:

FIG. 17A shows classification of crystal structures, FIG. 17B shows an XRD spectrum of crystalline IGZO, and FIG. 17C shows a nanobeam electron diffraction pattern of the crystalline IGZO;

DETAILED DESCRIPTION OF THE INVENTION

Figure 1A:
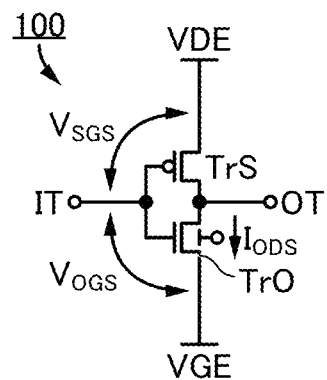
FIGS. 1A to 1C are circuit diagrams each illustrating a configuration example of a circuit included in a semiconductor device.

In this specification and the like, a metal oxide means an oxide of metal in a broad sense. Metal oxides are classified into an oxide insulator, an oxide conductor (including a transparent oxide conductor), an oxide semiconductor (also simply referred to as OS), and the like. For example, a metal oxide included in a channel formation region of a transistor is called an oxide semiconductor in some cases. That is, a metal oxide included in a channel formation region of a transistor that has at least one of an amplifying function, a rectifying function, and a switching function can be referred to as a metal oxide semiconductor. In addition, an OS transistor is a transistor including a metal oxide or an oxide semiconductor.

In this specification and the like, a metal oxide containing nitrogen is also referred to as a metal oxide in some cases. In addition, a metal oxide containing nitrogen may be referred to as a metal oxynitride.

In this specification and the like, one embodiment of the present invention can be constituted with an appropriate combination of a structure illustrated in one embodiment and any of the structures shown in the other embodiments. In the case in which a plurality of structure examples are described in one embodiment, some of the structure examples can be combined as appropriate.

Note that a content (or part thereof) described in one embodiment can be applied to, combined with, or replaced with another content (or part thereof) described in the same embodiment and/or a content (or part thereof) described in another embodiment or other embodiments.

Note that in each embodiment, a content described in the embodiment is a content described with reference to a variety of diagrams or a content described with text in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

The embodiments in this specification are described with reference to the drawings. Note that the embodiments can be implemented in many different modes, and it will be readily appreciated by those skilled in the art that modes and details can be changed in various ways without departing from the spirit and scope of the present invention. Therefore, the present invention should not be construed as being limited to the description of the embodiments. Note that in the structures of the invention described in the embodiments, the same portions or portions having similar functions are denoted by the same reference numerals in different drawings and the description of such portions is not repeated in some cases. In perspective views and the like, some of components might not be illustrated for clarity of the drawings.

In this specification and the like, when a plurality of components denoted by the same reference numerals need to be distinguished from each other, identification signs such as "_1", "[n]", and "[m,n]" are sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings of this specification, the size, the layer thickness, or the region is exaggerated for clarity in some cases. Therefore, the size, the layer thickness, or the region is not limited to the illustrated scale. The drawings are schematic views illustrated ideal examples, and embodiments of the present invention are not limited to shapes, values, or the like illustrated in the drawings. For example, a variation in a signal, a voltage, or a current due to noise or difference in timing can be included.

Embodiment 1

In this embodiment, a semiconductor device of one embodiment of the present invention will be described.

Configuration Example 1

A circuit 100 in FIG. 1A is an example of an inverter circuit (also referred to as a phase inverter or a NOT circuit) and is one embodiment of the present invention.

The circuit 100 includes a transistor TrS and a transistor TrO, for example.

The transistor TrO is preferably an OS transistor as an example. In addition, a channel formation region of the transistor TrO preferably includes an oxide containing one or more of indium, gallium, and zinc. Instead of the oxide, an oxide containing one or more of indium, an element M (as the element M, one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, and magnesium can be used, for example), and zinc may be used.

For the transistor TrS, a transistor containing silicon in a channel formation region (hereinafter, referred to as a Si transistor) is preferably used, for example. As the silicon, amorphous silicon (referred to as hydrogenated amorphous silicon in some cases), microcrystalline silicon, polycrystalline silicon (including low-temperature polycrystalline silicon (LTPS)), single crystal silicon, or the like can be used, for example.

As transistors other than the OS transistor and the Si transistor, for example, a transistor including germanium (Ge) or the like in a channel formation region, a transistor including a compound semiconductor, such as zinc selenide (ZnSe), cadmium sulfide (CdS), gallium arsenide (GaAs), indium phosphide (InP), gallium nitride (GaN), or silicon germanium (SiGe), in a channel formation region, a transistor including carbon nanotube in a channel formation region, or a transistor including an organic semiconductor in a channel formation region can be used for at least one of the transistor TrS and the transistor TrO.

For Si transistors, the polarity of the n-channel type or the p-channel type can be selected depending on the kind of an impurity with which a semiconductor layer is doped. On the other hand, for example, it is possible to form n-type semiconductors using a metal oxide containing indium (e.g., an In oxide) or a metal oxide containing zinc (e.g., a Zn oxide) but is difficult to form p-type semiconductors using these metal oxides in terms of mobility and reliability. In the case in which a CMOS circuit (also referred to as a complementary circuit) includes an OS transistor, preferably, the OS transistor is used as an n-channel transistor and a Si transistor is used as a p-channel transistor. In this embodiment, a Si transistor is used as the transistor TrS and an OS transistor is used as the transistor TrO.

The transistor TrO illustrated in FIG. 1A is a transistor having a multi-gate structure including gates over and under a channel, for example, and the transistor TrO includes a first gate and a second gate. Note that in this specification and the like, for convenience, the first gate is referred to as a gate (referred to as a front gate in some cases) and the second gate is referred to as a back gate so that they are distinguished from each other, for example; however, the first gate and the second gate can be interchanged with each other. Therefore, in this specification and the like, the term "gate" can be replaced with the term "back gate". Similarly, the term "back gate" can be replaced with the term "gate". As a specific example, a connection structure in which "a gate is electrically connected to a first wiring and a back gate is electrically connected to a second wiring" can be replaced with a connection structure in which "a back gate is electrically connected to a first wiring and a gate is electrically connected to a second wiring".

The semiconductor device of one embodiment of the present invention does not depend on the connection structure of a back gate of a transistor. In FIG. 1A, the back gate of the transistor TrO is illustrated. The connection of the back gate is not illustrated, and the destination to which the back gate is electrically connected can be determined at the design stage. For example, in a transistor including a back gate, a gate and the back gate may be electrically connected to each other to increase the on-state current of the transistor. In other words, the gate and the back gate of the transistor TrO may be electrically connected to each other, for example. Alternatively, for example, in a transistor including a back gate, a wiring electrically connected to an external circuit or the like may be provided and a fixed potential or a variable potential may be supplied to the back gate of the transistor with the external circuit or the like to change the threshold voltage of the transistor or to reduce the off-state current of the transistor. Note that the same applies to a transistor described in other parts of the specification and a transistor illustrated in other drawings than FIG. 1A.

Figure 1B:
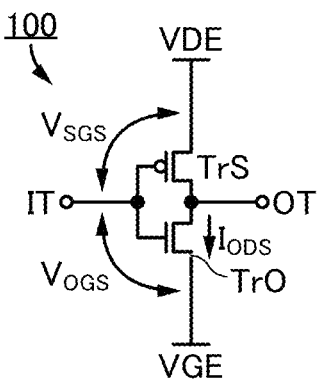

The semiconductor device of one embodiment of the present invention does not depend on the structure of a transistor included in the circuit 100. For example, the transistor TrO illustrated in FIG. 1A may be a transistor having a structure not including a back gate, that is, a single-gate structure as illustrated in FIG. 1B. It is also possible that some transistors include back gates and the other transistors do not include back gates. Note that the same applies to a transistor described in other parts of the specification and a transistor illustrated in other drawings than FIG. 1A.

In the example of FIG. 1A, the transistor TrO is illustrated as an n-channel transistor, and the transistor TrS is illustrated as a p-channel transistor.

Unless otherwise specified, the transistor TrS and the transistor TrO may operate in subthreshold regions (i.e., a voltage between the gate and the source of the transistor TrS or the transistor TrO may be lower than the threshold voltage, preferably a drain voltage exponentially increases with respect to the voltage between the gate and the source). In other words, the gate voltage, the source voltage, and the drain voltage of each of the transistors may be biased as appropriate so that the transistors operate in the subthreshold regions.

In this specification and the like, the term subthreshold region refers to a region in which a gate voltage is lower than a threshold voltage in a graph of gate voltage (Vg)-drain current (Id) characteristics of a transistor. Alternatively, the subthreshold region refers to a region in which current flows due to carrier diffusion, which is out of gradual channel approximation (a model in which only a drift current is considered). Alternatively, the subthreshold region refers to a region in which drain current is increased exponentially with respect to an increase in a gate voltage. Alternatively, the subthreshold region includes a region that can be regarded as any region of the above descriptions.

A drain current when the transistor operates in the subthreshold region is referred to as a subthreshold current. The subthreshold current is increased exponentially with respect to the gate voltage, without depending on the drain voltage. The circuit operation using the subthreshold current can reduce the influence of a variation in drain voltage.

Figure 2:
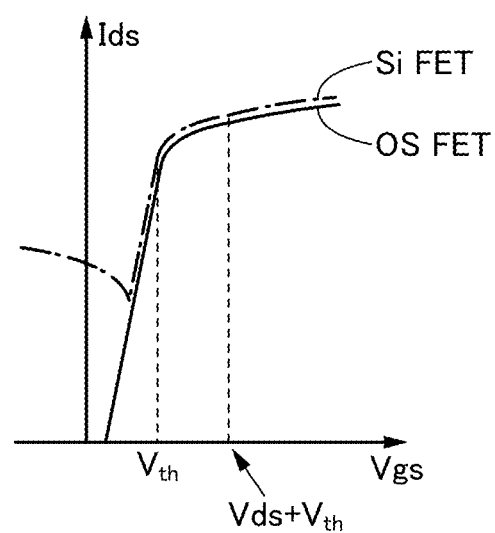
FIG. 2 is a schematic diagram illustrating gate-source voltage versus drain current curves.

FIG. 2 is a schematic diagram of source-drain current ($I_{ds}$)-gate-source ($V_{gs}$) characteristics of each of a Si transistor and an OS transistor. Note that in the characteristics of FIG. 2, the threshold voltage ($V_{th}$) of the Si transistor (referred to as Si FET in FIG. 2) is assumed to be equal to the threshold voltage of the OS transistor (referred to as OS FET in FIG. 2). Furthermore, for example, in the case in which $V_{gs}$ is higher than the sum of the source-drain voltage $V_{ds}$ and $V_{th}$, each of the transistors operates in a linear region; in the case in which $V_{gs}$ is higher than $V_{th}$ and lower than or equal to the sum of the source-drain voltage $V_{ds}$ and $V_{th}$, each of the transistors operates in a saturation region; and in the case in which $V_{gs}$ is lower than or equal to $V_{th}$, each of the transistors operates in the subthreshold region.

As illustrated in FIG. 2, the OS transistor can have a larger range of the gate voltage enabling operation in the subthreshold region, than that of the Si transistor. Specifically, for example, when the threshold voltage of the OS transistor is $V_{th}$, a circuit operation using the gate voltage in the voltage range of $V_{th}$-1.0 V to $V_{th}$, inclusive, or $V_{th}$-0.5 V to $V_{th}$, inclusive, is possible in the subthreshold region.

For example, the transistor TrO enables a flow of a drain current per channel width of 1 μm, less than $1\times10^{-20}$ A, less than $1\times10^{-22}$ A, or less than $1\times10^{-24}$ A in a region where the gate-source voltage is lower than the threshold voltage. Note that in this specification and the like, the transistor TrO in this region may be regarded as being off. Furthermore, at this time, a current flowing through the transistor TrO may be referred to as an off-leakage current. In addition, in some cases, the transistor TrO enables a flow of a drain current per channel width of 1 μm, $1\times10^{-8}$ A or lower, $1.0\times10^{-12}$ A or lower, or $1.0\times10^{-15}$ A or lower in a region where the gate-source voltage is in the vicinity of the threshold voltage of the transistor TrO.

A first terminal of the transistor TrS is electrically connected to a wiring VDE, a second terminal of the transistor TrS is electrically connected to a first terminal of the transistor TrO and a terminal OT, and a gate of the transistor TrS are electrically connected to a gate of the transistor TrO and a terminal IT. A second terminal of the transistor TrO is electrically connected to a wiring VGE.

The terminal IT in the circuit 100 serves as an input terminal in the circuit 100, for example. The terminal OT in the circuit 100 serves as an output terminal in the circuit 100, for example.

The wiring VDE in FIG. 1A serves as a wiring for supplying a high power supply potential (sometimes referred to as a high-level potential) to the circuit 100, for example.

The wiring VGE in FIG. 1A serves as a wiring for supplying a low power supply potential (sometimes referred to as a low-level potential) to the circuit 100, for example. The low power supply potential can be a ground potential, 0 V, or a negative potential, for example.

The inverter circuit of the semiconductor device of one embodiment of the present invention is not limited to the structures in FIGS. 1A and 1B. The configuration of the inverter circuit of the semiconductor device of one embodiment of the present invention may be changed depending on circumstances.

Figure 1C:
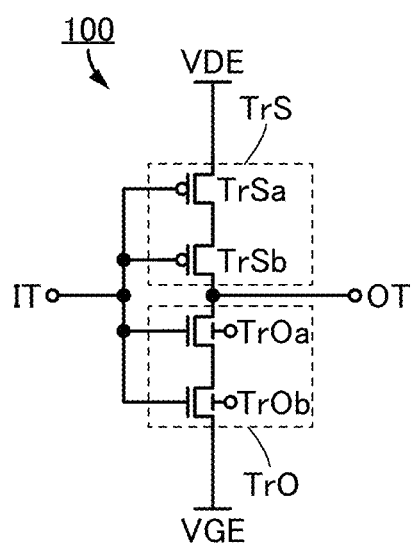

For example, the transistors TrS and TrO in the circuit 100 illustrated in FIG. 1A may each have a multi-gate structure including two or more front gates. The circuit 100 illustrated in FIG. 1C is an example of a circuit configuration in which the transistors TrS and TrO in the circuit 100 illustrated in FIG. 1A each have a multi-gate structure; the transistor TrS has two transistors, a transistor TrSa and a transistor TrSb, and the transistor TrO has two transistors, a transistor TrOa and a transistor TrOb. The inverter circuit has the configuration of the circuit 100 illustrated in FIG. 1C, whereby the off-state current of the transistors TrS and TrO can be further reduced.

Operation Example 1

Next, an operation example of the circuit 100 illustrated in FIG. 1A will be described. Note that the transistors TrS and TrO can each operate also in the subthreshold region.

A potential supplied from the wiring VDE to the first terminal of the transistor TrS is set to a high-level potential. The high-level potential at this time is 0.45 V, for example. A potential supplied from the wiring VGE to the second terminal of the transistor TrO is set to a low-level potential. The low-level potential at this time is 0 V, for example.

The high-level potential (0.45 V) or the low-level potential (0 V) is input to the terminal IT of the circuit 100.

Note that the potential difference (−0.45 V) which is obtained by subtracting the high-level potential from the low-level potential is within the range of the gate-source voltage of the transistor TrS where the transistor TrS operates in the subthreshold region. In addition, the potential difference (0.45 V) which is obtained by subtracting the low-level potential from the high-level potential is within the range of the gate-source voltage of the transistor TrO where the transistor TrO operates in the subthreshold region.

First, a case is considered in which a high-level potential (0.45 V) is input to the terminal IT. When the gate-source voltage of the transistor TrS is expressed as $V_{SGS}$, $V_{SGS}=0$, thereby turning off the transistor TrS. When the gate-source voltage of the transistor TrO is expressed as $V_{OGS}$, $V_{OGS}=0.45$, whereby the transistor TrO operates in the subthreshold region.

Since the transistor TrS is in an off state, electrical continuity is not established between the wiring VDE and the terminal OT.

Since the transistor TrO is in the subthreshold region at this time, the current lows flowing between the source and the drain of the transistor TrO is a subthreshold current. Thus, the subthreshold current in the transistor TrO flows to the wiring VGE through the transistor TrO from the terminal OT. As a result, the potential of the terminal OT becomes the low-level potential (0 V) supplied from the wiring VGE.

Next, a case is considered in which the low-level potential (0 V) is input to the terminal IT. The gate-source voltage $V_{SGS}$ of the transistor TrS becomes −0.45 V, and thus the transistor TrS operates in the subthreshold region. In addition, the gate-source voltage $V_{OGS}$ of the transistor TrO is 0 V ($V_{OGS}=0$), and thus the transistor TrO is turned off.

Since the transistor TrO is in an off state, electrical continuity is not established between the wiring VGE and the terminal OT. In addition, since the transistor TrS operates in the subthreshold region, the subthreshold current of the transistor TrS flows to the terminal OT through the transistor TrS from the wiring VDE. Accordingly, the potential of the terminal OT becomes the high-level potential (0.45 V) supplied from the wiring VDE.

Since the transistor TrO is in an off state at this time, the current $I_{OIDS}$ flowing between the source and the drain of the transistor TrO is off-leakage current (sometimes referred to as off-state current or leakage current). Especially when the transistor TrO is an OS transistor, the ratio between the on current and the off-leakage current is high and thus the off-leakage current flowing between the first terminal and the second terminal of the transistor TrO in an off-state can be extremely lowered.

Configuration Example 2

Figure 3:
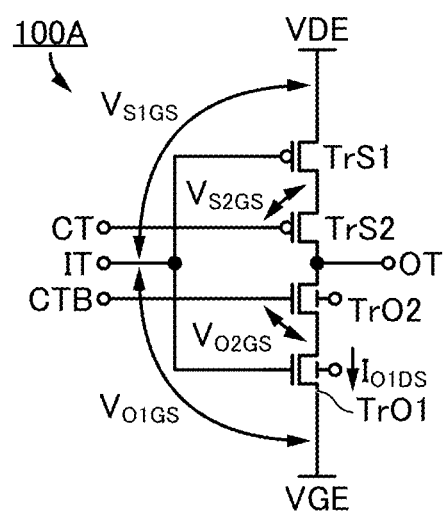
FIG. 3 is a circuit diagram illustrating a configuration example of a circuit included in a semiconductor device.

A circuit 100A illustrated in FIG. 3 is an example of a clocked inverter circuit and is a semiconductor device of one embodiment of the present invention.

The circuit 100A includes, for example, a transistor TrS1, a transistor TrS2, a transistor TrO1, and a transistor TrO2.

For the transistors TrS1 and TrS2, the transistors applicable to the transistor TrS described in Configuration example 1 can be used, for example.

For the transistors TrO1 and TrO2, the transistors applicable to the transistor TrO described in Configuration example 1 can be used, for example.

In addition, the transistors TrS1, TrS2, TrO1, and TrO2 can each operate in the subthreshold region, unless otherwise specified.

A first terminal of the transistor TrS1 is electrically connected to the wiring VDE, a second terminal of the transistor TrS1 is electrically connected to a first terminal of the transistor TrS2, and a gate of the transistor TrS1 is electrically connected to a gate of the transistor TRO1 and the terminal IT. A second terminal of the transistor TrS2 is electrically connected to a first terminal of the transistor TrO2 and the terminal OT, and a gate of the transistor TrS2 is electrically connected to a terminal CT. A second terminal of the transistor TrO2 is electrically connected to a first terminal of the transistor TrO1, and a gate of the transistor TrO2 is electrically connected to a terminal CTB. A second terminal of the transistor TRO1 is electrically connected to the wiring VGE.

The terminal IT in the circuit 100A serves as an input terminal in the circuit 100A, for example. The terminal OT in the circuit 100A serves as an output terminal in the circuit 100A, for example.

The wiring VDE in FIG. 3 serves as a wiring for supplying a high power supply potential to the circuit 100A, for example.

The wiring VGE in FIG. 3 serves as a wiring for supplying a low power supply potential to the circuit 100A, for example. The low power supply potential can be a ground potential, 0 V, or a negative potential, for example.

The terminal CT illustrated in FIG. 3 is electrically connected to a wiring for supplying a pulse voltage (sometimes referred to as a variable potential), for example. In particular, the pulse voltage is, for example, a pulse voltage (clock signal) with a high-level potential and a low-level potential which are periodically repeated.

For example, the terminal CTB illustrated in FIG. 3 is electrically connected to a wiring for supplying a potential whose logic is inverted from the logic of the potential supplied to the terminal CT. For example, when the high-level potential is supplied to the terminal CT, the low-level potential is supplied to the terminal CTB. When the low-level potential is supplied to the terminal CT, the high-level potential is supplied to the terminal CTB.

Operation Example 2

Next, an operation example of the circuit 100A illustrated in FIG. 3 will be described. Note that the transistors TrS1, TrS2, TrO1, and TrO2 can each operate in the subthreshold region.

A potential supplied from the wiring VDE to the first terminal of the transistor TrS1 is set to a high-level potential. The high-level potential at this time is 0.45 V, for example. A potential supplied from the wiring VGE to the second terminal of the transistor TRO1 is set to a low-level potential. The low-level potential at this time is 0 V, for example.

A pulse voltage with periodic repetitions of the high-level and low-level potentials is input to the gate of the transistor TrS2 from the terminal CT. For example, the high-level potential is set to 0.45 V and the low-level potential is set to 0 V here. To the gate of the transistor TrO2, a potential whose logic is inverted from the logic of the potential supplied to the terminal CT is input from the terminal CTB. In other words, when a potential of 0.45 V is supplied to the gate of the transistor TrS2 from the terminal CT, a potential of 0 V is supplied to the gate of the transistor TrO2 from the terminal CTB, and when a potential of 0 V is supplied to the gate of the transistor TrS2 from the terminal CT, a potential of 0.45 V is supplied to the gate of the transistor TrO2 from the terminal CTB.

In addition, the high-level potential (0.45 V) or the low-level potential (0 V) is input to the terminal IT in the circuit 100A.

Note that the potential difference (−0.45 V) which is obtained by subtracting the high-level potential from the low-level potential is within the range of the gate-source voltage of the transistors TrS1 and TrS2 where the transistors TrS1 and TrS2 operate in the subthreshold region. In addition, the potential difference (0.45 V) which is obtained by subtracting the low-level potential from the high-level potential is within the range of the gate-source voltage of the transistors TRO1 and TrO2 where the transistors TRO1 and TrO2 operate in the subthreshold region.

When the gate-source voltage of one or more of the transistors TrS1, TrS2, TrO1, and TrO2 is 0 V, the transistor(s) is/are off.

First, the high-level potential (0.45 V) is supplied to the terminal CT and the low-level potential (0 V) is supplied to the terminal CTB.

In that case, when the high-level potential (0.45 V) is input to the terminal IT, the high-level potential (0.45 V) is supplied to each of the gates of the transistors TrS1 and TRO1. When the gate-source voltage of the transistor TrS1 is expressed as $V_{S1GS}$, $V_{S1GS}=0$, whereby the transistor TrS1 is turned off. In addition, when the gate-source voltage of the transistor TRO1 is expressed as $V_{O1GS}$, $V_{O1GS}=0.45$, whereby the transistor TRO1 operates in the subthreshold region.

Since the transistor TrS1 is off, electrical continuity is not established between the wiring VDE and the first terminal of the transistor TrS2. Furthermore, a subthreshold current flows between a source and a drain of the transistor TRO1.

The low-level potential (0 V) is supplied to the gate of the transistor TrO2 from the terminal CTB, and the low-level potential (0 V) is supplied to the second terminal of the transistor TrO2 from the wiring VGE. When the gate-source voltage of the transistor TrO2 is expressed as $V_{O2GS}$, $V_{O2GS}=0$, whereby the transistor TrO2 is turned off.

The high-level potential (0.45 V) is supplied to the gate of the transistor TrS2 from the terminal CT. At this time, the potentials of the first terminal and the second terminal of the transistor TrS2 are thought to be higher than or equal to the low-level potential (0 V) supplied from the wiring VGE and lower than or equal to the high-level potential (0.45 V) supplied from the wiring VDE, although the potentials of the first terminal and the second terminal of the transistor TrS2 are indefinite. Therefore, when the gate-source voltage of the transistor TrS2 is expressed as $V_{S2GS}$, $V_{S2GS}$ is likely to be higher than or equal to 0 V and lower than or equal to 0.45 V. Thus, when the threshold voltage of the transistor TrS2 is negative, the transistor TrS2 is turned off. In this operation example, the high-level potential (0.45 V) is supplied to the gate of the transistor TrS2, whereby the transistor TrS2 is turned off.

Since the transistors TrS1, TrS2, and TrO2 are turned off and the transistor TRO1 is turned on as described above, electrical continuity is not established between the terminal OT and the wiring VDE nor between the terminal OT and the wiring VGE. Therefore, while the high-level potential (0.45 V) is supplied to the terminal CT and the low-level potential (0 V) is supplied to the terminal CTB, the potential of the terminal OT is not changed even when the potential of the terminal IT is changed (even when the high-level potential (0.45 V) is input).

When the low-level potential (0 V) is input to the terminal IT, the low-level potential (0 V) is supplied to each of the gates of the transistors TrS1 and TrO1. Since the gate-source voltage $V_{S1GS}$ of the transistor TrS1 becomes −0.45 V, the transistor TrS1 operates in the subthreshold region. In addition, since the gate-source voltage $V_{O1GS}$ of the transistor TRO1 becomes 0 V, the transistor TRO1 is turned off.

Furthermore, since the transistor TRO1 is off, electrical continuity is not established between the wiring VGE and the second terminal of the transistor TrO2. In addition, a subthreshold current flows between a source and a drain of the transistor TrS1.

The high-level potential (0.45 V) is supplied to the gate of the transistor TrS2 from the terminal CT, and the high-level potential (0.45 V) is supplied to the first terminal of the transistor TrS2 from the wiring VDE. The gate-source voltage $V_{S2GS}$ of the transistor TrS2 becomes 0 V, whereby the transistor TrS2 is turned off.

The low-level potential (0 V) is supplied to the gate of the transistor TrO2 from the terminal CTB. At this time, the potentials of the first terminal and the second terminal of the transistor TrO2 are thought to be higher than or equal to the low-level potential (0 V) supplied from the wiring VGE and lower than or equal to the high-level potential (0.45 V) supplied from the wiring VDE although the potentials of the first terminal and the second terminal of the transistor TrO2 are indefinite. Therefore, the gate-source voltage $V_{O2GS}$ of the transistor TrO2 is likely to be higher than or equal to −0.45 V and lower than or equal to 0 V. Thus, when the threshold voltage of the transistor TrO2 is positive, the transistor TrO2 is turned off In this operation example, the low-level potential (0 V) is supplied to the gate of the transistor TrO2, whereby the transistor TrO2 is turned off.

Since the transistors TrS2, TrO1, and TrO2 are off as described above, electrical continuity is not established between the terminal OT and the wiring VDE nor electrical continuity is not established between the terminal OT and the wiring VGE. Therefore, while the high-level potential (0.45 V) is supplied to the terminal CT and the low-level potential (0 V) is supplied to the terminal CTB, the potential of the terminal OT is not changed even when the potential of the terminal IT is changed (even when the high-level potential (0.45 V) is input).

Next, a case is considered in which the low-level potential (0 V) is supplied to the terminal CT and the high-level potential (0.45 V) is supplied to the terminal CTB.

In that case, when the high-level potential (0.45 V) is input to the terminal IT, the high-level potential (0.45 V) is supplied to each of the gates of the transistors TrS1 and TRO1. When the gate-source voltage $V_{S1GS}$ of the transistor TrS1 becomes 0 V, the transistor TrS1 is turned off. In addition, when the gate-source voltage $V_{O1GS}$ of the transistor TRO1 is expressed as $V_{O1GS}$, $V_{O1GS}=0.45$, whereby the transistor TRO1 operates in the subthreshold region.

Furthermore, since the transistor TrS1 is off, electrical continuity is established between the wiring VGE and the second terminal of the transistor TrO2. Furthermore, a subthreshold current flows through the transistor TrO1.

The high-level potential (0.45 V) is supplied to the gate of the transistor TrO2 from the terminal CTB and the low-level potential (0 V) is supplied to the second terminal of the transistor TrO2 from the wiring VGE. The gate-source voltage $V_{O2GS}$ of the transistor TrO2 becomes 0.45 V, whereby the transistor TrO2 operates in the subthreshold region.

The low-level potential (0 V) is supplied to the gate of the transistor TrS2 from the terminal CT, and the low-level potential (0 V) is supplied to the second terminal of the transistor TrS2 from the wiring VGE. At this time, since electrical continuity is not established between the first terminal of the transistor TrS2 and the wiring VDE, the potential of the first terminal of the transistor TrS2 reaches a potential which is obtained by adding the threshold voltage of the transistor TrS2 to the potential (0 V) of the second terminal of the transistor TrS2, whereby the transistor TrS2 is turned off.

The transistors TrS1 and TrS2 are turned off and the transistors TRO1 and TrO2 both operate in the subthreshold region; thus, electrical continuity is not established between the terminal OT and the wiring VDE and the subthreshold current flows from the terminal OT to the wiring VGE. Accordingly, the potential of the terminal OT becomes the low-level potential (0 V).

When the low-level potential (0 V) is input to the terminal IT, the low-level potential (0 V) is supplied to each of the gates of the transistors TrS1 and TRO1. The gate-source voltage $V_{S1GS}$ in the transistor TrS1 becomes −0.45 V, whereby the transistor TrS1 operates in the subthreshold region. In addition, since the gate-source voltage $V_{O1GS}$ of the transistor TRO1 becomes 0 V, the transistor TRO1 is turned off.

Since the transistor TRO1 is in an off state, electrical continuity is not established between the wiring VGE and the second terminal of the transistor TrO2 and electrical continuity is established between the wiring VDE and the first terminal of the transistor TrS2. Furthermore, a subthreshold current flows between the source and the drain of the transistor TrS1.

The low-level potential (0 V) is supplied to the gate of the transistor TrS2 from the terminal CT, and the high-level potential (0.45 V) is supplied to the first terminal of the transistor TrS2 from the wiring VDE. The gate-source voltage $V_{S2GS}$ of the transistor TrS2 is −0.45 V, whereby a subthreshold current flows through the transistor TrS2.

The high-level potential (0.45 V) is supplied to the gate of the transistor TrO2 from the terminal CTB, and the high-level potential (0.45 V) is supplied to the first terminal of the transistor TrO2 from the wiring VDE. At this time, since electrical continuity is not established between the first terminal of the transistor TrO2 and the wiring VGE, the potential of the second terminal of the transistor TrO2 reaches a potential which is obtained by subtracting the threshold voltage of the transistor TrO2 from the potential (0.45 V) of the first terminal of the transistor TrO2, whereby the transistor TrO2 is turned off.

As described above, the transistors TrS1 and TrS2 both operate in the subthreshold region and the transistor TRO1 and the transistor TrO2 are turned off; thus, electrical continuity is not established between the terminal OT and the wiring VGE and the subthreshold current flows from the wiring VDE to the terminal OT. Accordingly, the potential of the terminal OT becomes the high-level potential (0.45 V).

Table 1 summarizes the relationship between potentials supplied to the terminals IT, CT, and CTB and potentials output from the terminal OT in the circuit 100A in FIG. 3. Note that in Table 1, the potential of the terminal OT is expressed as indefinite when the high-level potential (0.45 V) is supplied to the terminal CT and the low-level potential (0 V) is supplied to the terminal CTB.

TABLE 1

| Potential supplied to terminal IT | Potential supplied to wiring CT | Potential supplied to wiring CTB | Potential output from terminal OT |
|---|---|---|---|
| High-level potential (0.45 V) | High-level potential (0.45 V) | Low-level potential (0 V) | Low-level potential (0 V) |
| Low-level potential (0 V) | High-level potential (0.45 V) | Low-level potential (0 V) | High-level potential (0.45 V) |
| High-level potential (0.45 V) | Low-level potential (0 V) | High-level potential (0.45 V) | Indefinite |
| Low-level potential (0 V) | Low-level potential (0 V) | High-level potential (0.45 V) | Indefinite |

Configuration Example 3

Figure 4A:
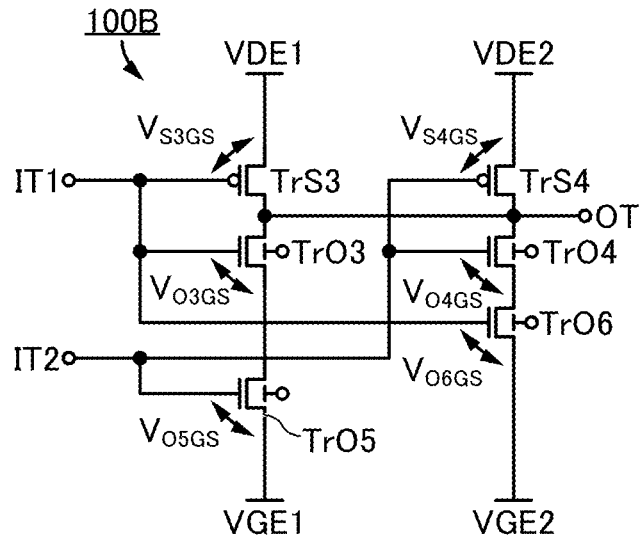
FIGS. 4A and 4B are circuit diagrams each illustrating a configuration example of a circuit included in a semiconductor device.

A circuit 100B illustrated in FIG. 4A is an example of a NAND circuit and is a semiconductor device of one embodiment of the present invention.

The circuit 100B includes, for example, transistors TrS3, TrS4, TrO3, TrO4, TrO5, and TrO6.

For example, the transistors that can be used as the transistor TrS described in Configuration example 1 can be used for the transistors TrS3 and TrS4.

For example, the transistors that can be applied to the transistor TrO described in Configuration example 1 can be used for the transistors TrO3 to TrO6.

The transistors TrS3, TrS4 and the transistors TrO3 to TrO6 can operate in the subthreshold regions, unless otherwise specified.

A first terminal of the transistor TrS3 is electrically connected to a wiring VDE1 and a gate of the transistor TrS3 is electrically connected to a gate of the transistor TrO3, a gate of the transistor TrO6, and a terminal IT1. A first terminal of the transistor TrS4 is electrically connected to a wiring VDE2 and a gate of the transistor TrS4 is electrically connected to a gate of the transistor TrO4, a gate of the transistor TrO5, and a terminal IT2. A second terminal of the transistor TrS3 is electrically connected to a first terminal of the transistor TrO3, a second terminal of the transistor TrS4, a first terminal of the transistor TrO4, and the terminal OT. A second terminal of the transistor TrO3 is electrically connected to a first terminal of the transistor TrO5. A second terminal of the transistor TrO4 is electrically connected to a first terminal of a transistor TrO6. A second terminal of the transistor TrO5 is electrically connected to a wiring VGE1. A second terminal of the transistor TrO6 is electrically connected to a wiring VGE2.

Each of the terminals IT1 and IT2 in the circuit 100B serves as an input terminal in the circuit 100B, for example. The terminal OT in the circuit 100B serves as an output terminal in the circuit 100B, for example.

The wiring VDE1 illustrated in FIG. 4A serves as, for example, a wiring for supplying a high power supply potential to the circuit 100B. The wiring VDE2 in FIG. 4A serves as, for example, a wiring for supplying a high power supply potential to the circuit 100B. Note that it is preferable that the potentials supplied from the wirings VDE1 and VDE2 be equal to each other. Depending on circumstances, potentials supplied from the wirings VDE1 and VDE2 may be different from each other.

The wiring VGE1 illustrated in FIG. 4A serves as, for example, a wiring for supplying a low power supply potential to the circuit 100B. The wiring VGE2 in FIG. 4A serves as, for example, a wiring for supplying a low power supply potential to the circuit 100B. Note that it is preferable that the potentials of the wirings VGE1 and VGE2 be equal to each other. In that case, the low power supply potentials supplied from the wirings VGE1 and VGE2 can be a ground potential, 0 V, or a negative potential, for example. Depending on circumstances, potentials supplied from the wirings VGE1 and VGE2 may be different from each other.

The NAND circuit of the semiconductor device of one embodiment of the present invention is not limited to the configuration in FIG. 4A. The configuration of the NAND circuit of the semiconductor device of one embodiment of the present invention may be changed depending on circumstances.

Figure 4B:
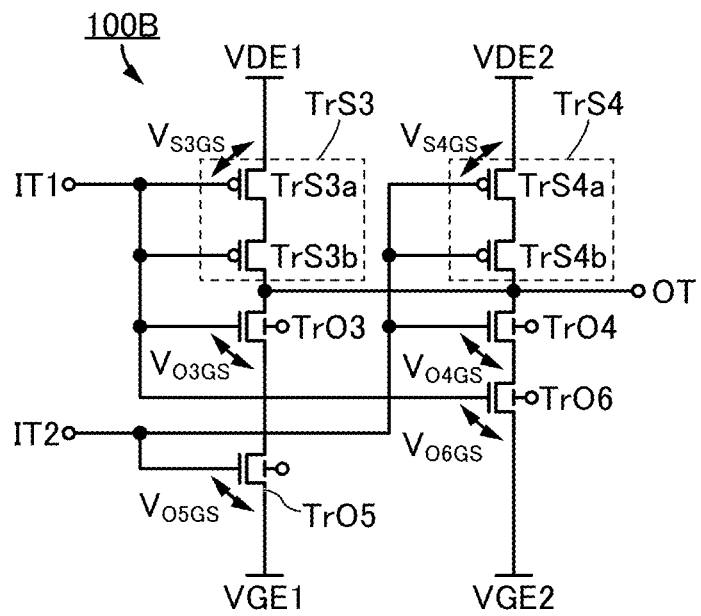

For example, the transistors TrS3 and TrS4 in the circuit 100B in FIG. 4A may have a multi-gate structure in which two or more front gates are provided. The circuit 100B illustrated in FIG. 4B has a circuit configuration in which the transistors TrS3 and TrS4 of the circuit 100B in FIG. 4A each have a multi-gate structure; the transistor TrS3 includes two transistors, a transistor TrS3a and a transistor TrS3b, and the transistor TrS4 includes two transistors, a transistor TrS4a and a transistor TrS4b. When the NAND circuit has the configuration of the circuit 100B illustrated in FIG. 4B, the off-state current of the transistors TrS3 and TrS4 can be further reduced.

Operation Example 3

Next, an operation example of the circuit 100B illustrated in FIG. 4A will be described. Note that each of the transistors TrS3, TrS4 and the transistors TrO3 to TrO6 can operate in the subthreshold region.

The potential supplied to the first terminal of the transistor TrS3 from the wiring VDE1 and the potential supplied to the first terminal of the transistor TrS4 from the wiring VDE2 are each set to a high-level potential. Note that here, the high-level potential is 0.45 V, for example. The potential supplied to the second terminal of the transistor TrO5 from the wiring VGE1 and the potential supplied to the second terminal of the transistor TrO6 from the wiring VGE2 are each set to a low-level potential. Note that the low-level potential here is 0 V, for example.

The high-level potential (0.45 V) or the low-level potential (0 V) is input to the terminal IT1 in the circuit 100B. The high-level potential (0.45 V) or the low-level potential (0 V) is also input to the terminal IT2 in the circuit 100B.

Note that the potential difference (−0.45 V) which is obtained by subtracting the high-level potential from the low-level potential is within the range of the gate-source voltage of the transistors TrS3 and TrS4 where the transistors TrS3 and TrS4 operate in the subthreshold region. In addition, the potential difference (0.45 V) which is obtained by subtracting the low-level potential from the high-level potential is within the range of the gate-source voltage of the transistors TrO3 to TrO6 where the transistors TrO3 to TrO6 operate in the subthreshold region.

When the gate-source voltage of one or more of the transistors TrS3, TrS4 and the transistors TrO3 to TrO6 is 0 V, the transistor(s) are turned off.

First, a case is considered in which a low-level potential (0 V) is input to each of the terminals IT1 and IT2. When the gate-source voltage of the transistor TrS3 is expressed as $V_{S3GS}$, $V_{S3GS}=-0.45$, whereby the transistor TrS3 operates in the subthreshold region. When the gate-source voltage of the transistor TrO6 is expressed by $V_{O6GS}$, $V_{O6GS}=0$, whereby the transistor TrO6 is turned off. When the gate-source voltage of the transistor TrO5 is expressed by $V_{O5GS}$, $V_{O5GS}=0$, whereby the transistor TrO5 is turned off. When the gate-source voltage of the transistor TrS4 is expressed by $V_{S4GS}$, $V_{S4GS}=-0.45$, whereby the transistor TrS4 operates in the subthreshold region.

Furthermore, at this time, the potential of the second terminal of the transistor TrO3 is thought to be higher than or equal to the low-level potential (0 V) supplied from either the wiring VGE1 or the wiring VGE2 and lower than or equal to the high-level potential (0.45 V) supplied from either the wiring VDE1 or the wiring VDE2 although the potential of the second terminal of the transistor TrO3 is indefinite. Thus, when the gate-source voltage of the transistor TrO3 is expressed as $V_{O3GS}$, $V_{O3GS}$ is likely to be higher than or equal to −0.45 V and lower than or equal to 0 V. Accordingly, when the threshold voltage of the transistor TrO3 is positive, the transistor TrO3 is turned off. In this operation example, the low-level potential (0 V) is supplied to the gate of the transistor TrO3, whereby the transistor TrO3 is turned off.

Similarly, the potential of the second terminal of the transistor TrO4 is thought to be higher than or equal to the low-level potential (0 V) supplied from either the wiring VGE1 or the wiring VGE2 and lower than or equal to the high-level potential (0.45 V) supplied from either the wiring VDE1 or the wiring VDE2 although the potential of the second terminal of the transistor TrO4 is indefinite. Thus, when the gate-source voltage of the transistor TrO4 is expressed as $V_{O4GS}$, $V_{O4GS}$ is likely to be higher than or equal to −0.45 V and lower than or equal to 0 V. Accordingly, when the threshold voltage of the transistor TrO4 is positive, the transistor TrO4 is turned off. In this operation example, the low-level potential (0 V) is supplied to the gate of the transistor TrO4, whereby the transistor TrO4 is turned off.

The transistors TrO3 and TrO4 are in an off state as described above; thus, electrical continuity is not established between the terminal OT nor the wiring VGE1 and between the terminal OT and the wiring VGE2. Since a subthreshold current flows between a source and a drain of each of the transistors TrS3 and TrS4, the potential of the terminal OT becomes the high-level potential (0.45 V).

Next, a case is considered in which the low-level potential (0 V) is input to the terminal IT1 and the high-level potential (0.45 V) is input to the terminal IT2. The gate-source voltage $V_{S3GS}$ in the transistor TrS3 becomes −0.45 V; thus, the transistor TrS3 operates in the subthreshold region. Furthermore, since the gate-source voltage $V_{O6GS}$ of the transistor TrO6 becomes 0 V, the transistor TrO6 is turned off. In addition, since the gate-source voltage $V_{O5GS}$ of the transistor TrO5 becomes 0.45 V, the transistor TrO5 operates in the subthreshold region. In addition, since the gate-source voltage $V_{S4GS}$ of the transistor TrS4 becomes 0 V, the transistor TrS4 is turned off.

At this time, the low-level potential (0 V) is supplied to the gate of the transistor TrO3 from the terminal IT1, and the low-level potential (0 V) is supplied to the second terminal of the transistor TrO3 from the wiring VGE1. When the gate-source voltage of the transistor TrO3 is expressed as $V_{O3GS}$, $V_{O3GS}=0$, whereby the transistor TrO3 is turned off.

In addition, the potential of the second terminal of the transistor TrO4 is thought to be higher than or equal to the low-level potential (0 V) supplied from either the wiring VGE1 or the wiring VGE2 and lower than or equal to the high-level potential (0.45 V) supplied from either the wiring VDE1 or the wiring VDE2 although the potential of the second terminal of the transistor TrO4 is indefinite. Thus, the gate-source voltage $V_{O4GS}$ of the transistor TrO4 is likely to be higher than or equal to −0.45 V and lower than or equal to 0 V. Accordingly, when the threshold voltage of the transistor TrO4 is positive, the transistor TrO4 is turned off.

Since the transistor TrS4 and the transistor TrO3, TrO4, and TrO6 are in an off state as described above, electrical continuity is not established between the terminal OT and the wiring VDE2, between the terminal OT and the wiring VGE1, nor between the terminal OT and the wiring VGE2. Furthermore, since the subthreshold current flows between the source and the drain of the transistor TrS3, the potential of the terminal OT becomes the high-level potential (0.45 V). Although the subthreshold current flows between a source and a drain of the transistor TrO5, the transistor TrO3 is off, whereby a current cannot flow from the terminal OT to the wiring VGE1, Next, a case is considered in which the high-level potential (0.45 V) is input to the terminal IT1 and the low-level potential (0 V) is input to the terminal IT2. The gate-source voltage $V_{S3GS}$ of the transistor TrS3 becomes 0 V, whereby the transistor TrS3 is turned off. In addition, since the gate-source voltage $V_{O6GS}$ of the transistor TrO6 becomes 0.45 V, whereby the transistor TrO6 operates in the subthreshold region. Furthermore, the gate-source voltage $V_{O5GS}$ of the transistor TrO5 becomes 0 V, whereby the transistor TrO5 is turned off. In addition, the gate-source voltage $V_{S4GS}$ of the transistor TrS4 becomes −0.45 V, whereby the transistor TrS4 operates in the subthreshold region.

At this time, the low-level potential (0 V) is supplied to the gate of the transistor TrO4 from the terminal IT2, and the low-level potential (0 V) from the wiring VGE2 is supplied to the second terminal of the transistor TrO4. When the gate-source voltage of the transistor TrO4 is expressed as $V_{O4GS}$, $V_{O4GS}=0$, whereby the transistor TrO4 is turned off.

Moreover, the potential of the second terminal of the transistor TrO3 is thought to be higher than or equal to the low-level potential (0 V) supplied from either the wiring VGE1 or the wiring VGE2 and lower than or equal to the high-level potential (0.45 V) supplied from either the wiring VDE1 or the wiring VDE2 although the potential of the second terminal of the transistor TrO3 is indefinite. Thus, the gate-source voltage $V_{O3GS}$ of the transistor TrO3 is likely to be higher than or equal to −0.45 V and lower than or equal to 0 V. Accordingly, when the threshold voltage of the transistor TrO3 is positive, the transistor TrO3 is turned off In this operation example, the low-level potential (0 V) is supplied to the gate of the transistor TrO3, whereby the transistor TrO3 is turned off.

Since the transistor TrS3 and the transistors TrO3 to TrO5 are in an off state as described above, electrical continuity is not established between the terminal OT and the wiring VDE1, between the terminal OT and the wiring VGE1, nor between the terminal OT and the wiring VGE2. Furthermore, since the subthreshold current flows between the source and the drain of the transistor TrS4, the potential of the terminal OT becomes the high-level potential (0.45 V). Although the subthreshold current flows between a source and a drain of the transistor TrO6, the transistor TrO4 is off, whereby a current cannot flow from the terminal OT to the wiring VGE2.

Next, a case is considered in which the high-level potential (0.45 V) is input to each of the terminals IT1 and IT2. The gate-source voltage $V_{S3GS}$ of the transistor TrS3 becomes 0 V, whereby the transistor TrS3 is turned off. In addition, since the gate-source voltage $V_{O6GS}$ of the transistor TrO6 becomes 0.45 V, the transistor TrO6 operates in the subthreshold region. In addition, since the gate-source voltage $V_{O5GS}$ of the transistor TrO5 becomes 0.45 V, the transistor TrO5 operates in the subthreshold region. In addition, since the gate-source voltage $V_{S4GS}$ of the transistor TrS4 becomes 0 V, the transistor TrS4 is turned off.

At this time, the high-level potential (0.45 V) is supplied to the gate of the transistor TrO3 from the terminal IT1, and the low-level potential (0 V) is supplied to the second terminal of the transistor TrO3 from the wiring VGE1. When the gate-source voltage $V_{O3GS}$ of the transistor TrO3 becomes 0.45 V, the transistor TrO3 operates in the subthreshold region.

Similarly, the high-level potential (0.45 V) is supplied to the gate of the transistor TrO4 from the terminal IT2, and the low-level potential (0 V) is supplied to the second terminal of the transistor TrO4 from the wiring VGE2. The gate-source voltage $V_{O4GS}$ of the transistor TrO4 becomes 0.45 V, whereby the transistor TrO4 operates in subthreshold region.

The transistors TrS3 and TrS4 are in an off state as described above; thus, electrical continuity is not established between the terminal OT nor the wiring VDE1 and between the terminal OT and the wiring VDE2. Furthermore, since the subthreshold current flows between the source and the drain of each of the transistors TrO3 to TrO6, the potential of the terminal OT becomes the low-level potential (0 V).

Table 2 summarizes the relationship between potentials supplied to the terminals IT1 and IT2 and potentials output from the terminal OT in the circuit 100B of FIG. 4A.

TABLE 2

| Potential supplied to terminal IT1 | Potential supplied to terminal IT2 | Potential output from terminal OT |
| --- | --- | --- |
| Low-level potential (0 V) | Low-level potential (0 V) | High-level potential (0.45 V) |
| Low-level potential (0 V) | High-level potential (0.45 V) | High-level potential (0.45 V) |
| High-level potential (0.45 V) | Low-level potential (0 V) | High-level potential (0.45 V) |
| High-level potential (0.45 V) | High-level potential (0.45 V) | Low-level potential (0 V) |

A case in which the transistors TrO3 to TrO6 are OS transistors is specifically considered. Since the subthreshold current is made to flow between the source and the drain of each of the transistors TrO3 to TrO6, power consumption can be reduced as compared with a case of using transistors operating in the saturation regions. Moreover, when any of the transistors TrO3 to TrO6 is off, the off-leakage current flowing between the source and the drain of the transistor is smaller than that of a Si transistor; accordingly, electric power can be prevented from being consumed due to an off-leakage current.

Configuration Example 4

Figure 5:
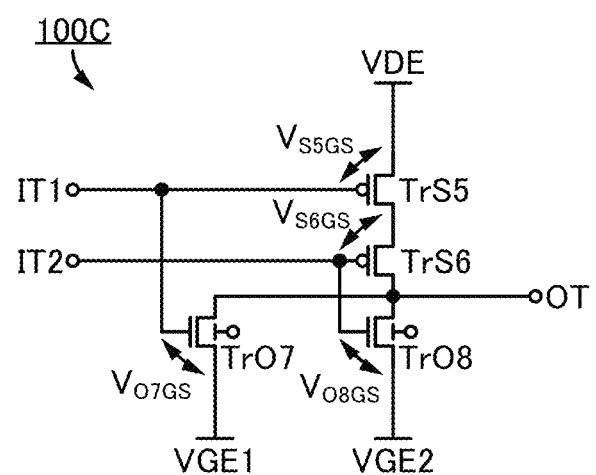
FIG. 5 is a circuit diagram illustrating a configuration example of a circuit included in a semiconductor device.

A circuit 100C illustrated in FIG. 5 is an example of a NOR circuit and is a semiconductor device of one embodiment of the present invention.

The circuit 100C includes, for example, transistors TrS5 and TrS6, and transistors TrO7 and TrO8.

For example, the transistors that can be applied to the transistor TrS described in Configuration example 1 can be used for the transistors TrS5 and TrS6.

For example, the transistors that can be applied to the transistor TrO described in Configuration example 1 can be used for the transistors TrO7 and TrO8.

The transistors TrS5 and TrS6 and the transistors TrO7 and TrO8 can operate in subthreshold regions unless otherwise specified.

A first terminal of the transistor TrS5 is electrically connected to the wiring VDE, a second terminal of the transistor TrS5 is electrically connected to a first terminal of the transistor TrS6, and a gate of the transistor TrS5 is electrically connected to a gate of the transistor TrO7 and the terminal IT1. A second terminal of the transistor TrS6 is electrically connected to a first terminal of the transistor TrO7, a first terminal of the transistor TrO8, and the terminal OT, and a gate of the transistor TrS6 is electrically connected to a gate of the transistor TrO8 and the terminal IT2. A second terminal of the transistor TrO7 is electrically connected to the wiring VGE1, and a second terminal of the transistor TrO8 is electrically connected to the wiring VGE2.

Each of the terminals IT1 and IT2 in the circuit 100C serves as an input terminal in the circuit 100C, for example. The terminal OT in the circuit 100C serves as an output terminal of the circuit 100C, for example.

The wiring VDE in FIG. 5 serves as a wiring for supplying a high power supply potential to the circuit 100C, for example.

The wiring VGE1 in FIG. 5 serves as a wiring for supplying a low power supply potential to the circuit 100C, for example. The wiring VGE2 in FIG. 5 serves as a wiring for supplying a low power supply potential to the circuit 100C, for example. Note that it is preferable that the potentials supplied from the wirings VGE1 and VGE2 be equal to each other. In that case, the low power supply potential supplied from the wirings VGE1 and VGE2 can each be a ground potential, 0 V, or a negative potential, for example. Depending on circumstances, potentials supplied to the wirings VGE1 and VGE2 may be different from each other.

Configuration Example 4

Next, an operation example of the circuit 100C illustrated in FIG. 5 will be described. Each of the transistors TrS5 and TrS6, and the transistors TrO7 and TrO8 can operate in the subthreshold region, unless otherwise specified.

The potential supplied to the first terminal of the transistor TrS5 from the wiring VDE is set to a high-level potential. Note that the high-level potential is 0.45 V, for example. In addition, the potential supplied to the second terminal of the transistor TrO7 from the wiring VGE1 and the potential supplied to the second terminal of the transistor TrO8 from the wiring VGE2 are each set to a low-level potential. Note that the low-level potential here is 0 V, for example.

In addition, the high-level potential (0.45 V) or the low-level potential (0 V) is input to the terminal IT1 in the circuit 100C. The high-level potential (0.45 V) or the low-level potential (0 V) is also input to the terminal IT2 in the circuit 100C.

Note that the potential difference (−0.45V) which is obtained by subtracting the high-level potential from the low-level optional potential is within the range of the gate-source voltage of the transistors TrS5 and TrS6 where the transistors TrS5 and TrS6 operate in the subthreshold region. In addition, the potential difference (0.45V) which is obtained by subtracting the low-level potential from the high-level optional potential is within the range of the gate-source voltage of the transistors TrO7 and TrO8 where the transistors TrO7 and TrO8 operate in the subthreshold region.

When the gate-source voltage of one or more of the transistors TrS5, TrS6, TrO7, and TrO8 is 0 V, the transistor(s) is/are off.

A case is considered first in which the low-level potential (0 V) is input to each of the terminals IT1 and IT2. When the gate-source voltage of the transistor TrS5 is expressed as $V_{S5GS}$, $V_{S5GS}=-0.45$, whereby the transistor TrS5 operates in the subthreshold region. When the gate-source voltage of the transistor TrO7 is expressed as $V_{O7GS}$, $V_{O7GS}=0$, whereby the transistor TrO7 is turned off. When the gate-source voltage of the transistor TrO8 is expressed as $V_{O8GS}$, $V_{O8GS}=0$, whereby the transistor TrO8 is turned off.

At this time, the low-level potential (0 V) is supplied to the gate of the transistor TrS6 from the terminal IT2, and the high-level potential (0.45 V) is supplied to the first terminal of the transistor TrS6 from the wiring VDE. When the gate-source voltage of the transistor TrS6 is expressed as $V_{S6GS}$, $V_{S6GS}=-0.45$, whereby the transistor TrS6 operates in the subthreshold region.

The transistors TrO7 and TrO8 are in an off state as described above; thus, electrical continuity is not established between the terminal OT and the wiring VGE1 nor between the terminal OT and the wiring VGE2. Furthermore, since the subthreshold current flows between the source and the drain of each of the transistors TrS5 and TrS6, the potential of the terminal OT becomes the high-level potential (0.45 V).

Next, a case is described in which the low-level potential (0 V) is input to the terminal IT1 and the high-level potential (0.45 V) is input to the terminal IT2. The gate-source voltage $V_{S5GS}$ of the transistor TrS5 becomes −0.45 V, whereby the transistor TrS5 operates in the subthreshold region. Since the gate-source voltage $V_{O7GS}$ of the transistor TrO7 becomes 0 V, the transistor TrO7 is turned off. The gate-source voltage $V_{O8GS}$ of the transistor TrO8 becomes 0.45 V, whereby the transistor TrO8 operates in the subthreshold region.

At this time, the high-level potential (0.45 V) is supplied to the gate of the transistor TrS6 from the terminal IT2, and the high-level potential (0.45 V) is supplied to the first terminal of the transistor TrS6 from the wiring VDE. Thus, the gate-source voltage $V_{S6GS}$ of the transistor TrS6 becomes 0 V, whereby the transistor TrS6 is turned off.

Since the transistors TrS6 and TrO7 are in an off state as described above, electrical continuity is not established between the terminal OT and the wiring VGE1 nor between the terminal OT and the wiring VGE2. In addition, since the subthreshold current flows between a source and a drain of the transistor TrO8, the potential of the terminal OT becomes the low-level potential (0 V). Although the subthreshold current also flows between a source and a drain of the transistor TrS5, the transistor TrS6 is off, whereby a current cannot flow from the terminal OT to the wiring VDE.

Next, a case is described in which the high-level potential (0.45 V) is input to the terminal IT1 and the low-level potential (0 V) is input to the terminal IT2. The gate-source voltage $V_{S5GS}$ of the transistor TrS5 becomes 0 V, whereby the transistor TrS5 is turned off. The gate-source voltage $V_{O7GS}$ of the transistor TrO7 becomes 0.45 V, whereby the transistor TrO7 operates in the subthreshold region. The gate-source voltage $V_{O8GS}$ of the transistor TrO8 becomes 0 V, whereby the transistor TrO8 is turned off.

The low-level potential (0 V) is supplied to the gate of the transistor TrS6 from the terminal IT2. At this time, since electrical continuity is not established between the first terminal of the transistor TrS6 and the wiring VDE, when the potential of the first terminal of the transistor TrO6 reaches a potential which is obtained by adding the threshold voltage of the transistor TrO6 to the potential (0V) of the second terminal of the transistor TrO6, the transistor TrO6 is turned off.

Since the transistors TrS5 and TrS6, and the transistor TrO8 are in an off state as described above, electrical continuity is not established between the terminal OT and the wiring VDE nor between the terminal OT and the wiring VGE2. Furthermore, since the subthreshold current flows between a source and a drain of the transistor TrO7, the potential of the terminal OT becomes the low-level potential (0 V). Note that either when the subthreshold current also flows between the source and the drain of the transistor TrS6 or when the transistor TrS6 is off, since the transistor TrS5 is off, a current cannot flow to the terminal OT from the wiring VDE.

Next, a case is considered in which the high-level potential (0.45 V) is input to each of the terminals IT1 and IT2. The gate-source voltage $V_{S5GS}$ of the transistor TrS5 becomes 0 V, whereby the transistor TrS5 is turned off. In addition, since the gate-source voltage $V_{O7GS}$ of the transistor TrO7 becomes 0.45 V, the transistor TrO7 operates in the subthreshold region. In addition, since the gate-source voltage $V_{O5GS}$ of the transistor TrO8 becomes 0.45 V, the transistor TrO8 operates in the subthreshold region.

The high-level potential (0.45 V) is supplied to the gate of the transistor TrS6 from the terminal IT2. The potential of the first terminal of the transistor TrS6 is thought to be higher than or equal to the low-level potential (0 V) supplied from either the wiring VGE1 or the wiring VGE2 and lower than or equal to the high-level potential (0.45 V) supplied from the wiring VDE although the potential of the first terminal of the transistor TrS6 is indefinite. Therefore, the gate-source voltage $V_{S6GS}$ of the transistor TrS6 is likely to be higher than or equal to 0 V and lower than or equal to 0.45 V. Thus, when the threshold voltage of the transistor TrS6 is negative, the transistor TrS6 is turned off. In this operation example, the high-level potential (0.45 V) is supplied to the gate of the transistor TrS6, whereby the transistor TrS6 is turned off.

Since the transistors TrS5 and TrS6 are in an off state as described above, electrical continuity is not established between the terminal OT and the wiring VDE. Furthermore, since the subthreshold current flows between the source and the drain of each of the transistors TrO7 and TrO8, the potential of the terminal OT becomes the low-level potential (0 V).

Table 3 summarizes the relationship between potentials supplied to the terminals IT1 and IT2 and potentials output from the terminal OT in the circuit 100C of FIG. 5.

TABLE 3

| Potential supplied to terminal IT1 | Potential supplied to terminal IT2 | Potential output from terminal OT |
| --- | --- | --- |
| Low-level potential (0 V) | Low-level potential (0 V) | High-level potential (0.45 V) |
| Low-level potential (0 V) | High-level potential (0.45 V) | Low-level potential (0 V) |
| High-level potential (0.45 V) | Low-level potential (0 V) | Low-level potential (0 V) |
| High-level potential (0.45 V) | High-level potential (0.45 V) | Low-level potential (0 V) |

A case in which the transistors TrO7 and TrO8 are OS transistors is specifically considered. Since the subthreshold current is made to flow between the source and the drain of each of the transistors TrO7 and TrO8, power consumption can be reduced as compared with a case of using transistors operating in the saturation regions. In addition, when the transistor TrO7 or TrO8 is off, the off-leakage current flowing the source and the drain of the transistor TrO7 or TrO8 is smaller than that of a Si transistor; accordingly, electric power can be prevented from being consumed due to an off-leakage current.

Note that the circuit configurations explained in this embodiment can be combined with each other as appropriate.

This embodiment can be combined with any of the other embodiments in this specification as appropriate.

Embodiment 2

In this embodiment, configuration examples of a switch including a transistor and a bootstrap circuit for stable operation of the switch will be described.

In the logic circuit described in Embodiment 1, the transistors that can operate in the subthreshold region and can operate in an off state in which an off-leakage current smaller than the subthreshold current flows are used; thus, the power consumption of the logic circuit can be reduced as compared with a logic circuit including transistors that operate in the saturation region.

The voltage input to the terminal IT and the pulse voltage input to the terminals CT and CTB, which are mentioned in the explanation of the logic circuits or the like in Embodiment 1, fall within the voltage range in which the transistors included in the logic circuit can operate in the subthreshold regions. In other words, the voltage input to the terminal IT and the pulse voltages input to the terminals CT and CTB are lower than the voltages at the time when the transistors operate in the linear regions and the saturation regions.

For this reason, in the case in which a circuit including the logic circuit or the like in Embodiment 1 and a switch including a transistor is configured, the transistor preferably operates in the range of a linear region or a saturation region so that the transistor can stably operate. To put it differently, in some cases, the transistor cannot be adequately turned on or off when a voltage within a voltage in the voltage range enabling the operation in the subthreshold region is supplied to the transistor.

That is, in the case in which the logic circuit or the like in Embodiment 1 and the switch are driven, there is a need that different voltages are applied to the logic circuit and the switch. Alternatively, a voltage in the voltage range for operation in the subthreshold region to be applied to the switch should be increased with a bootstrap circuit or the like.

Configuration Example

Figure 6:
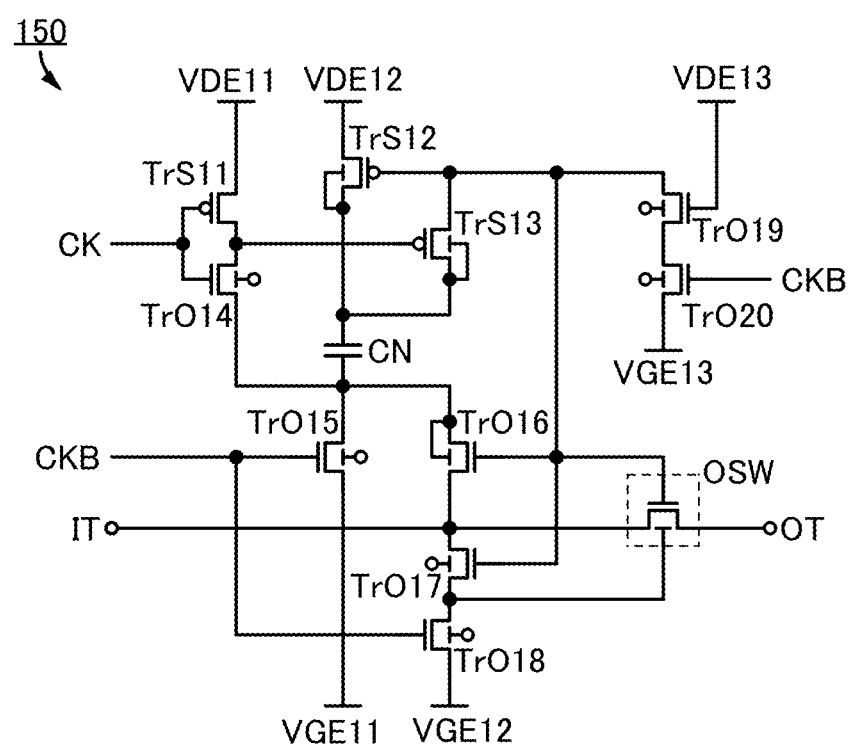
FIG. 6 is a circuit diagram illustrating a configuration example of a circuit included in a semiconductor device.

The circuit 150 in FIG. 6 is an example of a bootstrap circuit that can increase a voltage to be applied to a transistor OSW included in the switch. The circuit 150 includes transistors TrS11 to TrS13, transistors TrO14 to TrO20, and the transistor OSW.

As the transistors TrS11 to TrS13, for example, the transistor that can be used as the transistor TrS described in Configuration example 1 in Embodiment 1 can be used.

For example, the transistors TrS11 to TrS13 can be p-channel transistors with a silicon-on-insulator (SOI) structure. Alternatively, at least one of the transistors TrS11 to TrS13 may be a p-channel transistor with an SOI structure, not all of the transistors TrS11 to TrS13.

As the transistors TrO14 to TrO20, for example, the transistor that can be used as the transistor TrO described in Configuration example 1 can be used.

Each of the transistors TrS11 to TrS13 and the transistors TrO14 to TrO20 can operate in the subthreshold regions, unless otherwise specified.

A first terminal of the transistor TrS11 is electrically connected to a wiring VDE11, a second terminal of the transistor TrS11 is electrically connected to a first terminal of the transistor TrO14 and a gate of the transistor TrS13, and a gate of the transistor TrS11 is electrically connected to a wiring CK and a gate of the transistor TrO14. A first terminal of the transistor TrS12 is electrically connected to a wiring VDE12; a gate of the transistor TrS12 is electrically connected to a first terminal of the transistor TrS13, a first terminal of a transistor TrO19, a gate of a transistor TrO16, a gate of the transistor TrO17, and a gate of the transistor OSW; and a second terminal of the transistor TrS12 is electrically connected to a back gate of the transistor TrS12, a second terminal of the transistor TrS13, a back gate of the transistor TrS13, and a first terminal of a capacitor CN. A gate of the transistor TrO19 is electrically connected to a wiring VDE13, and a second terminal of the transistor TrO19 is electrically connected to a first terminal of the transistor TrO20. A gate of the transistor TrO20 is electrically connected to the wiring CKB and a second terminal of the transistor TrO20 is electrically connected to a wiring VGE13.

A first terminal of the transistor TrO15 is electrically connected to a second terminal of the transistor TrO14, a first terminal of the transistor TrO16, a back gate of the transistor TrO16, and a second terminal of the capacitor CN; and a gate of the transistor TrO15 is electrically connected to the wiring CKB and a gate of the transistor TrO18; and a second terminal of the transistor TrO15 is electrically connected to a wiring VGE11. A first terminal of the transistor TrO17 is electrically connected to a second terminal of the transistor TrO16, a first terminal of the transistor OSW, and the terminal IT; and a second terminal of the transistor TrO17 is electrically connected to a first terminal of the transistor TrO18 and a back gate of the transistor OSW. A second terminal of the transistor TrO18 is electrically connected to a wiring VGE12. A second terminal of the transistor OSW is electrically connected to the terminal OT.

The terminal IT in the circuit 150 serves as an input terminal in the circuit 150, for example. The terminal OT in the circuit 150 serves as an output terminal of the circuit 150, for example. In other words, the terminal IT in the circuit 150 corresponds to one of a pair of terminals of the switch including the transistor OSW, and the terminal OT of the circuit 150 corresponds to the other of the pair of terminals of the switch including the transistor OSW.

The wiring VDE11 serves as a wiring for supplying a high power supply potential (sometimes referred to as a high-level potential) to the circuit 150, for example. The wiring VDE12 serves as a wiring for supplying a high power supply potential to the circuit 150, for example. The wiring VDE13 serves as a wiring for supplying a high power supply potential to the circuit 150, for example. Note that the potentials supplied from the wirings VDE11 to VDE13 are preferably equal to each other. Alternatively, the potentials supplied from the wirings VDE11 to VDE13 may be different depending on circumstances.

The wiring VGE11 serves as a wiring for supplying a low power supply potential (sometimes referred to as a low-level potential) to the circuit 150, for example. The wiring VGE12 serves as a wiring for supplying a low power supply potential to the circuit 150, for example. The wiring VGE13 serves as a wiring for supplying a low power supply potential to the circuit 150, for example. Note that the potentials supplied from the wirings VGE11 to VGE13 are preferably equal to each other. In that case, the low power supply potential supplied from the wirings VGE11 to VGE13 can each be a ground potential, 0 V, or a negative potential, for example. Depending on circumstances, the potentials supplied to the wirings VGE11 to VGE13 may be different from each other.

The wiring CK in FIG. 6 serves as a wiring for supplying a pulse voltage to the circuit 150, for example. In particular, the pulse voltage is a pulse voltage (clock signal) with a high-level potential and a low-level potential which are periodically repeated.

The terminal CKB illustrated in FIG. 6 serves as a wiring for supplying a potential whose logic is inverted from the logic of the potential supplied to the wiring CK. For example, when the high-level potential is supplied to the wiring CK, the low-level potential is supplied to the wiring CKB. When the low-level potential is supplied to the wiring CK, the high-level potential is supplied to the wiring CKB.

Operation Example

Next, an operation example of the circuit 150 illustrated in FIG. 6 will be described.

In this operation example, the high-level potential supplied to the wirings VDE11 to VDE13 is 0.45 V, for example. The low-level potential supplied to the wirings VGE11 to VGE13 is, for example, 0 V.

First, the low-level potential (0 V) is supplied to the wiring CK. The low-level potential can be a ground potential, 0 V, or a negative potential, for example. Note that in this operation example, the low-level potential is 0 V. In addition, when the low-level potential is supplied to the wiring CK, a high-level potential is supplied to the wiring CKB. Note that in this operation example, the high-level potential is 0.45 V.

When the low-level potential (0 V) is supplied to the wiring CK, the transistor TrS11 operates in the subthreshold region and the transistor TrO14 is turned off. Thus, when a subthreshold current flows to the gate of the transistor TrS13 through the transistor TrS11 from the wiring VDE11, the potential of the gate of the transistor TrS13 becomes 0.45 V. Thus, the transistor TrS13 is turned off.

Furthermore, when the high-level potential (0.45 V) is supplied to the wiring CKB, the transistors TrO15, TrO18, and TrO20 each operate in the subthreshold region.

When the transistor TrO15 operates in the subthreshold region, the low-level potential (0 V) is supplied to the second terminal of the transistor TrO14, the second terminal of the capacitor CN, the first terminal of the transistor TrO16, and the back gate of the transistor TrO16 from the wiring VGE11.

Furthermore, when the transistor TrO18 operates in the subthreshold region, the low-level potential (0 V) is supplied to the second terminal of the transistor TrO17 and the back gate of the transistor OSW from the wiring VGE12.

Moreover, when the transistor TrO20 operates in the subthreshold region, the low-level potential is supplied to the second terminal of the transistor TrO19 from the wiring VGE13; consequently, the potential of the second terminal of the transistor TrO19 becomes 0 V. Since the high-level potential (0.45 V) is supplied to the gate of the transistor TrO19, the transistor TrO19 operates in the subthreshold region. Thus, the low-level potential (0 V) is supplied to the gate of the transistor TrS12, the first terminal of the transistor TrS13, the gate of the transistor TrO16, the gate of the transistor TrO17, and the gate of the transistor OSW from the wiring VGE13.

When the low-level potential (0 V) is supplied to the gate of the transistor TrS12, the transistor TrS12 operates in the subthreshold region, and the high-level potential (0.45 V) is supplied to the first terminal of the capacitor CN and the second terminal of the transistor TrS13 from the wiring VDE12.

The low-level potential (0 V) is supplied to the gate of the transistor TrO16 and the gate of the transistor TrO17, whereby the transistors TrO16 and TrO17 are turned off.

At this time, the potential $V_{sig}$ is input to the terminal IT of the circuit 150 as an electric signal.

Next, a case is considered in which the low-level potential (0 V) supplied to the wiring CK is changed to the high-level potential (0.45 V). At this time, the high-level potential (0.45 V) supplied to the wiring CKB is changed to the low-level potential (0 V).

When the high-level potential (0.45 V) is supplied to the wiring CK, the transistor TrS11 is turned off and the transistor TrO14 operates in the subthreshold region. Thus, since the subthreshold current flows between the source and the drain of the transistor TrO14, the gate potential of the transistor TrS13 is lower than 0.45 V. Thus, the gate-source voltage of the transistor TrS13 is lower than the threshold voltage, whereby the transistor TrS13 is turned on.

Furthermore, when the low-level potential (0 V) is supplied to the wiring CKB, the transistor TrO20 is turned off.

When the transistor TrS13 is turned on, charges stored in the first terminal of the capacitor CN are distributed to the gate of the transistor TrO16, the gate of the transistor TrO17, the gate of the transistor OSW, and the like. Since the transistor TrO20 is in an off state, the charges distributed to the gate of the transistor TrO16, the gate of the transistor TrO17, the gate of the transistor OSW, and the like are not released. Accordingly, the potential of the gate of the transistor TrS12 increases, so that the gate-source voltage of the transistor TrS12 is higher than the threshold voltage, whereby the transistor TrS12 is turned off.

In addition, since the potential of the gate of the transistor TrO16 is increased, when the gate-source voltage of the transistor TrO16 is higher than the threshold voltage, the transistor TrO16 operates in the subthreshold region. Similarly, since the potential of the gate of the transistor TrO17 is increased, when the gate-source voltage of the transistor TrO17 is higher than the threshold voltage, the transistor TrO17 operates in the subthreshold region.

When the low-level potential (0 V) is supplied to the wiring CKB, the transistors TrO15 and TrO18 are turned off.

At this time, $V_{sig}$ supplied to the terminal IT in the circuit 150 is input to the back gate of the transistor OSW and the second terminal of the capacitor CN.

When the potential $V_{sig}$ that is the same as the potential supplied to the first terminal of the transistor OSW is input to the back gate of the transistor OSW, the on-state current flowing through the transistor OSW can be increased in some cases.

In addition, when $V_{sig}$ is supplied to the second terminal of the capacitor CN, the potential of the first terminal of the capacitor CN becomes higher by capacitive coupling in the capacitor CN. Since the transistor TrS13 operates in the subthreshold region, the potential of the first terminal of the capacitor CN is increased and the potentials of the gates of the transistors TrO16, TrO17, and OSW are also increased.

Since the transistors TrO15 and TrO18 are in an off state, electrical continuity is not established between the terminal IT and the wiring VGE11 nor between the terminal IT and the wiring VGE12. That is, there is no current flow between the terminal IT and the wiring VGE11 and between the terminal IT and the wiring VGE12.

Thus, the potential of the gate of the transistor OSW can be increased, so that the transistor OSW can operate in the range of the linear region or the saturation region in some cases. Thus, the transistor OSW is turned on, whereby the circuit 150 can output a potential substantially equal to the potential $V_{sig}$ input to the terminal IT from the terminal OT.

This embodiment can be combined with any of the other embodiments in this specification as appropriate.

Embodiment 3

This embodiment will describe a SAR-ADC logic circuit that can be included in an electronic device.

Figure 7:
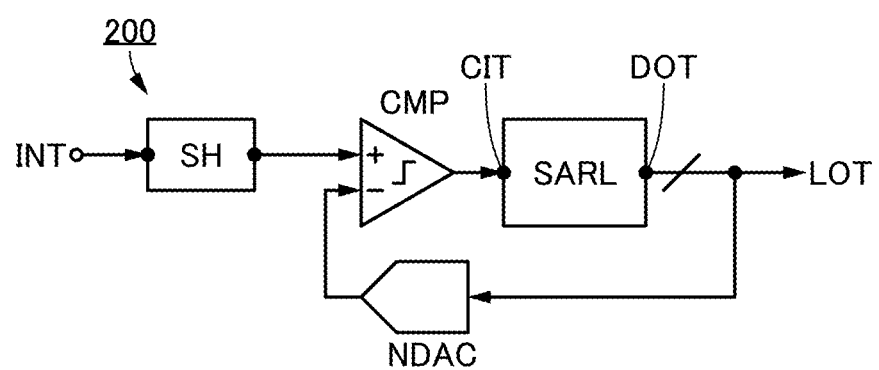
FIG. 7 is a circuit diagram illustrating a configuration example of a semiconductor device.

FIG. 7 illustrates a circuit diagram illustrating a configuration example of a circuit 200 that is a SAR-ADC logic circuit. The circuit 200 includes a circuit SH, a comparator CMP, a circuit SARL, and a digital-to-analog converter circuit NDAC, for example. The circuit 200 includes a terminal INT serving as an input terminal and a terminal LOT serving as an output terminal.

An input terminal of the circuit SH is electrically connected to the terminal INT. An output terminal of the circuit SH is electrically connected to a positive-side (+) terminal of the comparator CMP. An output terminal of the comparator CMP is electrically connected to a terminal CIT of the circuit SARL. A terminal DOT of the circuit SARL is electrically connected to the terminal LOT and an input terminal of the digital-to-analog converter circuit NDAC. An output terminal of the digital-to-analog converter NDAC circuit is electrically connected to a negative-side (−) terminal of the comparator CMP.

An analog potential is, for example, input to the terminal INT of the circuit 200.

The circuit SH serves as a sample and hold circuit, for example. In the circuit 200, an analog potential input from the terminal INT can be retained temporarily in the circuit SH. Furthermore, the circuit SH can output the retained analog potential to the positive-side (+) terminal of the comparator CMP.

The comparator CMP has a function of comparing the analog potentials input to the positive-side (+) and negative-side (−) terminals and outputting the result to the output terminal of the comparator CMP. For example, the comparator CMP outputs the high-level potential from the output terminal of the comparator CMP when the analog potential input to the positive-side (+) terminal is higher than the analog potential input to the negative-side (−) terminal, and outputs the low-level potential from the output terminal of the comparator CMP when the analog potential input to the positive-side (+) terminal is lower than the analog potential input to the negative-side (−) terminal.

The circuit SARL is a circuit corresponding to a logic circuit in the SAR-ADC logic circuit, and includes a flip-flop circuit and a latch circuit, for example. The circuit SARL includes the terminal CIT and the terminal DOT. The terminal CIT receives a potential output from the output terminal of the comparator CMP, and the terminal DOT outputs a digital potential converted by the circuit 200 to the terminal LOT of the circuit 200 and the input terminal of the digital-to-analog converter circuit NDAC.

The digital-to-analog converter circuit NDAC has a function of converting a digital potential output from the terminal DOT of the circuit SARL into an analog potential and outputting the analog potential to the negative-side (—) terminal of the comparator.

The circuit SARL may output a digital potential from the terminal DOT as a complementary signal. In that case, two digital-to-analog converter circuits NDAC may be one set, in which case one of the complementary signals is input to one of the digital-to-analog converter circuits NDAC and the other signal of the complementary signals is input to the other of the digital-to-analog converter circuits NDAC in the circuit 200.

Figure 8A:
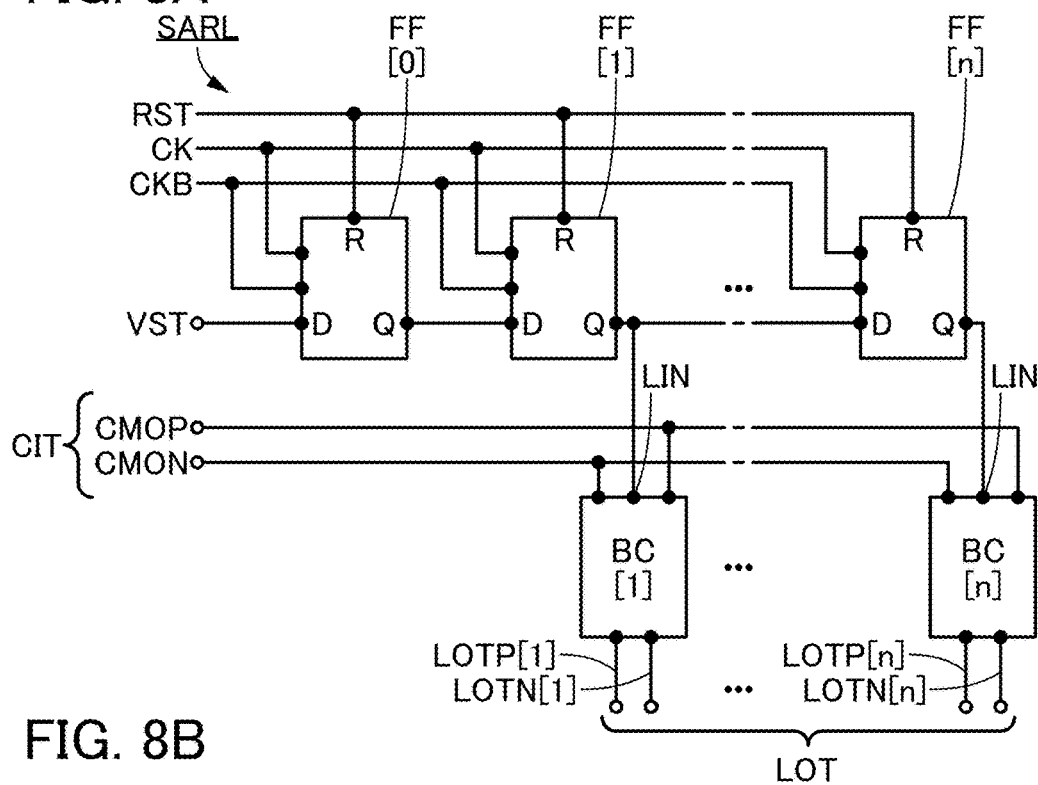
FIGS. 8A to 8C are circuit diagrams each illustrating a configuration example of a circuit included in a semiconductor device.

Next, the configuration of the circuit SARL is described. FIG. 8A is a block diagram illustrating a configuration example of the circuit SARL, and the circuit SARL in FIG. 8A includes flip-flop circuits FF[0] to FF[n] (n is an integer of 1 or more) and latch circuits BC[1] to BC[n].

The flip-flop circuits FF[0] to FF[n] illustrated in FIG. 8A each include a D terminal, a Q terminal, and an R terminal. The flip-flop circuits FF[0] to FF[n] are each electrically connected to the wirings CK and CKB.

The D terminal of each of the flip-flop circuits FF[0] to FF[n] serves as an input terminal to which a data signal (potential) is input. The Q terminal of each of the flip-flop circuits FF[0] to FF[n] serves as an output terminal which outputs the data signal (potential).

The R terminal of each of the flip-flop circuits FF[0] to FF[n] serves as an input terminal serves as an input terminal to receive a control signal for deletion of data stored in each of the flip-flop circuits FF[0] to FF[n]. In FIG. 8A, a wiring RST serving as a wiring for supplying the control signal is illustrated.

The wiring CK in FIG. 8A serves as, for example, a wiring that supplies a pulse voltage. In particular, the pulse voltage can be, for example, a pulse voltage (clock signal) with a high-level potential and a low-level potential which are periodically repeated.

The wiring CKB illustrated in FIG. 8A serves as, for example, a wiring for supplying a potential whose logic is inverted from that of the potential supplied to the wiring CK. For example, when the high-level potential is supplied to the wiring CK, the low-level potential is supplied to the wiring CKB, and when the low-level potential is supplied to the wiring CK, the high-level potential is supplied to the wiring CKB.

Each of the latch circuits BC[1] to BC[n] in FIG. 8A includes a terminal LIN. Each of the latch circuits BC[1] to BC[n] includes two output terminals. For example, in FIG. 8A, the output terminals are terminals LOTP[1] to LOTP[n] and terminals LOTN[1] to LOTN[n]. In FIG. 8A, the terminals LOTP[1] to LOTP[n] and the terminals LOTN[1] to LOTN[n] are collectively referred to the terminal LOT. Each of the latch circuits BC[1] to BC[n] are electrically connected to wirings CMOP and CMON.

Note that a set of the terminal LOTP[1] and the terminal LOTN[1] to a set of the terminal LOTP[n] and the terminal LOTN[n] included in the circuit SARL in FIG. 8A serve as output terminals that outputs digital potentials as complementary signals.

The flip-flop circuits FF[0] to FF[n] are sequentially connected to each other in such a manner that the Q terminal of the flip-flop circuit in the previous stage is electrically connected to the D terminal of the flip-flop circuit in the subsequent stage. The D terminal of the first-stage flip-flop circuit FF[0] is electrically connected to a terminal VST. The Q terminal of the second-stage flip-flop circuit FF[1] is electrically connected to the terminal LIN of the latch circuit BC[1], and the Q terminal of the (n+1)-th stage flip-flop circuit FF[n] is electrically connected to the terminal LIN of the latch circuit BC[n].

A constant potential is input to the terminal VST, for example. The constant potential can be a ground potential, 0 V, or a negative potential, for example.

Figure 8B:
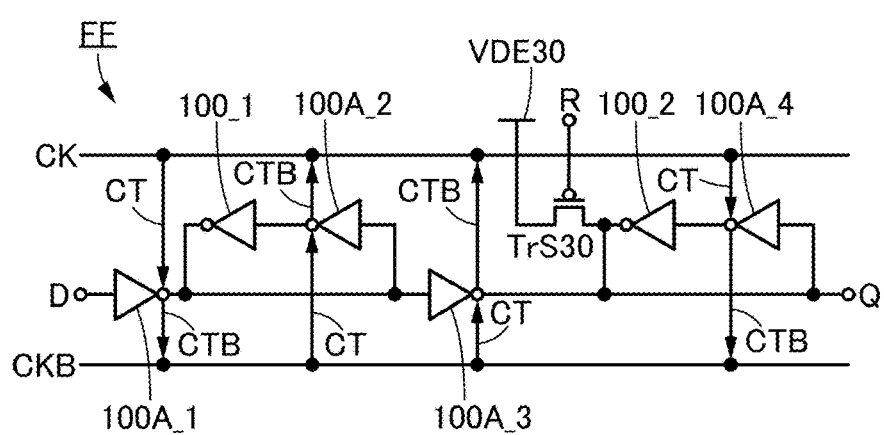

Here, the configuration of the flip-flop circuits FF[0] to FF[n] will be described. FIG. 8B illustrates a configuration example of the flip-flop circuit applicable to the flip-flop circuits FF[0] to FF[n].

The flip-flop circuit FF illustrated in FIG. 8B includes, for example, circuits 100A_1 to 100A_4, circuits 100_1 and 100_2, and a transistor TrS30.

Each of the circuits 100A_1 to 100A_4 has a function of a clocked inverter circuit, for example. Thus, the circuit 100A described in Embodiment 1 can be used for each of the circuits 100A_1 to 100A_4, for example.

Each of the circuits 100_1 and 100_2 serves as an inverter circuit, for example. Thus, the circuit 100 described in Embodiment 1 can be used for each of the circuits 100_1 and 100_2, for example.

For example, the transistor that can be used as the transistor TrS described in Configuration example 1 in Embodiment 1 can be used as the transistor TrS30.

An input terminal of the circuit 100A_1 is electrically connected to the D terminal of the flip-flop circuit FF. An output terminal of the circuit 100A_1 is electrically connected to an output terminal of the circuit 100_1, an input terminal of the circuit 100A_2, and an input terminal of the circuit 100A_3. In addition, an output terminal of the circuit 100A_2 is electrically connected to an input terminal of the circuit 100_1. In addition, an output terminal of the circuit 100A_3 is electrically connected to an output terminal of the circuit 100_2, an input terminal of the circuit 100A_4, a first terminal of the transistor TrS30, and the Q terminal of the flip-flop circuit FF. An output terminal of the circuit 100A_4 is electrically connected to an input terminal of the circuit 100_2. A second terminal of the transistor TrS30 is electrically connected to a wiring VDE30.

In addition, the wiring CK is electrically connected to a terminal CT of the circuit 100A_1, a terminal CTB of the circuit 100A_2, a terminal CTB of the circuit 100A_3 and a terminal CT of the circuit 100A_4. In addition, the wiring CKB is electrically connected to a terminal CTB of the circuit 100A_1, a terminal CT of the circuit 100A_2, a terminal CT of the circuit 100A_3, and a terminal CTB of the circuit 100A_4.

The wiring VDE30 serves as a wiring for supplying a high power supply potential (sometimes referred to as a high-level potential) to the flip flop circuit FF, for example.

Figure 8C:
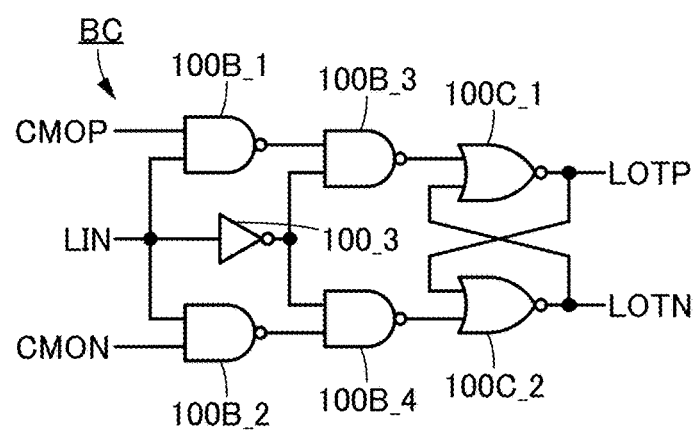

Next, the configuration of the latch circuits BC[1] to BC[n] is described. FIG. 8C illustrates a configuration example of a latch circuit BC that can be used as each of the latch circuits BC[1] to BC[n].

The latch circuit BC illustrated in FIG. 8C includes circuits 100B_1 to 100B_4, circuits 100C_1 and 100C_2, and a circuit 100_3, for example.

Each of the circuits 100B_1 to 100B_4 serves as a NAND circuit, for example. Thus, the circuit 100B described in Embodiment 1 can be used as each of the circuits 100B_1 to 100B_4.

Note that the latch circuit BC includes a terminal LOTP and a terminal LOTN, for example. Note that a potential output from the terminal LOTN is a potential whose logic is inverted from the logic of a potential output from the terminal LOTP. The terminal LOTN is not illustrated in the circuit SARL in FIG. 8A; however, the potential output from the circuit 200 may be a potential output from the terminal LOTN of each of the latch circuits BC[2] to BC[n].

Each of the circuits 100C_1 and 100C_2 serves as a NOR circuit, for example. Therefore, the circuit 100C described in Embodiment 1 can be used as each of the circuits 100C_1 and 100C_2, for example.

The circuit 100_3 serves as an inverter circuit, for example. Therefore, the circuit 100 in Embodiment 1 can be used for the circuit 100_3, for example.

A first input terminal of the circuit 100B_1 is electrically connected to the wiring CMOP, and an output terminal of the circuit 100B_1 is electrically connected to a first input terminal of the circuit 100B_3. A first input terminal of the circuit 100B_2 is electrically connected to the wiring CMON, and an output terminal of the circuit 100B_2 is electrically connected to a first input terminal of the circuit 100B_4. The terminal LIN of the latch circuit BC is electrically connected to a second input terminal of the circuit 100B_1, a second input terminal of the circuit 100B_2, and an input terminal of the circuit 100_3. An output terminal of the circuit 100_3 is electrically connected to a second input terminal of the circuit 100B_3 and a second input terminal of the circuit 100B_4.

An output terminal of the circuit 100B_3 is electrically connected to a first input terminal of the circuit 100C_1. An output terminal of the circuit 100B_4 is electrically connected to a first input terminal of the circuit 100C_2. An output terminal of the circuit 100C_1 is electrically connected to the terminal LOTP and a second input terminal of the circuit 100C_2. An output terminal of the circuit 100C_2 is electrically connected to the terminal LOTN and a second input terminal of the circuit 100C_1.

As described above, the semiconductor device described in Embodiment 1 is used for the logic circuit (e.g., circuit SARL) included in the SAR-ADC logic circuit, whereby the SAR-ADC logic circuit with low power consumption can be obtained.

Note that the semiconductor device of one embodiment of the present invention is not limited to the above-described circuit configuration and may have a configuration changed as appropriate.

Figure 9A:
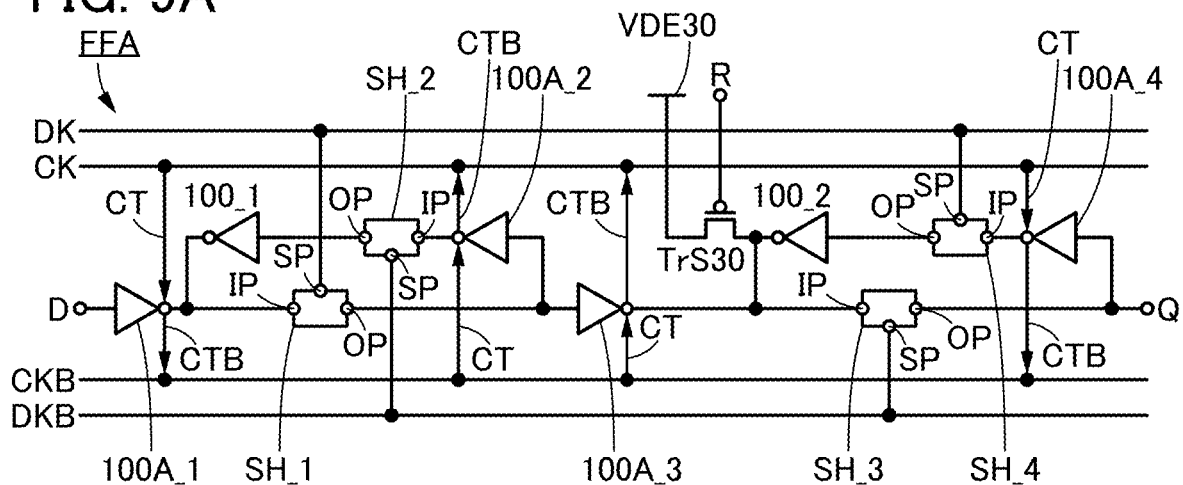
FIGS. 9A and 9B are circuit diagrams each illustrating a configuration example of a circuit included in a semiconductor device.

For example, the flip-flop circuit FF illustrated in FIG. 8B may have a configuration of the flip-flop circuit FFA illustrated in FIG. 9A. The flip-flop circuit FFA is a modification example of the flip-flop circuit FF and is different from the flip-flop circuit FF, in that circuits SH_1 to SH_4 are included.

Each of the circuits SH_1 to SH_4 includes a terminal IP, a terminal OP, and a terminal SP. For example, in each of the circuits SH_1 to SH_4, the terminal IP serves as an input terminal, the terminal OP serves as an output terminal, and the terminal SP serves as a control terminal.

When a potential input to the terminal SP is changed from the low-level potential to the high-level potential, each of the circuits SH_1 to SH_4 has a function of receiving a potential input to the terminal IP and outputting the potential to the terminal OP. In addition, when a potential input to the terminal SP is changed from the high-level potential to the low-level potential, each of the circuits SH_1 to SH_4 has a function of stopping the input of a potential to the terminal IP. Note that, at this time, the potential output from the terminal OP is not changed before and after the change from the high-level potential to the low-level potential at the terminal SP. In other words, the circuits SH_1 to SH_4 each serve as a sample and hold circuit.

A specific circuit configuration of the flip-flop circuit FFA will be described. The input terminal of the circuit 100A_1 is electrically connected to the D terminal of the flip-flop circuit FF. The output terminal of the circuit 100A_1 is electrically connected to the output terminal of the circuit 100_1 and the terminal IP of the circuit SH_1. The terminal OP of the circuit SH_1 is electrically connected to the input terminal of the circuit 100A_2 and the input terminal of the circuit 100A_3. The output terminal of the circuit 100A_2 is electrically connected to the terminal IP of the circuit SH_2, and the terminal OP of the circuit SH_2 is electrically connected to an input terminal of the circuit 100_1. The output terminal of the circuit 100A_3 is electrically connected to the output terminal of the circuit 100_2, the terminal IP of the circuit SH_3, and the first terminal of the transistor TrS30. The terminal OP of the circuit SH_3 is electrically connected to the input terminal of the circuit 100A_4 and the Q terminal of the flip-flop circuit FF. The output terminal of the circuit 100A_4 is electrically connected to the terminal IP of the circuit SH_4, and the terminal OP of the circuit SH_4 is electrically connected to the input terminal of the circuit 100_2.

In addition, the wiring CK is electrically connected to the terminal CT of the circuit 100A_1, the terminal CTB of the circuit 100A_2, the terminal CTB of the circuit 100A_3, and the terminal CT of the circuit 100A_4. Moreover, the wiring CKB is electrically connected to the terminal CTB of the circuit 100A_1, the terminal CT of the circuit 100A_2, the terminal CT of the circuit 100A_3, and the terminal CTB of the circuit 100A_4.

The terminals SP of the circuits SH_1 and SH_4 are electrically connected to a wiring DK. In addition, the terminals SP of the circuits SH_2 and SH_3 are electrically connected to a wiring DKB.

The wiring DK in FIG. 9A serves as a wiring for supplying a pulse voltage, for example. In particular, the pulse voltage can be, for example, a pulse voltage (clock signal) with a high-level potential and a low-level potential which are periodically repeated.

The wiring DKB illustrated in FIG. 9A serves as, for example, a wiring for supplying a potential whose logic is inverted from that of the potential supplied to the wiring DK. For example, when the high-level potential is supplied to the wiring DK, the low-level potential is supplied to the wiring DKB, and when the low-level potential is supplied to the wiring DK, the high-level potential is supplied to the wiring DKB.

Next, examples of circuit configurations of the circuits SH_1 to SH_4 are described. Note that the circuits SH_1 to SH_4 may have the same circuit configurations or different circuit configurations.

Figure 9B:
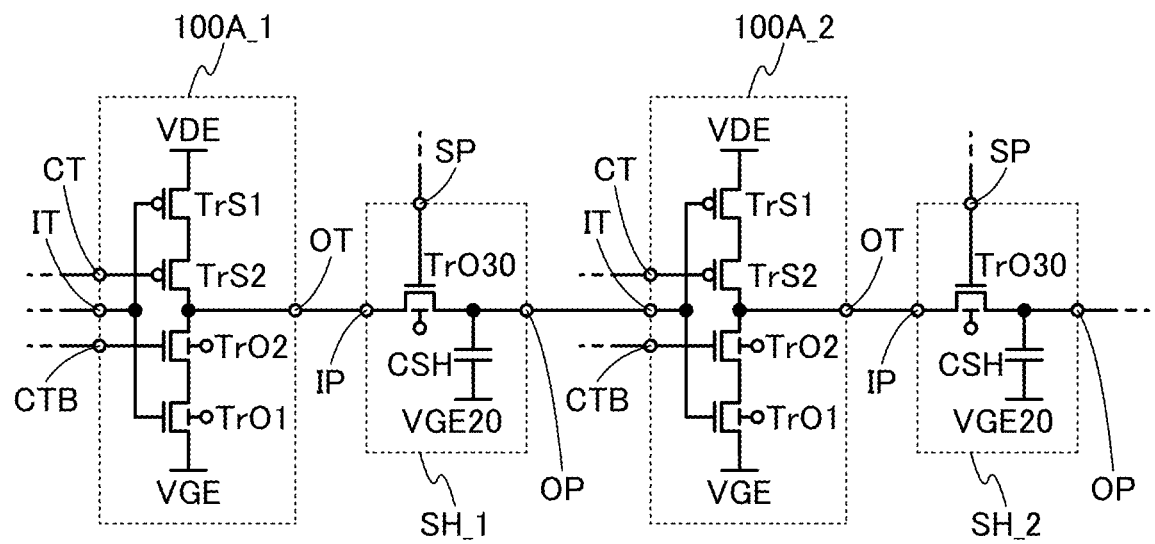

FIG. 9B illustrates configuration examples of the circuits SH_1 and SH_2 and configuration examples of the circuits 100 A_1 and 100 A_2.

The circuits 100A_1 and 100A_2 illustrated in FIG. 9B have the configuration of the circuit 100A in FIG. 3. For the circuits 100A_1 and 100A_2 illustrated in FIG. 9B, the description of the circuit 100A in FIG. 3 is referred to for.

In FIG. 9B, each of the circuits SH_1 and SH_2 includes the transistor TrO30 and a capacitor CSH.

For example, the transistor that can be used as the transistor TrO described in Configuration example 1 can be used as the transistor TrO30.

The transistor TrO30 serves as a switching element, for example. The transistor included in the flip-flop circuit FFA preferably operates in the subthreshold region; thus, a potential in the range enabling the operation in the subthreshold region is preferably input to a source and a gate of the transistor TrO30. On the other hand, in the case in which a potential in the range enabling the operation in the subthreshold region is supplied to the source and the gate of the transistor TrO30, the potential difference between the first terminal and the second terminal of the transistor TrO30 is large. To turn on the transistor TrO30 adequately, the bootstrap circuit described in Embodiment 2 can be applied, for example.

The first terminal of the transistor TrO30 is electrically connected to the terminal IP, the second terminal of the transistor TrO30 is electrically connected to a first terminal of the capacitor CSH and the terminal OP, and the gate of the transistor TrO30 is electrically connected to the terminal SP. A second terminal of the capacitor CSH is electrically connected to a wiring VGE20.

The wiring VGE20 in FIG. 9B serves as a wiring for supplying a low power supply potential (sometimes referred to as a low-level potential) to the circuits SH_1 and SH_2, for example. The low power supply potential can be, for example, a ground potential, 0 V, or a negative potential. Note that although the circuits SH_1 and SH_2 are electrically connected to the wirings VGE20 in FIG. 9B, the wiring VGE20 in the circuit SH_1 may be different from the wiring VGE20 in the circuit SH_2. At this time, potentials supplied from the wiring VGE20 in the circuit SH_1 and the wiring VGE20 in the circuit SH_2 may be equal to each other or may be different from each other.

Note that the configurations of the circuits SH_1 and SH_2 illustrated in FIG. 9B may be applied to configurations of the circuits SH_3 and SH_4. Specifically, for example, the circuits SH_1 and SH_2 illustrated in FIG. 9B may be replaced with the circuits SH_3 and SH_4, respectively. In that case, the circuits 100A_1 and 100A_2 illustrated in FIG. 9B may be replaced with the circuits 100A_3 and 100A_4, respectively.

Next, an operation example of the flip-flop circuit FF in FIG. 9A is described.

For each operation of the circuits 100 A_1 and 100 A_2, the description of Operation example 2 in Embodiment 1 can be referred to.

A case is first considered in which a high-level potential is input to the wiring CK and a high-level potential is input to the wiring DK is considered. Thus, the low-level potential is input to the wiring CKB and the low-level potential is input to the wiring DKB.

Accordingly, since the high-level potential is input to the terminal CT of the circuit 100A_1 and the low-level potential is input to the terminal CTB of the circuit 100A_1, the circuit 100A_1 outputs, to the terminal OT, a potential whose logic is inverted from the logic of the potential input to the terminal IT.

In the circuit SH_1, the high-level potential is input to the terminal SP. Thus, the transistor TrO30 operates in the subthreshold region. The potential output from the terminal OT of the circuit 100A_1 is input to the first terminal of the capacitor CSH and the terminal IT of the circuit 100A_2 through the transistor TrO30. In that case, the amount of charge corresponding to the potential output from the terminal OT of the circuit 100A_1 is accumulated in the first terminal of the capacitor CSH, and the potential is output to the terminal OP.

The low-level potential is input to the terminal CT of the circuit 100A_2 and the high-level potential is input to the terminal CTB of the circuit 100A_2, whereby the function as an inverter circuit of the circuit 100A_2 is stopped. Specifically, the potential of the terminal OT of the circuit 100A_2 is not a potential whose logic is inverted from the logic of the potential input to the terminal IT, but is a potential of the terminal OT before the low-level potential is input to the terminal CT (before the high-level potential is input to the terminal CTB) in some cases.

In the circuit SH_2, the low-level potential is input to the terminal SP, whereby the transistor TrO30 is turned off. Thus, a potential output from the terminal OT of the circuit 100A_2 is not input to the first terminal of the capacitor CSH through the transistor TrO30. Note that the circuit SH_2 outputs the potential of the first terminal of the capacitor CSH from the terminal OP.

Next, a case is considered in which the low-level potential is input to the wiring CK and the low-level potential is input to the wiring DK. At this time, the high-level potential is input to the wiring CKB and the high-level potential is input to the wiring DKB.

Accordingly, the low-level potential is input to the terminal CT of the circuit 100A_1 and the high-level potential is input to the terminal CTB of the circuit 100A_1, whereby the function as an inverter circuit of the circuit 100A_2 is stopped. Specifically, the potential of the terminal OT of the circuit 100A_1 is not a potential whose logic is inverted from the logic of the potential input to the terminal IT, but is a potential of the terminal OT before the low-level potential is input to the terminal CT (before the high-level potential is input to the terminal CTB) in some cases.

In the circuit SH_1, the low-level potential is input to the terminal SP. Thus, the transistor TrO30 is turned off. Thus, a potential output from the terminal OT of the circuit 100A_1 is not input to the first terminal of the capacitor CSH through the transistor TrO30.

The transistor TrO30 of the circuit SH_1 is turned off; thus, the potential of the terminal OT of the circuit 100A_1 before the low-level potential is input to the terminal SP is retained at the first terminal of the capacitor CSH in the circuit SH_1. Note that the circuit SH_1 outputs the potential from the terminal OP.

Furthermore, when the high-level potential is input to the terminal CT of the circuit 100A_2 and the low-level potential is input to the terminal CTB of the circuit 100A_2, the circuit 100A_2 outputs, to the terminal OT, a potential whose logic is inverted from the logic of the potential input to the terminal IT. In particular, when the potential retained at the first terminal of the capacitor CSH in the circuit SH_1 is input to the terminal IT, the circuit 100A_2 outputs a potential whose logic is inverted from the logic of the potential, from the terminal OT.

In the circuit SH_2, the high-level potential is input to the terminal SP. Thus, the transistor TrO30 operates in the subthreshold region. The potential output from the terminal OT of the circuit 100A_2 is input to the first terminal of the capacitor CSH and the input terminal of the circuit 100_1 (see FIG. 9A) through the transistor TrO30. In that case, the amount of charge corresponding to the potential output from the terminal OT of the circuit 100A_2 is accumulated in the first terminal of the capacitor CSH, and the potential is output to the terminal OP.

In the above-described operation example, the circuit SH_1 can retain, in the capacitor CSH, the potential output from the terminal OT in the circuit 100A_1, even when the function as the inverter circuit of the circuit 100A_1 is stopped, and can output the potential retained in the capacitor CSH in the circuit SH_1 to the terminal OP. Similarly, even when the function as the inverter circuit of the circuit 100A_2 is stopped, the circuit SH_2 can retain, in the capacitor CSH, the potential output from the terminal OT of the circuit 100A_2 and can output the potential retained in the capacitor CSH in the circuit SH_2 to the terminal OP.

In FIG. 9B, when the circuits SH_1 and SH_2 are not provided (corresponding to the flip-flop circuit FF in FIG. 8B), the function as the inverter circuit of either the circuit 100A_1 or the circuit 100A_2 is stopped and the terminal OT of the circuit is temporarily floating, whereby the potential of the terminal OT may be changed with time. Thus, the potential input to the input terminal of the logic circuit (the circuit 100A_2 or the circuit 100_1) electrically connected to the terminal OT is changed, so that the potential output from the output terminal of the logic circuit may also be changed. Thus, as illustrated in FIG. 9A and FIG. 9B, a potential output from the circuit 100 A_1 can be stably input to the circuit 100A_2 by providing the circuit SH_1 in the flip-flop circuit. In addition, by providing the circuit SH_2 in the flip-flop circuit, the potential output from the circuit 100 A_2 can be stably input to the circuit 100_1.

The circuit configurations of the circuits SH_1 and SH_2 in FIG. 9B may be changed depending on circumstances. For example, the circuits SH_1 and SH_2 in FIG. 9B may have a circuit configuration illustrated in FIG. 10.

Figure 10:
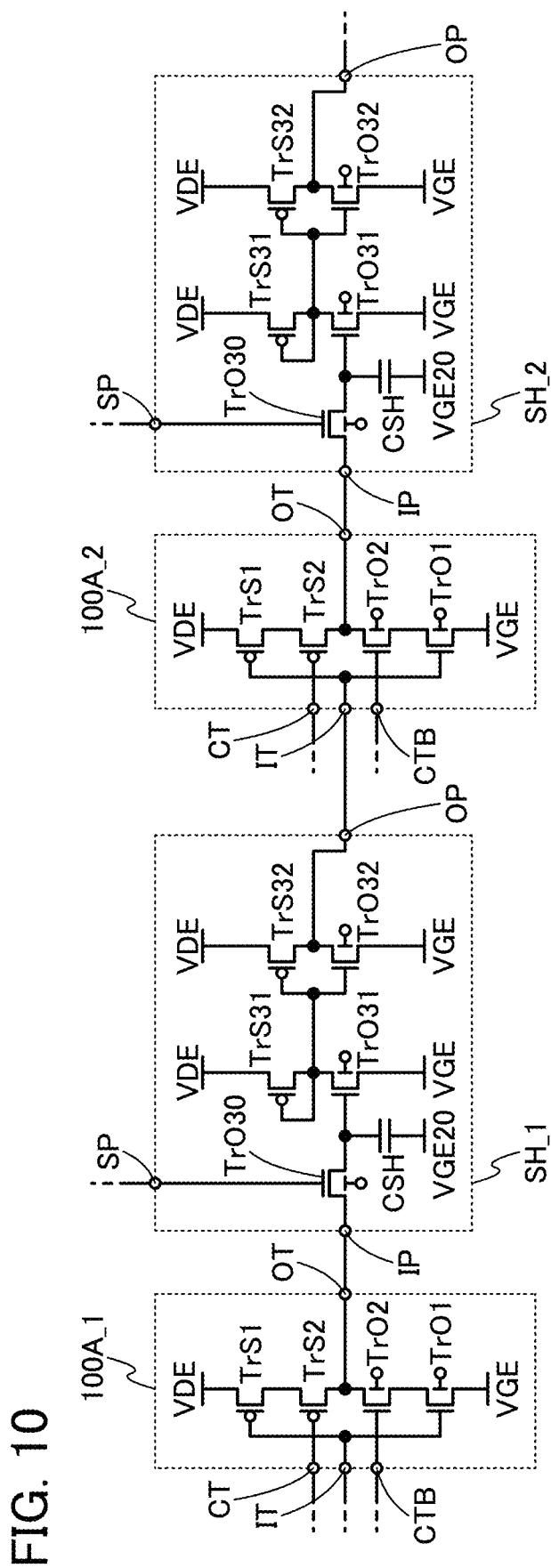
FIG. 10 is a circuit diagram illustrating a configuration example of a circuit included in a semiconductor device.

The circuit SH_1 in FIG. 10 is different from the circuit SH_1 in FIG. 9B in that transistors TrS31 and TrS32 and transistors TrO31 and TrO32 are included. Similarly, the circuit SH_2 in FIG. 10 is different from the circuit SH_2 in FIG. 9B in that the transistors TrS31 and TrS32 and the transistors TrO31 and TrO32 are included.

In each of the circuits SH_1 and SH_2 in FIG. 10, the first terminal of the transistor TrO30 is electrically connected to the terminal IP, the second terminal of the transistor TrO30 is electrically connected to the first terminal of the capacitor CSH and a gate of the transistor TrO31, and the gate of the transistor TrO30 is electrically connected to the terminal SP. The second terminal of the capacitor CSH is electrically connected to the wiring VGE20.

A first terminal of the transistor TrS31 is electrically connected to the wiring VDE, and a second terminal of the transistor TrS31 is electrically connected to a gate of the transistor TrS31, a first terminal of the transistor TrO31, a gate of the transistor TrS32, and a gate of the transistor TrO32. A second terminal of the transistor TrO31 is electrically connected to the wiring VGE. A first terminal of the transistor TrS32 is electrically connected to the wiring VDE, and a second terminal of the transistor TrS32 is electrically connected to a first terminal of the transistor TrO32 and the terminal OP. A second terminal of the transistor TrO32 is electrically connected to the wiring VGE.

The wiring VDE included in each of the circuits SH_1 and SH_2 in FIG. 10 serves as a wiring for supplying a high power supply potential (sometimes referred to as a high-level potential) to the circuits SH_1 and SH_2, for example. Note that in FIG. 10, the wiring VDE included in the circuit SH_1 or SH_2 and the wiring VDE included in the circuit 100A_1 or 100A_2 may be different from each other. The potentials supplied from the wirings VDE in the circuits SH_1, SH_2, 100A_1, and 100A_2 are preferably equal to each other.

The wiring VGE included in each of the circuits SH_1 and SH_2 in FIG. 10 serves as a wiring for supplying a low power supply potential (sometimes referred to as a low-level potential) to the circuits SH_1 and SH_2, for example. The low power supply potential can be, for example, a ground potential, 0 V, or a negative potential. Note that in FIG. 10, the wiring VGE included in the circuit SH_1 or SH_2 and the wiring VGE included in the circuit 100A_1 or 100A_2 may be different from each other. The potentials supplied from the wirings VGE in the circuits SH_1, SH_2, 100A_1, and 100A_2 are preferably equal to each other.

In the circuits SH_1 and SH_2 in FIG. 10, an inverter circuit is configured with the transistors TrS31 and TrO31. In the inverter circuit configured with the transistors TrS31 and TrO31, the transistor TrO31 is turned on when the high-level potential is input to the transistor TrO31, and the low-level potential is supplied to each of the first terminal of the transistor TrO31, the gate of the transistor TrS32, and the gate of the transistor TrO32 from the wiring VGE, for example. At this time, the low-level potential is input to the gate of the transistor TrS31 to turn on the transistor TrS31, and transistor TrS31 serves as a resistor with a potential difference between the high-level potential and the low-level potential applied between the first terminal and the second terminal.

In the inverter circuit configured with the transistor TrS31 and the transistor TrO31, the transistor TrO31 is turned off when the low-level potential is input to the transistor TrO31, and the high-level potential is supplied to each of the first terminal of the transistor TrO31, the gate of the transistor TrS32, and the gate of the transistor TrO32 from the wiring VDE, for example.

In the circuits SH_1 and SH_2 in FIG. 10, an inverter circuit is configured with the transistor TrS32 and the transistor TrO32. For the configuration of the inverter circuit, the description of Configuration example 1 and Operation example 1 in Embodiment 1 is referred to.

As described above, each of the circuits SH_1 and SH_2 in FIG. 10 can be said to include two inverter circuits that are connected in series. In other words, each of the circuits SH_1 and SH_2 in FIG. 10 has a configuration in which a potential substantially equal to the potential of the first terminal of the capacitor CSH is output to the terminal OP.

In each of the circuits SH_1 and SH_2 in FIG. 10, when the transistors TrS31 and TrS32 and the transistors TrO31 and TrO32 are not provided (the circuit configuration in FIG. 9B), the first terminal of the capacitor CSH is directly and electrically connected to the gate of the transistor TrS1 included in the circuits 100A_2 and 100_1. When the transistor TrS1 is a Si transistor, leakage current sometimes flows between the gate and the source or between the gate and the drain of the Si transistor; thus, the potential retained at the first terminal of the capacitor CSH may vary depending on the leakage current in some cases. Thus, as illustrated in FIG. 10, the two inverter circuits that are connected in series are provided in each of the circuits SH_1 and SH_2, whereby the potential retained at the first terminal of the capacitor CSH can be prevented from varying due to the leakage current between the gate and the source or between the gate and the drain of the transistor TrS1.

Figure 11:
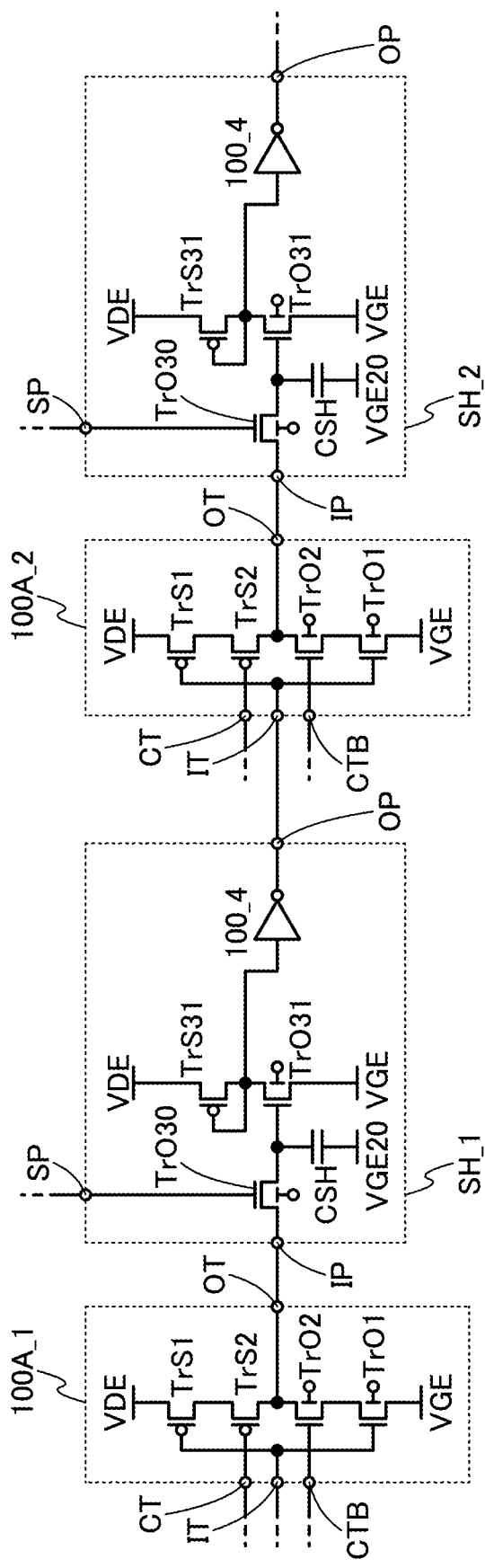
FIG. 11 is a circuit diagram illustrating a configuration example of a circuit included in a semiconductor device.

The configurations of the circuits SH_1 and SH_2 in FIG. 10 can have the circuit configuration illustrated in FIG. 11. The circuits SH_1 and SH_2 in FIG. 11 have a configuration structure in which the transistor TrS32 and the transistor TrO32 included in each of the circuits SH_1 and SH_2 in FIG. 10 are replaced with a circuit 100_4 serving as an inverter circuit. Note that the circuit 100, the circuit 100A, or the like described in Embodiment 1 can be used as the circuit 100_4, for example.

Note that this embodiment can be combined with any of the other embodiments in this specification as appropriate.

Embodiment 4

This embodiment will describe structure examples of the semiconductor device described in any of the above embodiments and structure examples of a transistor that can be applied to the semiconductor device described in any of the above embodiments.

<Structure Example of Semiconductor Device>

Figure 12:
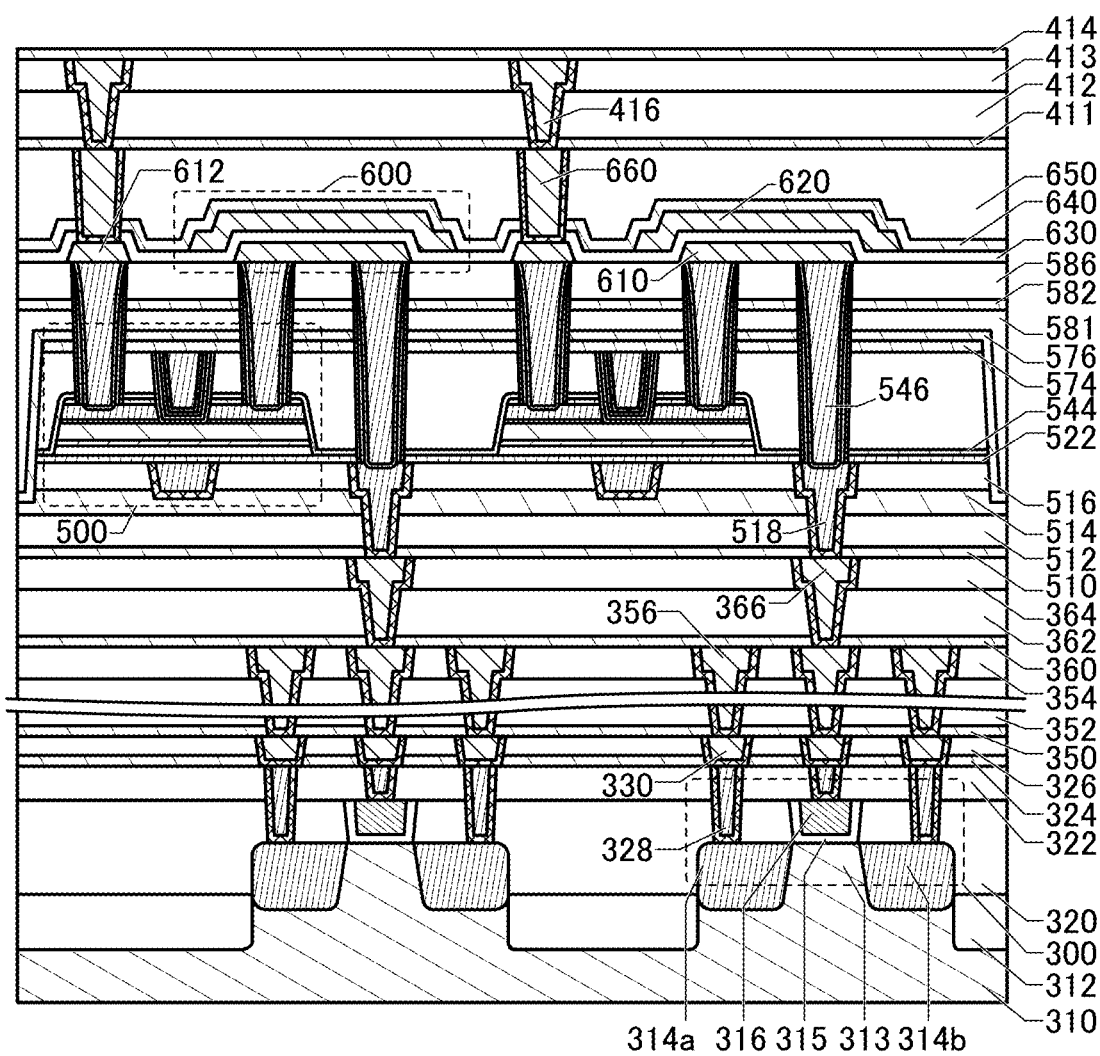
FIG. 12 is a schematic cross-sectional view of a structure example of a semiconductor device.
Figure 13A:
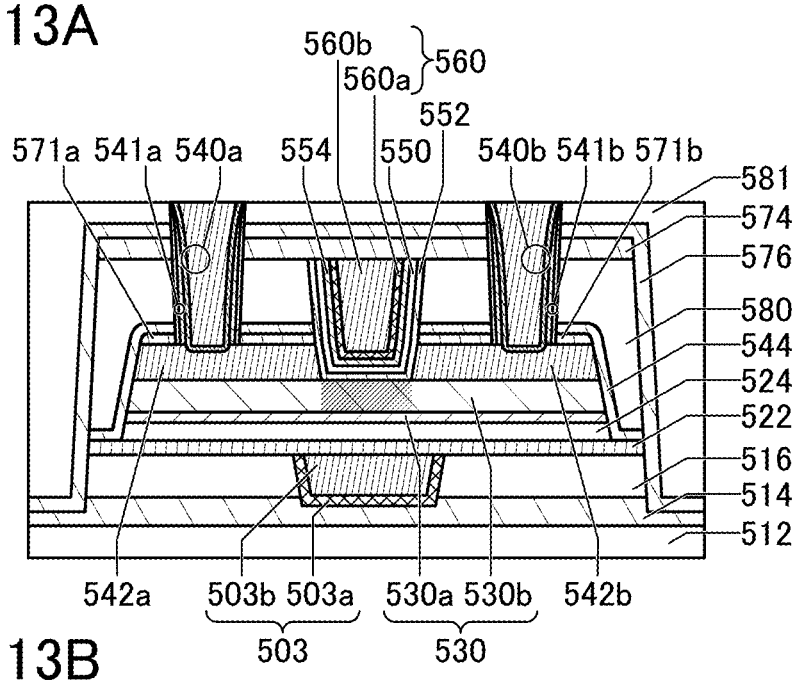
FIGS. 13A to 13C are schematic cross-sectional views illustrating a structure example of a transistor.
Figure 13B:
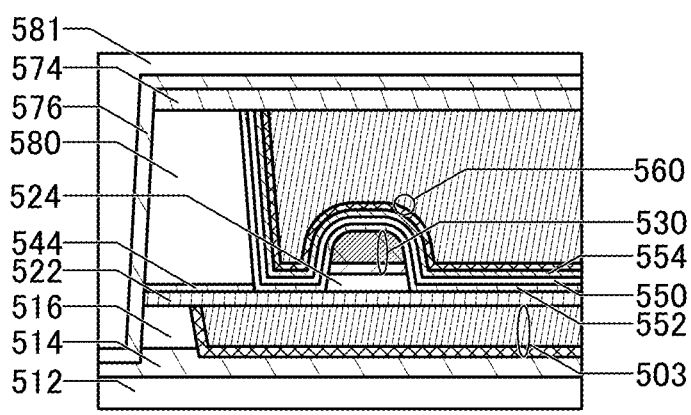
Figure 13C:
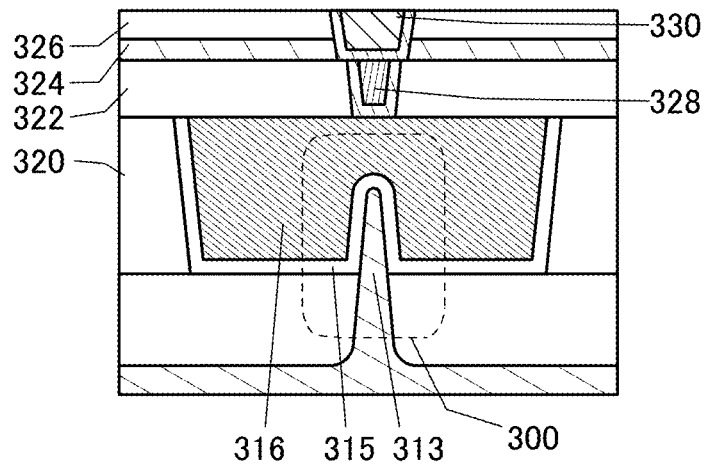

FIG. 12 illustrates a semiconductor device including a memory cell having a capacitor, and the semiconductor device includes transistors 300 and 500, and a capacitor 600. FIG. 13A is a cross-sectional view of the transistor 500 in the channel length direction, FIG. 13B is a cross-sectional view of the transistor 500 in the channel width direction, and FIG. 13C is a cross-sectional view of the transistor 300 in the channel width direction.

The transistor 500 is a transistor including a metal oxide in its channel formation region (an OS transistor). The transistor 500 has features that the off-state current is low and that the field-effect mobility hardly changes even at high temperatures. The transistor 500 can be used, for example, as the transistor TrO or the transistors TRO1 to TrO8 described in the above embodiments, whereby a semiconductor device whose operation capability hardly decreases even at high temperatures can be realized. In particular, due to the feature of a small off-state current, the transistor 500 can be used as the transistor TrO or the transistors TRO1 to TrO8, whereby electric power can be prevented from being consumed due to an off-leakage current.

For example, the transistor 500 is provided above the transistor 300, and the capacitor 600 is provided above the transistor 300 and the transistor 500. Note that the capacitor 600 can be a capacitor that retains a potential corresponding to the data written to the memory cell, for example. Note that depending on a circuit configuration, the capacitor 600 illustrated in FIG. 12 is not necessarily provided.

The transistor 300 is provided over the substrate 310 and includes an element isolation layer 312, a conductor 316, an insulator 315, a semiconductor region 313 that is part of the substrate 310, and low-resistance regions 314a and 314b serving as source and drain regions. Note that the transistor 300 can be used as transistors such as the transistors TrS, and TrS1 to TrS6 described in the above embodiments, for example. Note that FIG. 12 illustrates a structure in which a gate of the transistor 300 is electrically connected to one of a source and a drain of the transistor 500 through a pair of electrodes of the capacitor 600; however, depending on the configuration of the semiconductor device of one embodiment of the present invention, one of a source and a drain of the transistor 300 can be configured to be electrically connected to one of the source and the drain of the transistor 500, one of the source and the drain of the transistor 300 can be configured to be electrically connected to a gate of the transistor 500, the transistor 300 can be configured to have no electrical connection to each terminal of the transistor 500 and each terminal of the capacitor 600. The capacitor 600 is not necessarily provided in the structure of FIG. 12.

A semiconductor substrate (e.g., a single crystal substrate or a silicon substrate) is preferably used as the substrate 310.

In the transistor 300, the top surface and the side surface in the channel width direction of the semiconductor region 313 are covered with the conductor 316 with the insulator 315 therebetween, as illustrated in FIG. 13C. Such a Fin-type transistor 300 can have an increased effective channel width, and thus have improved on-state characteristics. In addition, contribution of the electric field of the gate electrode can be increased, so that the off-state characteristics of the transistor 300 can be improved.

Note that the transistor 300 can be a p-channel transistor or an n-channel transistor.

A region of the semiconductor region 313 where a channel is formed, a region in the vicinity thereof, the low-resistance regions 314a and 314b serving as the source and drain regions, and the like preferably include a silicon-based semiconductor, further preferably include single crystal silicon. Alternatively, the above regions may each be formed using a material including germanium (Ge), silicon germanium (SiGe), gallium arsenide (GaAs), aluminum gallium arsenide (GaAlAs), or gallium nitride (GaN). Moreover, the above regions may each be formed using silicon whose effective mass is adjusted by applying stress to the crystal lattice and changing the lattice spacing. Alternatively, the transistor 300 may be a high-electron-mobility transistor (HEMT) including gallium arsenide and aluminum gallium arsenide, for example.

The low-resistance regions 314a and 314b include an element that imparts n-type conductivity, such as arsenic or phosphorus, or an element that imparts p-type conductivity, such as boron, in addition to a semiconductor material used for the semiconductor region 313.

The conductor 316 serving as the gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that a material used for the conductor determines the work function; thus, selecting the material used for the conductor can adjust the threshold voltage of a transistor. Specifically, one or both of titanium nitride and tantalum nitride is/are preferably used for the conductor. Furthermore, in order to ensure the conductivity and embeddability of the conductor, a stacked layer of one or both of tungsten and aluminum is preferably used for the conductor. In particular, tungsten is preferable in terms of heat resistance.

The element isolation layer 312 is provided to separate a plurality of transistors on the substrate 310 from each other. The element isolation layer can be formed by a local oxidation of silicon (LOCOS) method, a shallow trench isolation (STI) method, a mesa isolation method, or the like.

Figure 14:
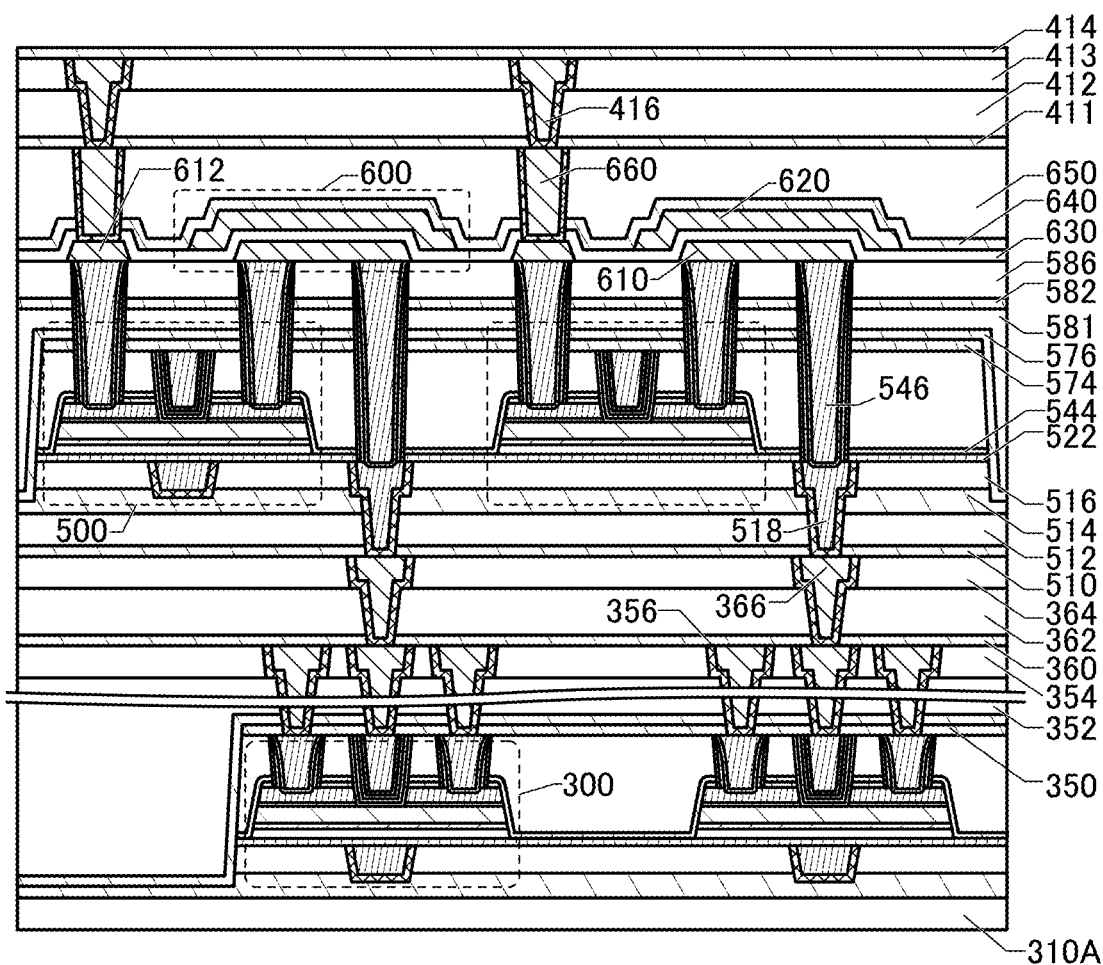
FIG. 14 is a schematic cross-sectional view of a structure example of a semiconductor device.

Note that the transistor 300 illustrated in FIG. 12 is only an example and a transistor appropriate for a circuit configuration, a driving method, or the like can be used, without being limited to the structure illustrated in FIG. 12. For example, the transistor 300 may have a planar structure instead of a Fin-type structure illustrated in FIG. 13C. For example, when a semiconductor device includes a single-polarity circuit with only OS transistors, the transistor 300 has a structure similar to that of the transistor 500 including an oxide semiconductor, as illustrated in FIG. 14. Note that the details of the transistor 500 will be described later. In this specification and the like, the term "single-polarity circuit" refers to a circuit in which all transistors are only either n-channel transistors or p-channel transistors.

Note that in FIG. 14, the transistor 300 is provided over the substrate 310A; in this case, a semiconductor substrate may be used as the substrate 310A, like the substrate 310 in the semiconductor device in FIG. 12. Examples of materials used as the substrate 310A include an SOI substrate, a glass substrate, a quartz substrate, a plastic substrate, a sapphire glass substrate, a metal substrate, a stainless steel substrate, a substrate containing stainless steel foil, a tungsten substrate, a substrate containing tungsten foil, a flexible substrate, an attachment film, paper containing a fibrous material, and a base film. Examples of the glass substrate include a barium borosilicate glass substrate, an aluminoborosilicate glass substrate, and a soda lime glass substrate. Examples of materials for the flexible substrate, the attachment film, the base film, or the like include plastic typified by polyethylene terephthalate (PET), polyethylene naphthalate (PEN), polyethersulfone (PES), and polytetrafluoroethylene (PTFE). Another example is a synthetic resin such as an acrylic resin. Other examples are polypropylene, polyester, polyvinyl fluoride, and polyvinyl chloride. Other examples are polyamide, polyimide, aramid, an epoxy resin, an inorganic vapor-deposited film, and paper.

Over the transistor 300 illustrated in FIG. 12, an insulator 320, an insulator 322, an insulator 324, and an insulator 326 are stacked in this order from the substrate 310 side.

For the insulators 320, 322, 324, and 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has an oxygen content higher than a nitrogen content, and silicon nitride oxide refers to a material that has a nitrogen content higher than an oxygen content. Moreover, in this specification, aluminum oxynitride refers to a material that has an oxygen content higher than a nitrogen content, and aluminum nitride oxide refers to a material that has a nitrogen content higher than an oxygen content.

The insulator 322 may function as a planarization film for alleviating a level difference caused by the transistor 300 or the like covered with the insulators 320 and 322. For example, a top surface of the insulator 322 may be planarized by planarization treatment using a chemical mechanical polishing (CMP) method or the like to increase the level of planarity.

The insulator 324 is preferably formed using a film having a barrier property that prevents impurities such as hydrogen from the substrate 310, the transistor 300, or the like from diffusing to a region where the transistor 500 is provided.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. Specifically, the film that inhibits hydrogen diffusion is a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. For example, the dielectric constant of the insulator 326 is preferably 0.7 times or less that of the insulator 324, further preferably 0.6 times or less that of the insulator 324. When a material with a low dielectric constant is used for an interlayer film, the parasitic capacitance generated between wirings can be reduced.

Conductor 328 and 330 that are connected to the capacitor 600 or the transistor 500 are provided in the insulators 320, 322, 324, and 326. Note that each of the conductors 328 and 330 serves as a plug or a wiring. A plurality of conductors serving as plugs or wirings are collectively denoted by the same reference numeral in some cases. In this specification and the like, a wiring and a plug connected to the wiring may be a single component. That is, in some cases, part of a conductor serves as a wiring or part of a conductor serves as a plug.

As a material for each of plugs and wirings (e.g., the conductors 328 and 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 12, insulators 350, 352, and 354 are sequentially stacked above the insulator 326 and the conductor 330. Furthermore, the conductor 356 is formed in the insulators 350, 352, and 354. The conductor 356 serves as a plug or a wiring that is connected to the transistor 300. Note that the conductor 356 can be formed using a material similar to those of the conductors 328 and 330.

Note that for example, the insulator 350 is preferably formed using an insulator having a barrier property against impurities such as hydrogen and water, like the insulator 324. The insulators 352 and 354 are preferably formed using an insulator having a relatively low dielectric constant to reduce the parasitic capacitance generated between wirings, like the insulator 326. Furthermore, the conductor 356 preferably includes a conductor having a barrier property against impurities such as hydrogen and water. In particular, the conductor having a barrier property against hydrogen is formed in an opening portion of the insulator 350 having a barrier property against hydrogen. With this structure, the transistor 300 and the transistor 500 can be separated by a barrier layer, so that the diffusion of hydrogen from the transistor 300 to the transistor 500 can be inhibited.

Note that as the conductor having a barrier property against hydrogen, for example, tantalum nitride is preferably used. A stacked structure of tantalum nitride and tungsten having high conductivity can inhibit hydrogen diffusion from the transistor 300 while the conductivity of a wiring is ensured. In this case, a tantalum nitride layer having a barrier property against hydrogen is preferably in contact with the insulator 350 having a barrier property against hydrogen.

An insulator 360, an insulator 362, and an insulator 364 are sequentially stacked over the insulator 354 and the conductor 356.

The insulator 360 is preferably formed using an insulator having a barrier property against impurities such as water and hydrogen, like the insulator 324. Thus, the insulator 360 can be formed using any of the materials usable for the insulator 324 and the like, for example.

The insulators 362 and 364 have functions of an interlayer insulating film and a planarization film. The insulators 362 and 364 are preferably formed using an insulator having a barrier property against impurities such as water and hydrogen, like the insulator 324. Thus, one or both of the insulator 362 and the insulator 364 can be formed using any of the materials usable for the insulator 324.

An opening portion is provided in regions of the insulators 360, 362, and 364 that overlap with part of the conductor 356 and the conductor 366 is embedded to fill the opening portion. The conductor 366 is also formed over the insulator 362. The conductor 366 serves as a plug or a wiring that is connected to the transistor 300, for example. Note that the conductor 366 can be formed using a material similar to those of the conductors 328 and 330.

An insulator 510, an insulator 512, an insulator 514, and an insulator 516 are stacked in this order over the insulator 364 and the conductor 366. A material with a barrier property against oxygen and hydrogen is preferably used for any of the insulators 510, 512, 514, and 516.

For example, the insulators 510 and 514 are each preferably formed using a film having a barrier property that prevents impurities such as hydrogen from the substrate 310, a region where the transistor 300 is provided, or the like from diffusing to a region where the transistor 500 is provided. Therefore, the insulators 510 and 514 can each be formed using a material similar to that for the insulator 324.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. Specifically, the film that inhibits hydrogen diffusion is a film from which a small amount of hydrogen is released.

For the film having a barrier property against hydrogen used for the insulators 510 and 514, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide contained in the transistor 500 can be prevented. Therefore, aluminum oxide is suitably used for a protective film of the transistor 500.

The insulators 512 and 516 can each be formed using a material similar to that for the insulator 320, for example. In the case in which a material with a relatively low dielectric constant is used for each of these insulators, the parasitic capacitance between wirings can be reduced. A silicon oxide film or a silicon oxynitride film can be used as the insulators 512 and 516, for example.

A conductor 518, a conductor included in the transistor 500 (e.g., a conductor 503 illustrated in FIGS. 13A and 13B), and the like are embedded in the insulators 510, 512, 514, and 516. Note that the conductor 518 serves as a plug or a wiring that is connected to the capacitor 600 or the transistor 300. The conductor 518 can be formed using a material similar to that used for forming the conductors 328 and 330.

In particular, part of the conductor 518 that is in contact with the insulators 510 and 514 is preferably a conductor having a barrier property against oxygen, hydrogen, and water. With this structure, the transistor 300 and the transistor 500 can be separated by a layer having a barrier property against oxygen, hydrogen, and water. As a result, the diffusion of hydrogen from the transistor 300 to the transistor 500 can be prevented.

The transistor 500 is provided over the insulator 516.

As illustrated in FIGS. 13A and 13B, the transistor 500 includes the insulator 516 over the insulator 514; a conductor 503 (conductors 503a and 503b) embedded in the insulator 514 or the insulator 516; an insulator 522 over the insulator 516 and the conductor 503; an insulator 524 over the insulator 522; an oxide 530a over the insulator 524; an oxide 530b over the oxide 530a; a conductor 542a over the oxide 530b; an insulator 571a over the conductor 542a; a conductor 542b over the oxide 530b; an insulator 571b over the conductor 542b; an insulator 552 over the oxide 530b; an insulator 550 over the insulator 552; an insulator 554 over the insulator 550; a conductor 560 (conductors 560a and 560b) positioned over the insulator 554 and overlapping with part of the oxide 530b; and an insulator 544 positioned over the insulator 522, the insulator 524, the oxide 530a, the oxide 530b, the conductor 542a, the conductor 542b, the insulator 571a, and the insulator 571b. Here, as illustrated in FIGS. 13A and 13B, the insulator 552 is in contact with a top surface of the insulator 522, a side surface of the insulator 524, a side surface of the oxide 530a, a side surface and a top surface of the oxide 530b, a side surface of the conductor 542 (conductors 542a and 542b), a side surface of the insulator 571 (insulators 571a and 571b), a side surface of the insulator 544, a side surface of an insulator 580, and a bottom surface of the insulator 550. A top surface of the conductor 560 is positioned to be substantially level with an upper portion of the insulator 554, an upper portion of the insulator 550, an upper portion of the insulator 552, and a top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580.

An opening that reaches the oxide 530b is provided in the insulators 580 and 544. The insulators 552, 550, and 554, and the conductor 560 are positioned in the opening. In the channel length direction of the transistor 500, the conductor 560 and the insulators 552, 550, and 554 are provided between the insulator 571a and the insulator 571b and between the conductor 542a and conductor 542b. The insulator 554 includes a region in contact with a side surface of the conductor 560 and a region in contact with a bottom surface of the conductor 560.

The oxide 530 preferably includes the oxide 530a placed over the insulator 524 and the oxide 530b placed over the oxide 530a. Including the oxide 530a under the oxide 530b makes it possible to inhibit diffusion of impurities into the oxide 530b from the components formed below the oxide 530a.

Although the oxide 530 has a two-layer structure of the oxide 530a and the oxide 530b in the transistor 500, the present invention is not limited thereto. For example, the transistor 500 can include a single-layer structure of the oxide 530b or a stacked-layer structure of three or more layers. Alternatively, the oxide 530a and the oxide 530b can each have a stacked-layer structure.

The conductor 560 functions as a first gate (also referred to as a top gate) electrode and the conductor 503 functions as a second gate (also referred to as a back gate) electrode. The insulators 552, 550, and 554 function as a first gate insulator, and the insulators 522 and 524 function as a second gate insulator. Note that a gate insulator is sometimes referred to as a gate insulating layer or a gate insulating film. The conductor 542a functions as one of a source and a drain, and the conductor 542b functions as the other of the source and the drain. At least part of a region of the oxide 530 overlapping with the conductor 560 functions as a channel formation region.

Figure 15A:
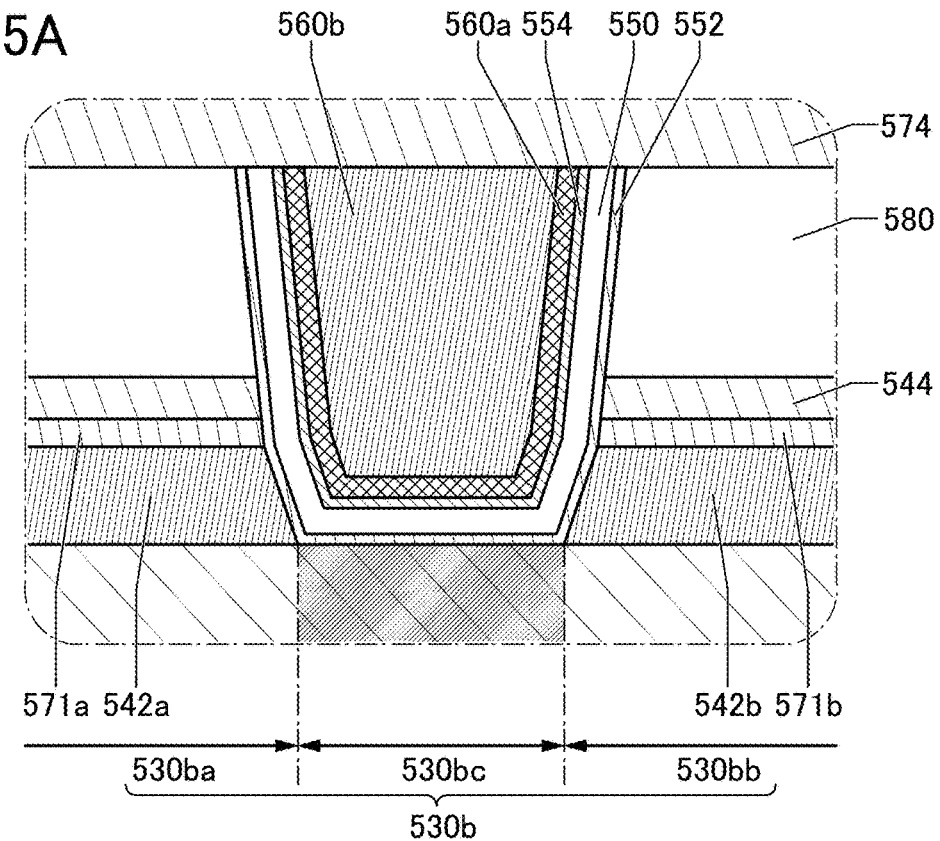
FIGS. 15A and 15B are schematic cross-sectional views illustrating a structure example of a transistor.

FIG. 15A is an enlarged view of the vicinity of the channel formation region in FIG. 13A. Supply of oxygen to the oxide 530b forms the channel formation region in a region between the conductor 542a and the conductor 542b. Therefore, as illustrated in FIG. 15A, the oxide 530b includes a region 530bc functioning as the channel formation region of the transistor 500 and regions 530ba and 530bb that are provided to sandwich the region 530bc and function as a source region and a drain region. At least part of the region 530bc overlaps with the conductor 560. In other words, the region 530bc is provided in the region between the conductor 542a and the conductor 542b. The region 530ba is provided to overlap with the conductor 542a, and the region 530bb is provided to overlap with the conductor 542b.

The region 530bc functioning as the channel formation region contains fewer oxygen vacancies (an oxygen vacancy in a metal oxide is sometimes referred to as $V_O$ in this specification and the like) or a lower impurity concentration than the regions 530ba and 530bb to have higher resistance and a lower carrier concentration. Thus, the region 530bc can be regarded as an i-type (intrinsic) or substantially i-type region.

As for a transistor using a metal oxide, when impurities or oxygen vacancies ($V_O$) are in a channel formation region of the metal oxide, electrical characteristics of the transistor easily vary and the reliability thereof may worsen. In some cases, hydrogen in the vicinity of an oxygen vacancy ($V_O$) forms a defect that is an oxygen vacancy ($V_O$) into which hydrogen enters (hereinafter sometimes referred to as $V_OH$), which generates an electron serving as a carrier. Therefore, when the channel formation region in the metal oxide includes oxygen vacancies, the transistor tends to be normally-on (a channel is generated even when no voltage is applied to a gate electrode and a current flows through the transistor). Therefore, the impurities, oxygen vacancies, and $V_OH$ are preferably reduced as much as possible in the channel formation region of the metal oxide.

The regions 530ba and 530bb functioning as the source region and the drain region are each a low-resistance region with an increased carrier concentration because it includes many oxygen vacancies ($V_O$) or has a high concentration of an impurity such as hydrogen, nitrogen, or a metal element. In other words, the region 530ba and the region 530bb are each an n-type region having a higher carrier concentration and a lower resistance than the region 530bc.

The carrier concentration in the region 530bc functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration in the region 530bc functioning as the channel formation region is not particularly limited and can be, for example, $1 \times 10^{-9}$ cm$^{-3}$.

Between the region 530bc and the region 530ba or 530bb may be formed a region having a carrier concentration that is lower than or substantially equal to the carrier concentrations in the region 530ba and the region 530bb and that is higher than or substantially equal to the carrier concentration in the region 530bc. That is, the region functions as a junction region between the region 530bc and the region 530ba or 530bb. The hydrogen concentration in the junction region is lower than or substantially equal to the hydrogen concentrations in the regions 530ba and 530bb and higher than or substantially equal to the hydrogen concentration in the region 530bc in some cases. The number of oxygen vacancies in the junction region is smaller than or substantially equal to the numbers of oxygen vacancies in the regions 530ba and 530bb and larger than or substantially equal to the number of oxygen vacancies in the region 530bc in some cases.

Note that FIG. 15A illustrates an example in which the regions 530ba, 530bb, and 530bc are formed in the oxide 530b; however, the present invention is not limited to this. For example, the above regions may be formed not only in the oxide 530b but also in the oxide 530a.

In the oxide 530, the boundaries between the regions are difficult to detect clearly in some cases. The concentrations of a metal element and impurity elements such as hydrogen and nitrogen, which are detected in each region, may be not only gradually changed between the regions, but also continuously changed in each region. That is, the region closer to the channel formation region preferably has lower concentrations of a metal element and impurity elements such as hydrogen and nitrogen.

In the transistor 500, the oxide 530 (the oxides 530a and 530b) which includes the channel formation region preferably contains a metal oxide functioning as a semiconductor (hereinafter also referred to as oxide semiconductor).

The metal oxide functioning as a semiconductor preferably has a band gap greater than or equal to 2 eV, further preferably greater than or equal to 2.5 eV. The use of such a metal oxide having a wide band gap can reduce the off-state current of the transistor.

For example, as the oxide 530, a metal oxide such as an In-M-Zn oxide containing indium, the element M, and zinc is preferably used; the element M is one or more selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like. Alternatively, In—Ga oxide, In—Zn oxide, or indium oxide may be used as the oxide 530.

Here, the atomic ratio of In to the element M in the metal oxide used as the oxide 530b is preferably higher than that in the metal oxide used as the oxide 530a.

When the oxide 530a is provided under the oxide 530b in the above manner, impurities and oxygen can be inhibited from diffusing into the oxide 530b from the components formed below the oxide 530a.

The density of defect states at the interface between the oxide 530a and the oxide 530b can be made low when the oxides 530a and 530b contain the same element (as a main component) in addition to oxygen. Since the density of defect states at the interface between the oxide 530a and the oxide 530b can be decreased, the influence of interface scattering on carrier conduction is small, and a high on-state current can be obtained.

The oxide 530b preferably exhibits crystallinity. In particular, as the oxide 530b,a,c-axis-aligned crystalline oxide semiconductor (CAAC-OS) is preferably used.

The CAAC-OS is a metal oxide having a dense structure with high crystallinity and few impurities and defects (e.g., oxygen vacancies such as $V_O$). In particular, after the formation of a metal oxide, heat treatment is performed at a temperature at which the metal oxide does not become a polycrystal (e.g., 400° C. to 600° C.), whereby a CAAC-OS having a dense structure with higher crystallinity can be obtained. As the density of the CAAC-OS is increased in this manner, diffusion of impurities or oxygen in the CAAC-OS can be further reduced.

By contrast, in the CAAC-OS, a reduction in electron mobility due to a crystal grain boundary is less likely to occur because it is difficult to observe a clear crystal grain boundary. Thus, a metal oxide including the CAAC-OS is physically stable. Accordingly, the metal oxide including the CAAC-OS is resistant to heat and has high reliability.

As for a transistor using an oxide semiconductor, when impurities and oxygen vacancies are in a channel formation region of the oxide semiconductor, electrical characteristics of the transistor using the oxide semiconductor easily vary and the reliability thereof may worsen. In some cases, hydrogen in the vicinity of an oxygen vacancy forms a defect that is an oxygen vacancy into which hydrogen enters (hereinafter sometimes referred to as $V_OH$), which generates an electron serving as a carrier. Therefore, when the channel formation region in the oxide semiconductor includes oxygen vacancies, the transistor tends to have normally-on characteristics (a channel is generated even when no voltage is applied to a gate electrode and a current flows through the transistor). Therefore, the impurities, oxygen vacancies, and $V_OH$ are preferably reduced as much as possible in the channel formation region of the oxide semiconductor. In other words, the oxide semiconductor preferably includes an i-type (intrinsic) or substantially i-type channel formation region with a low carrier concentration.

By contrast, when an insulator containing oxygen that is released by heating (hereinafter, also referred to as excess oxygen) is provided in the vicinity of the oxide semiconductor and heat treatment is performed, oxygen can be supplied from the insulator to the oxide semiconductor so as to reduce oxygen vacancies and $V_OH$. Note that too much oxygen supplied to the source region or the drain region might decrease the on-state current or the field-effect mobility of the transistor 500. Furthermore, a variation in the amount of oxygen supplied to the source region or the drain region in the substrate plane leads to variable characteristics of the semiconductor device including the transistor.

Hence, the region 530bc functioning as the channel formation region in the oxide semiconductor is preferably an i-type or substantially i-type region with a low carrier concentration, whereas the regions 530ba and 530bb functioning as the source region and the drain region are preferably n-type regions with a high carrier concentration. That is, it is preferable that in the oxide semiconductor, oxygen vacancies and $V_OH$ in the region 530bc be reduced and supply of too much oxygen to the regions 530ba and 530bb be prevented.

Thus, in this embodiment, microwave treatment is performed in an atmosphere containing oxygen in a state where the conductors 542a and 542b are provided over the oxide 530b so that oxygen vacancies and $V_OH$ in the region 530bc are reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 530bc can be irradiated with the high-frequency wave such as the microwave or RF. The effect of the plasma, the microwave, and the like enables $V_OH$ in the region 530bc to be cut off, hydrogen (H) to be removed from the region 530bc, and oxygen vacancies $V_O$ to be filled with oxygen. That is, the reaction "$V_OH \rightarrow H+V_O$" occurs in the region 530bc, so that the hydrogen concentration in the region 530bc can be reduced. As a result, oxygen vacancies and $V_OH$ in the region 530bc can be reduced to lower the carrier concentration.

In the microwave treatment in an oxygen-containing atmosphere, the effect of the microwave, the high-frequency wave such as RF, the oxygen plasma, and the like is blocked by the conductors 542a and 542b and does not reach the regions 530ba and 530bb. Furthermore, the effect of the oxygen plasma can be reduced by the insulators 571 and 580 which are provided to cover the oxide 530b and the conductor 542. Hence, a reduction in $V_OH$ and supply of too much oxygen do not occur in the regions 530ba and 530bb during the microwave treatment, preventing a decrease in carrier concentration.

After formation of an insulating film to be the insulator 552 or an insulating film to be the insulator 550, microwave treatment is preferably performed in an oxygen-containing atmosphere. When such microwave treatment in an oxygen-containing atmosphere is performed with the insulator 552 or the insulator 550 being provided, oxygen can be efficiently injected into the region 530bc. The insulator 552 that is provided in contact with a side surface of the conductor 542 and a surface of the region 530bc can inhibit excessive oxygen injection into the region 530bc and resultantly inhibit oxidation of the side surface of the conductor 542. It is also possible to inhibit oxidation of the side surface of the conductor 542 during formation of the insulating film to be the insulator 550.

Oxygen injected into the region 530bc can be in any of various forms such as an oxygen atom, an oxygen molecule, or an oxygen radical (also referred to as O radical which is an atom, a molecule, or an ion having an unpaired electron). Note that oxygen injected into the region 530bc is preferably in one or more of the above forms, and is favorably an oxygen radical. In addition, the insulator 552 and the insulator 550 can have improved film quality, which increases the reliability of the transistor 500.

In the above manner, oxygen vacancies and $V_OH$ can be selectively removed from the region 530bc in the oxide semiconductor, whereby the region 530bc can be an i-type or substantially i-type region. Furthermore, supply of an excess amount of oxygen to the regions 530ba and 530bb functioning as the source region and the drain region can be inhibited and the state of the n-type regions before the microwave treatment can be maintained. As a result, a change in the electrical characteristics of the transistor 500 can be inhibited, and thus a variation in the electrical characteristics of the transistors 500 in the substrate plane can be reduced.

The above structure allows the semiconductor device to have a small variation in transistor characteristics. The semiconductor device can have high reliability. In addition, the semiconductor device can have favorable electrical characteristics.

As illustrated in FIG. 13B, a curved surface may be included between the side and top surfaces of the oxide 530b in a cross-sectional view in the channel width direction of the transistor 500. In other words, the end portion of the side surface and the end portion of the top surface may be curved (hereinafter, such a shape is also referred to as a rounded shape).

The radius of curvature of the curved surface is preferably greater than 0 nm and less than the thickness of the oxide 530b in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the oxide 530b with the insulators 552, 550, and 554, and the conductor 560.

The oxide 530 preferably has a stacked-layer structure of a plurality of oxide layers with different chemical compositions. Specifically, the atomic ratio of the element M to a metal element that is the main component in the metal oxide used as the oxide 530a is preferably higher than that in the metal oxide used as the oxide 530b. Moreover, the atomic ratio of the element M to In in the metal oxide used as the oxide 530a is preferably higher than that in the metal oxide used as the oxide 530b. Moreover, the atomic ratio of In to the element M in the metal oxide used as the oxide 530b is preferably higher than that in the metal oxide used as the oxide 530a.

The oxide 530b is preferably an oxide having crystallinity, such as a CAAC-OS. An oxide having crystallinity, such as a CAAC-OS, has a dense structure with few impurities and defects (e.g., oxygen vacancies) and high crystallinity. Accordingly, extraction of oxygen from the oxide 530b by the source electrode or the drain electrode can be suppressed. This can inhibit extraction of oxygen from the oxide 530b even when heat treatment is performed; hence, the transistor 500 is stable with respect to high temperatures in the manufacturing process (what is called thermal budget).

Here, the conduction band minimum is gradually varied at a junction portion of the oxide 530a and the oxide 530b. In other words, the conduction band minimum at the junction portion of the oxide 530a and the oxide 530b is continuously varied or continuously connected. To vary the conduction band minimum gradually, the density of defect states in a mixed layer formed at the interface between the oxide 530a and the oxide 530b is preferably made low.

Specifically, when the oxides 530a and 530b contain the same element as a main component in addition to oxygen, a mixed layer with a low density of defect states can be formed. For example, in the case where the oxide 530b is an In-M-Zn oxide, the oxide 530a may be an In-M-Zn oxide, a M-Zn oxide, an oxide of the element M, In—Zn oxide or indium oxide.

Specifically, as the oxide 530a, a metal oxide having an atomic ratio of In:M:Zn=1:3:4 or a neighborhood thereof, or InM:Zn=1:1:0.5 or a neighborhood thereof may be used. As the oxide 530b, a metal oxide having an atomic ratio of In:M:Zn=1:1:1 or a neighborhood thereof, or In:M:Zn=4:2:3 or a neighborhood thereof may be used. Note that the neighborhood of an atomic ratio includes ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

Providing the insulator 552 formed of aluminum oxide or the like in contact with a top surface and a side surface of the oxide 530 as illustrated in FIG. 13A and the like might cause the indium contained in the oxide 530 to be unevenly distributed at the interface between the oxide 530 and the insulator 552 and its vicinity. In this case, the vicinity of a surface of the oxide 530 has an atomic ratio close to that of indium oxide or In—Zn oxide. Such an increase in the atomic ratio of indium in the vicinity of the surface of the oxide 530, especially the vicinity of a surface of the oxide 530b, can increase the field-effect mobility of the transistor 500.

The density of defect states at the interface between the oxide 530a and the oxide 530b can be made low when the oxides 530a and 530b have the aforementioned composition. This reduces the influence of interface scattering on carrier conduction, and the transistor 500 can have a high on-state current and high frequency characteristics.

At least one selected from the insulators 512, 514, 544, 571, 574, 576, and 581 preferably functions as a barrier insulating film that inhibits diffusion of impurities such as water and hydrogen from the substrate side or from above the transistor 500 into the transistor 500. Therefore, at least one selected from the insulators 512, 514, 544, 571, 574, 576, and 581 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material which does not easily transmit the impurities. Alternatively, it is preferable to use an insulating material having a function of inhibiting diffusion of oxygen (e.g., at least one of oxygen atoms, oxygen molecules, and the like), that is, an insulating material which does not easily transmit the oxygen.

Note that in this specification, a barrier insulating film refers to an insulating film having a barrier property. A barrier property in this specification means a function of inhibiting diffusion of a particular substance (also referred to as a function of less easily transmitting the substance). In addition, a barrier property in this specification means a function of capturing or fixing (also referred to as gettering) a particular substance.

An insulator having a function of inhibiting diffusion of impurities, such as water and hydrogen, and oxygen is preferably used for the insulators 512, 514, 544, 571, 574, 576, and 581; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulators 512, 544, and 576. For example, aluminum oxide or magnesium oxide, which has high hydrogen-trapping and hydrogen-fixing capabilities, is preferably used for the insulators 514, 571, 574, and 581. Accordingly, impurities such as water and hydrogen can be inhibited from diffusing to the transistor 500 side from the substrate side through the insulators 512 and 514. Furthermore, impurities such as water and hydrogen can be inhibited from diffusing to the transistor 500 side from an interlayer insulating film and the like positioned outward from the insulator 581. In addition, oxygen contained in the insulator 524 and the like can be inhibited from diffusing to the substrate side through the insulators 512 and 514. Furthermore, oxygen contained in the insulator 580 and the like can be inhibited from diffusing to above the transistor 500 through the insulator 574. In this manner, the transistor 500 is preferably surrounded by the insulators 512, 514, 571, 544, 574, 576, and 581 having a function of inhibiting diffusion of oxygen and impurities such as water and hydrogen.

Here, an oxide including an amorphous structure is preferably used as the insulators 512, 514, 544, 571, 574, 576, and 581. For example, a metal oxide such as $AlO_x$ (x is a given number greater than 0) or $MgO_y$ (y is a given number greater than 0) is preferably used. In such a metal oxide including an amorphous structure, an oxygen atom has a dangling bond, and the metal oxide has a property of trapping or fixing hydrogen with the dangling bond in some cases. When such a metal oxide including an amorphous structure is used as the component of the transistor 500 or provided around the transistor 500, hydrogen in or around the transistor 500 can be trapped or fixed. In particular, hydrogen contained in the channel formation region of the transistor 500 is preferably trapped or fixed. When a metal oxide including an amorphous structure is used as the component of the transistor 500 or provided around the transistor 500, the transistor 500 and the semiconductor device with favorable characteristics and high reliability can be fabricated.

The insulators 512, 514, 544, 571, 574, 576, and 581 each preferably have an amorphous structure, but may partly include a region with a polycrystalline structure. Alternatively, the insulators 512, 514, 544, 571, 574, 576, and 581 may each have a multilayer structure in which a layer with an amorphous structure and a layer with a polycrystalline structure are stacked. For example, a stacked-layer structure in which a layer with a polycrystalline structure is formed over a layer with an amorphous structure may be employed.

The insulators 512, 514, 544, 571, 574, 576, and 581 can be deposited by a sputtering method, for example. Since a deposition gas used in a sputtering method does not need to include a molecule containing hydrogen, the hydrogen concentration in the insulators 512, 514, 544, 571, 574, 576, and 581 can be reduced. Note that the deposition method is not limited to a sputtering method and a chemical vapor deposition (CVD) method, a molecular beam epitaxy (MBE) method, a pulsed laser deposition (PLD) method, an atomic layer deposition (ALD) method, or the like may be adopted.

The resistivity of the insulators 512, 544, and 576 is preferably low in some cases. For example, the insulators 512, 544, and 576 with a resistivity of approximately $1 \times 10^{13}$ Ωcm can sometimes relieve charge buildup of e.g., the conductor 503, 542, or 560 in the treatment using plasma in the manufacturing process of a semiconductor device. The resistivity of the insulators 512, 544, and 576 is preferably higher than or equal to $1 \times 10^{10}$ Ωcm and lower than or equal to $1 \times 10^{15}$ Ωcm.

The insulators 516, 574, 580, and 581 preferably have a lower dielectric constant than that of the insulator 514. When a material with a low dielectric constant is used for an interlayer film, the parasitic capacitance generated between wirings can be reduced. For the insulators 516, 580, and 581, silicon oxide, silicon oxynitride, silicon oxide to which fluorine is added, silicon oxide to which carbon is added, silicon oxide to which carbon and nitrogen are added, or porous silicon oxide, is used as appropriate, for example.

The insulator 581 preferably functions as one or both of an interlayer film and a planarization film.

The conductor 503 is provided to overlap with the oxide 530 and the conductor 560. The conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a side wall of the above opening. The conductor 503b is provided so as to be embedded in a recessed portion formed in the conductor 503a. Here, an upper portion of the conductor 503b is substantially level with upper portions of the conductor 503a and the insulator 516.

Here, the conductor 503a is preferably formed using a conductive material which has a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms. Alternatively, the conductor 503a is preferably formed using a conductive material having a function of inhibiting diffusion of oxygen (e.g., one or both of oxygen atoms and oxygen molecules).

When the conductor 503a is formed using a conductive material having a function of inhibiting diffusion of hydrogen, impurities such as hydrogen contained in the conductor 503b can be prevented from diffusing into the oxide 530 through the insulator 524. When a conductive material having a function of inhibiting oxygen diffusion is used for the conductor 503a, a reduction in conductivity of the conductor 503b due to oxidation of the conductor 503b can be inhibited. As the conductive material having a function of inhibiting oxygen diffusion, for example, titanium, titanium nitride, tantalum, tantalum nitride, ruthenium, or ruthenium oxide is preferably used. Thus, the conductor 503a may be a single layer or a stacked layer of the above conductive materials. For example, titanium nitride may be used for the conductor 503a.

Furthermore, the conductor 503b is preferably formed using a conductive material containing tungsten, copper, or aluminum as its main component. For example, tungsten may be used for the conductor 503b.

The conductor 503 functions as the second gate electrode in some cases. In that case, by changing a potential applied to the conductor 503 independently of a potential applied to the conductor 560, the threshold voltage ($V_{th}$) of the transistor 500 can be controlled. In particular, when a negative potential is applied to the conductor 503, the $V_{th}$ of the transistor 500 can be higher to reduce the off-state current of the transistor. Thus, a drain current when a potential applied to the conductor 560 is 0 V can be smaller in the case where a negative potential is applied to the conductor 503 than in the case where the negative potential is not applied to the conductor 503.

In the case where the oxide 530 is a highly purified intrinsic oxide from which as many impurities are eliminated as possible, the transistor 500 might be able to have normally-off characteristics (have a threshold voltage higher than 0 V) with no application of a potential to one or both of the conductor 503 and the conductor 560. In this case, the conductor 560 and the conductor 503 are preferably connected to each other to be supplied with the same potential.

The electrical resistivity of the conductor 503 is designed in consideration of the potential applied to the conductor 503, and the thickness of the conductor 503 is determined in accordance with the electrical resistivity. The thickness of the insulator 516 is substantially equal to that of the conductor 503. The conductor 503 and the insulator 516 are preferably as thin as possible in the allowable range of the design of the conductor 503. The insulator 516 with a reduced thickness contains a smaller absolute amount of impurity such as hydrogen, inhibiting the diffusion of the impurity into the oxide 530.

When seen from above, the conductor 503 is preferably larger than the region of the oxide 530 not overlapping with the conductor 542a nor the conductor 542b. It is particularly preferable that the conductor 503 extend beyond the end portions in the channel width direction of the oxides 530a and 530b, as illustrated in FIG. 13B. That is, the conductor 503 and the conductor 560 preferably overlap with each other with the insulator positioned therebetween, in a region beyond a side surface of the oxide 530 in the channel width direction. With this structure, the channel formation region in the oxide 530 can be electrically surrounded by electric fields of the conductor 560 functioning as the first gate electrode and the conductor 503 functioning as the second gate electrode. In this specification, such a transistor structure in which a channel formation region is electrically surrounded by the electric fields of a first gate and a second gate is referred to as a surrounded channel (S-channel) structure.

In this specification and the like, the S-channel structure refers to a transistor structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In the transistor 500 having normally-off characteristics and the above-described S-channel structure, the channel formation region can be electrically surrounded. Accordingly, the transistor 500 can be regarded as having a gate-all-around (GAA) structure or a lateral gate-all-around (LGAA) structure. In the transistor 500 having any of the S-channel structure, GAA structure, and LGAA structure, the channel formation region that is formed at the interface between the oxide 530 and the gate insulating film or in the vicinity of the interface spreads throughout the entire bulk of the oxide 530. In other words, the transistor 500 having any of the S-channel structure, GAA structure, and LGAA structure can be regarded as having what is called a bulk-flow structure, in which the entire bulk is used as a carrier path. A transistor with a bulk-flow structure can have an increased current density and thus can be expected to have an increased on-state current or an increased field-effect mobility.

As illustrated in FIG. 13B, the conductor 503 is extended to have a function of a wiring. However, without limitation to this structure, a structure in which a conductor functioning as a wiring is provided under the conductor 503 may be employed. In addition, the conductor 503 is not necessarily provided in each transistor. For example, the conductor 503 may be shared by a plurality of transistors.

Although the conductor 503 is the stack of the conductor 503a and the conductor 503b in the transistor 500, the present invention is not limited thereto. For example, the conductor 503 may have a single-layer structure or a stacked-layer structure of three or more layers.

The insulators 522 and 524 function as gate insulators.

The insulator 522 preferably has a function of inhibiting diffusion of hydrogen (e.g., one or both of hydrogen atoms and hydrogen molecules). The insulator 522 also preferably has a function of inhibiting diffusion of oxygen (e.g., one or both of oxygen atoms and oxygen molecules). For example, the insulator 522 preferably inhibits diffusion of hydrogen and/or oxygen more than the insulator 524.

As the insulator 522, an insulator containing an oxide of aluminum and/or hafnium, which is an insulating material, is preferably used. As the insulator, aluminum oxide, hafnium oxide, an oxide containing aluminum and hafnium (hafnium aluminate), or the like is preferably used. The insulator 522 formed of such a material functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. In addition, the conductor 503 can be inhibited from reacting with oxygen in the insulator 524 or the oxide 530.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the above insulator to which one or more of the materials are added may be subjected to nitriding treatment. The insulator 522 may have a stacked-layer structure including silicon oxide, silicon oxynitride, or silicon nitride over the above insulator.

The insulator 522 may be a single layer or stacked layers of an insulator containing what is called a high-k material such as aluminum oxide, hafnium oxide, tantalum oxide, or zirconium oxide, for example. As miniaturization and high integration of transistors progress, a problem such as a leakage current may arise because of a thinner gate insulator. When a high-k material is used for the insulator functioning as a gate insulator, a gate potential at the time of operation of the transistor can be reduced while the physical thickness is maintained. The insulator 522 can be formed using a high-dielectric-constant substance such as lead zirconate titanate (PZT), strontium titanate ($SrTiO_3$), or $(Ba,Sr)TiO_3$ (BST) in some cases.

The insulator 524 in contact with the oxide 530 is formed using, for example, silicon oxide or silicon oxynitride as appropriate.

In a manufacturing process of the transistor 500, the heat treatment is preferably performed with the surface of the oxide 530 exposed. The heat treatment may be performed at a temperature higher than or equal to 100° C. and lower than or equal to 600° C., preferably higher than or equal to 350° C. and lower than or equal to 550° C., for example. The heat treatment is performed in a nitrogen gas atmosphere, an inert gas atmosphere, or an atmosphere containing an oxidizing gas at higher than or equal to 10 ppm, higher than or equal to 1%, or higher than or equal to 10%. For example, the heat treatment is preferably performed in an oxygen atmosphere. Accordingly, oxygen can be supplied to the oxide 530 to reduce oxygen vacancies ($V_O$). The heat treatment may be performed under a reduced pressure. Alternatively, the heat treatment may be performed in such a manner that heat treatment is performed in a nitrogen gas atmosphere or an inert gas atmosphere, and then another heat treatment is performed in an atmosphere containing an oxidizing gas at higher than or equal to 10 ppm, higher than or equal to 1%, or higher than or equal to 10% in order to compensate for released oxygen. Alternatively, the heat treatment may be performed in such a manner that heat treatment is performed in an atmosphere containing an oxidizing gas at higher than or equal to 10 ppm, higher than or equal to 1%, or higher than or equal to 10%, and then another heat treatment is successively performed in a nitrogen gas atmosphere or an inert gas atmosphere.

Note that the oxygen adding treatment performed on the oxide 530 can promote a reaction in which oxygen vacancies in the oxide 530 are filled with supplied oxygen, i.e., a reaction of $V_O+O\rightarrow$null. Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

Note that the insulators 522 and 524 may each have a stacked-layer structure of two or more layers. In that case, without limitation to a stacked-layer structure formed of the same material, a stacked-layer structure formed of different materials may be employed. The insulator 524 may be formed into an island shape overlapping with the oxide 530a. In that case, the insulator 544 is in contact with the side surface of the insulator 524 and the top surface of the insulator 522.

The conductors 542a and 542b are provided in contact with the top surface of the oxide 530b. The conductors 542a and 542b function as the source electrode and the drain electrode of the transistor 500.

For the conductor 542 (the conductor 542a and the conductor 542b), for example, a nitride containing tantalum, a nitride containing titanium, a nitride containing molybdenum, a nitride containing tungsten, a nitride containing tantalum and aluminum, or a nitride containing titanium and aluminum is preferably used. In one embodiment of the present invention, a nitride containing tantalum is particularly preferable. As another example, ruthenium oxide or ruthenium nitride may be used, or an oxide containing strontium and ruthenium or an oxide containing lanthanum and nickel may be used. These materials are preferable because they are a conductive material that is not easily oxidized or a material that maintains the conductivity even when absorbing oxygen.

In addition, hydrogen contained in the oxide 530b or the like diffuses into the conductor 542a or 542b in some cases. In particular, when a nitride containing tantalum is used for the conductors 542a and 542b, hydrogen contained in the oxide 530b or the like is likely to be diffused into the conductor 542a or 542b, and the diffused hydrogen is bonded to nitrogen contained in the conductor 542a or 542b in some cases. That is, hydrogen contained in the oxide 530b or the like is absorbed by the conductor 542a or 542b in some cases.

No curved surface is preferably formed between the side surface and the top surface of the conductor 542. Without the curved surface, the conductor 542 can have a large cross-sectional area in the channel width direction. Accordingly, the conductivity of the conductor 542 is increased, and thereby the on-state current of the transistor 500 can be increased.

The insulator 571a is provided in contact with a top surface of the conductor 542a, and the insulator 571b is provided in contact with a top surface of the conductor 542b. The insulator 571 preferably functions as at least a barrier insulating film against oxygen. Thus, the insulator 571 preferably has a function of inhibiting oxygen diffusion. For example, the insulator 571 preferably has a function of inhibiting oxygen diffusion more than the insulator 580. For example, a nitride containing silicon such as silicon nitride may be used for the insulator 571. The insulator 571 preferably has a function of trapping impurities such as hydrogen. In that case, for the insulator 571, a metal oxide including an amorphous structure (e.g., an insulator such as aluminum oxide or magnesium oxide) may be used. It is particularly preferable that the insulator 571 be formed using aluminum oxide including an amorphous structure or amorphous aluminum oxide, which might allow more effective hydrogen trapping or hydrogen fixing. Accordingly, the transistor 500 and the semiconductor device with favorable characteristics and high reliability can be fabricated.

The insulator 544 is provided to cover the insulator 524, the oxide 530a, the oxide 530b, the conductor 542, and the insulator 571. The insulator 544 preferably has a function of trapping and fixing hydrogen. In that case, the insulator 544 preferably includes silicon nitride or a metal oxide including an amorphous structure (e.g., an insulator such as aluminum oxide or magnesium oxide). The insulator 544 may be a stacked-layer film of aluminum oxide and silicon nitride over the aluminum oxide, for example.

When the above insulators 571 and 544 are provided, the conductor 542 can be surrounded by the insulators having a barrier property against oxygen. That is, oxygen contained in the insulators 524 and 580 can be prevented from diffusing into the conductor 542. As a result, the conductor 542 can be inhibited from being directly oxidized by oxygen contained in the insulators 524 and 580, so that an increase in resistivity and a reduction in an on-state current can be inhibited.

The insulator 552 functions as part of the gate insulator. The insulator 552 is preferably a barrier insulating film against oxygen. Any of the above-described insulators that can be used as the insulator 574 is used as the insulator 552. As the insulator 552, an insulator containing an oxide of aluminum and/or hafnium is preferably used. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used as the insulator 552. In this case, the insulator 552 contains at least oxygen and aluminum.

As illustrated in FIG. 13B, the insulator 552 is provided in contact with the top surface and side surface of the oxide 530b, the side surface of the oxide 530a, the side surface of the insulator 524, and the top surface of the insulator 522. That is, the regions of the oxide 530a, the oxide 530b, and the insulator 524 that overlap with the conductor 560 are covered with the insulator 552 in the cross section in the channel width direction. With this structure, the insulator 552 having an oxygen barrier property can prevent release of oxygen from the oxides 530a and 530b at the time of heat treatment or the like. This can inhibit formation of oxygen vacancies ($V_O$) in the oxides 530a and 530b. Therefore, oxygen vacancies ($V_O$) and $V_OH$ formed in the region 530bc can be reduced. As a result, the electrical characteristics and reliability of the transistor 500 can be improved.

Even when an excessive amount of oxygen is contained in the insulators 580 and 550 and others, the oxygen can be inhibited from being excessively supplied to the oxides 530a and 530b. Thus, the regions 530ba and 530bb are prevented from being excessively oxidized by supply of the oxygen through the region 530bc; a reduction in on-state current or field-effect mobility of the transistor 500 can be inhibited.

As illustrated in FIG. 13A, the insulator 552 is provided in contact with the side surfaces of the conductor 542, and the insulators 544 and 580. This can inhibit oxidation of the side surface of the conductor 542 and formation of an oxide film on the side surface. It is thus possible to inhibit a reduction in the on-state current or field-effect mobility of the transistor 500.

The insulator 552 needs to be provided in the opening that is formed in the insulator 580 and the like, together with the insulators 554 and 550, and the conductor 560. To miniaturize the transistor 500, the insulator 552 preferably has a small thickness. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that these minimum and maximum values can be combined with each other. In such a case, the insulator 552 at least partly has a region with the above thickness. The thickness of the insulator 552 is preferably smaller than that of the insulator 550. In this case, the insulator 552 at least partly has a region whose thickness is smaller than that of the insulator 550.

An ALD method is preferred for the formation of the insulator 552 with a smaller thickness. As examples of the ALD method, a thermal ALD method, in which a precursor and a reactant react with each other only by a thermal energy, and a plasma-enhanced ALD (PEALD) method, in which a reactant excited by plasma is used, can be given. A PEALD method utilizing plasma is preferable, because deposition at lower temperatures is possible in some cases.

An ALD method enables a single atomic layer to be formed per cycle, and has various advantages such as deposition of an extremely thin film, deposition on a component with a high aspect ratio, deposition of a film with few defects such as pinholes, deposition with excellent coverage, and low-temperature deposition. These advantages enable the insulator 552 to have a small thickness as described above and to be formed to favorably cover, for example, a side surface of the opening formed in the insulator 580 and the like.

Note that some precursors used in the ALD method contain carbon or the like. Thus, a film formed by the ALD method may contain impurities such as carbon in a larger quantity than a film formed by another deposition method. Note that impurities can be quantified by secondary ion mass spectrometry (SIMS) or X-ray photoelectron spectroscopy (XPS).

The insulator 550 functions as part of the gate insulator. The insulator 550 is preferably in contact with a top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. In this case, the insulator 550 contains at least oxygen and silicon.

In the insulator 550, the concentration of impurities such as water and hydrogen is preferably reduced as in the insulator 524. The thickness of the insulator 550 is preferably greater than or equal to 1 nm or greater than or equal to 0.5 nm and less than or equal to 15 nm or less than or equal to 20 nm. Note that these minimum and maximum values can be combined with each other. In such a case, the insulator 550 at least partly has a region with the above thickness.

Although the insulator 550 has a single-layer structure in FIGS. 13A and 13B and the like, the present invention is not limited to the example and the insulator 550 may have a stacked-layer structure including two or more layers. For example, as illustrated in FIG. 15B, the insulator 550 may have a two-layer structure of an insulator 550a and an insulator 550b over the insulator 550a.

Figure 15B:
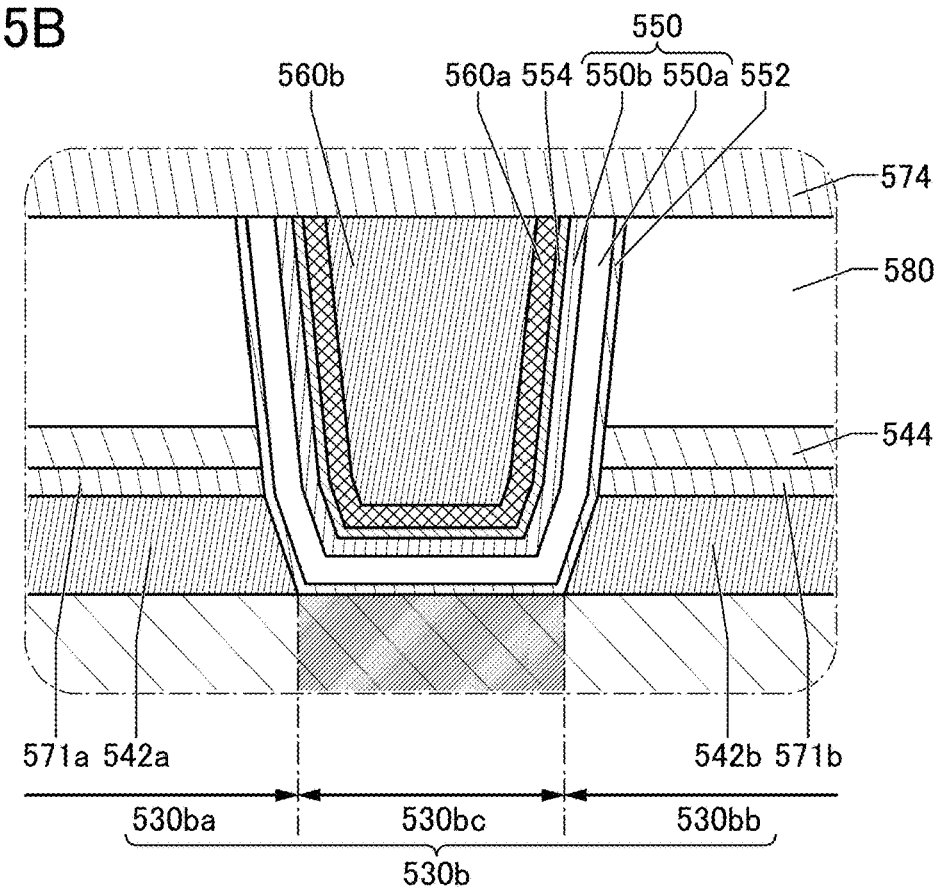

In the case where the insulator 550 has a two-layer structure as illustrated in FIG. 15B, it is preferable that the lower insulator 550a be formed using an insulator that easily transmits oxygen and the upper insulator 550b be formed using an insulator having a function of inhibiting oxygen diffusion. This structure can inhibit diffusion of oxygen contained in the insulator 550a into the conductor 560. In other words, the amount of oxygen supplied to the oxide 530 can be prevented from being reduced. Moreover, oxidation of the conductor 560 due to oxygen contained in the insulator 550a can be inhibited. For example, it is preferable that the insulator 550a be formed using any of the above-described materials that can be used for the insulator 550 and the insulator 550b be formed using an insulator containing an oxide of aluminum and/or hafnium. The insulator can be aluminum oxide, hafnium oxide, an oxide containing aluminum and hafnium (hafnium aluminate) or an oxide containing hafnium and silicon (hafnium silicate), for example. In this embodiment, hafnium oxide is used for the insulator 550b. In this case, the insulator 550b contains at least oxygen and hafnium. The thickness of the insulator 550b is preferably greater than or equal to 0.5 nm or greater than or equal to 1.0 nm, and less than or equal to 3.0 nm or less than or equal to 5.0 nm. Note that these minimum and maximum values can be combined with each other. In such a case, the insulator 550b at least partly has a region with the above thickness.

In the case where silicon oxide, silicon oxynitride, or the like is used for the insulator 550a, the insulator 550b may be formed using an insulating material that is a high-k material having a high dielectric constant. The gate insulator having a stacked-layer structure of the insulator 550a and the insulator 550b can be thermally stable and can have a high dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced. As a result, the insulator 550 can have a high withstand voltage.

The insulator 554 functions as part of the gate insulator. The insulator 554 is preferably a barrier insulating film against hydrogen. In this case, impurities such as hydrogen contained in the conductor 560 can be prevented from being diffused into the insulator 550 and the oxide 530b. Any of the above-described insulators that can be used as the insulator 576 is used as the insulator 554. For example, silicon nitride deposited by a PEALD method can be used for the insulator 554. In this case, the insulator 554 contains at least nitrogen and silicon.

The insulator 554 may also have an oxygen barrier property. In this case, oxygen contained in the insulator 550 can be inhibited from being diffused into the conductor 560.

The insulator 554 needs to be provided in the opening that is formed in the insulator 580 and the like, together with the insulators 552 and 550 and the conductor 560. To miniaturize the transistor 500, the insulator 554 preferably has a small thickness. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that these minimum and maximum values can be combined with each other. In such a case, the insulator 554 at least partly has a region with the above thickness. The thickness of the insulator 554 is preferably smaller than that of the insulator 550. In this case, the insulator 554 at least partly has a region whose thickness is smaller than that of the insulator 550.

The conductor 560 functions as the first gate electrode of the transistor 500. The conductor 560 preferably includes the conductor 560a and the conductor 560b over the conductor 560a. For example, the conductor 560a is preferably positioned to cover the bottom surface and the side surface of the conductor 560b. As illustrated in FIGS. 13A and 13B, the top portion of the conductor 560 is substantially level with the top portion of the insulator 550. Note that although having a two-layer structure of the conductor 560a and the conductor 560b in FIGS. 13A and 13B, the conductor 560 can have, besides the two-layer structure, a single-layer structure or a stacked-layer structure of three or more layers.

The conductor 560a is preferably formed using a conductive material which has a function of inhibiting diffusion of impurities such as hydrogen atoms, hydrogen molecules, water molecules, nitrogen atoms, nitrogen molecules, nitrogen oxide molecules, and copper atoms. Alternatively, the conductor 560a is preferably formed using a conductive material having a function of inhibiting diffusion of oxygen (e.g., at least one selected from oxygen atoms and oxygen molecules).

When the conductor 560a has a function of inhibiting oxygen diffusion, it is possible to prevent a reduction in conductivity of the conductor 560b due to oxidation of the conductor 560b caused by oxygen in the insulator 550. As the conductive material having a function of inhibiting oxygen diffusion, for example, titanium, titanium nitride, tantalum, tantalum nitride, ruthenium, or ruthenium oxide is preferably used.

The conductor 560 also functions as a wiring and thus is preferably a conductor having high conductivity. For example, a conductive material containing tungsten, copper, or aluminum as its main component can be used for the conductor 560b. The conductor 560b can have a stacked-layer structure. Specifically, for example, the conductor 560b can have a stacked-layer structure of titanium or titanium nitride and the above conductive material.

In the transistor 500, the conductor 560 is formed in a self-aligned manner to fill the opening formed in the insulator 580 and the like. In this manner, the conductor 560 can surely be provided in the region between the conductor 542a and the conductor 542b without alignment.

As illustrated in FIG. 13B, in the channel width direction of the transistor 500, the level of the bottom surface of the conductor 560 in a region where the conductor 560 and the oxide 530b do not overlap with each other is preferably lower than the level of a bottom surface of the oxide 530b, with the level of a bottom surface of the insulator 522 as a reference. When the conductor 560 functioning as the gate electrode covers side and top surfaces of the channel formation region in the oxide 530b with the insulator 550 and the like therebetween, the electric field of the conductor 560 is likely to affect the entire channel formation region in the oxide 530b. Hence, the transistor 500 can have a higher on-state current and higher frequency characteristics. The difference between the level of the bottom surface of the conductor 560 in the region where the oxides 530a and 530b do not overlap with the conductor 560 and the level of the bottom surface of the oxide 530b, with the level of the bottom surface of the insulator 522 as a reference, is preferably greater than or equal to 0 nm, greater than or equal to 3 nm, or greater than or equal to 5 nm, and less than or equal to 20 nm, less than or equal to 50 nm, or less than or equal to 100 nm. Note that these minimum and maximum values can be combined with each other.

The insulator 580 is provided over the insulator 544, and the opening is formed in a region where the insulator 550 and the conductor 560 are provided. In addition, the top surface of the insulator 580 may be planarized.

The insulator 580 functioning as an interlayer film preferably has a low dielectric constant. When a material with a low dielectric constant is used for the interlayer film, the parasitic capacitance generated between wirings can be reduced. The insulator 580 is preferably formed using a material similar to that used for the insulator 516, for example. In particular, silicon oxide and silicon oxynitride are preferable because of their thermal stability. In addition, especially materials such as silicon oxide, silicon oxynitride, and porous silicon oxide are preferable because a region containing oxygen that is released by heating can be easily formed in these materials.

The concentration of impurities such as water and hydrogen in the insulator 580 is preferably reduced. For example, an oxide containing silicon such as silicon oxide or silicon oxynitride can be used for the insulator 580, as appropriate.

The insulator 574 preferably functions as a barrier insulating film that inhibits impurities such as water and hydrogen from diffusing into the insulator 580 from above and also has a function of trapping impurities such as hydrogen. The insulator 574 preferably functions as a barrier insulating film for inhibiting transmission of oxygen. For the insulator 574, a metal oxide including an amorphous structure, for example, an insulator such as aluminum oxide can be used. In this case, the insulator 574 contains at least oxygen and aluminum. The insulator 574, which has a function of trapping impurities such as hydrogen, is provided in contact with the insulator 580 in a region interposed between the insulator 512 and the insulator 581, whereby impurities such as hydrogen contained in the insulator 580 and the like can be trapped and the amount of hydrogen in the region can be suppressed to a certain value. It is particularly preferable that the insulator 574 be formed using aluminum oxide including an amorphous structure, enabling more effective hydrogen trapping or hydrogen fixing in some cases. Accordingly, the transistor 500 and the semiconductor device with favorable characteristics and high reliability can be fabricated.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon such as silicon nitride or silicon nitride oxide. For example, silicon nitride deposited by a sputtering method may be used for the insulator 576. A silicon nitride film as the insulator 576 can have a high density when formed by a sputtering method. To form the insulator 576, silicon nitride deposited by a PEALD method or a CVD method may be stacked over silicon nitride deposited by a sputtering method.

One of a first terminal and a second terminal of the transistor 500 is electrically connected to a conductor 540a serving as a plug, and the other of the first terminal and the second terminal of the transistor 500 is electrically connected to a conductor 540b. Note that in this specification and the like, the conductors 540a and 540b are collectively referred to as the conductor 540.

The conductor 540a is provided in a region overlapping with the conductor 542a, for example. Specifically, in the region overlapping with the conductors 542a, an opening portion is provided in the insulators 571, 544, 580, 574, 576, and 581 illustrated in FIG. 13A and in the insulators 582 and 586 illustrated in FIG. 12, and the conductor 540a is provided inside the opening portion as illustrated in FIG.

13A. The conductor 540*b* is provided in a region overlapping with the conductor 542*b*, for example. Specifically, an opening portion is provided in the insulators 571, 544, 580, 574, 576, and 581 illustrated in FIG. 13A and in the insulators 582 and 586 illustrated in FIG. 12 in the region overlapping with the conductor 542*b*, and the conductor 540*b* is provided inside the opening portion. Note that the insulators 582 and 586 are described later.

As illustrated in FIG. 13A, an insulator 541*a* having an impurity barrier property may be provided between the conductor 540*a* and a side surface of the opening portion in the region overlapping with the conductor 542*a*. In a similar manner, an insulator 541*b* having an impurity barrier property may be provided between the conductor 540*b* and a side surface of the opening portion in the region overlapping with the conductor 542*b*. Note that in this specification and the like, the insulators 541*a* and 541*b* are collectively referred to as the insulator 541.

The conductors 540*a* and 540*b* are preferably formed using a conductive material containing tungsten, copper, or aluminum as its main component. The conductors 540*a* and 540*b* may have a stacked-layer structure.

In the case where the conductor 540 has a stacked-layer structure, a conductive material having a function of inhibiting transmission of impurities such as water and hydrogen is preferably used for a first conductor in the vicinity of the insulators 574, 576, 581, 580, 544, and 571. For example, tantalum, tantalum nitride, titanium, titanium nitride, ruthenium, or ruthenium oxide is preferably used. The conductive material having a function of inhibiting transmission of impurities such as water and hydrogen can be used as a single layer or stacked layers. Furthermore, impurities such as water and hydrogen contained in the components above the insulator 576 can be inhibited from entering the oxide 530 through the conductors 540*a* and 540*b*.

The insulators 541*a* and 541*b* are formed using any of the barrier insulating films that can be used for the insulator 544, for example. An insulator such as silicon nitride, aluminum oxide, or silicon nitride oxide may be used as the insulators 541*a* and 541*b*, for example. Since the insulators 541*a* and 541*b* are provided in contact with the insulators 574, 576, and 571, impurities such as water and hydrogen contained in the insulator 580 or the like can be inhibited from entering the oxide 530 through the conductors 540*a* and 540*b*. Silicon nitride is particularly preferable because of its high blocking property against hydrogen. Furthermore, oxygen contained in the insulator 580 can be prevented from being absorbed by the conductors 540*a* and 540*b*.

In the case where the insulators 541*a* and 541*b* each have a stacked-layer structure as illustrated in FIG. 13A, a combination of a barrier insulating film against oxygen and a barrier insulating film against hydrogen is preferably used for a first insulator that is in contact with an inner wall of the opening provided in the insulator 580 and the like and a second insulator inside the first insulator.

For example, aluminum oxide deposited by an ALD method can be used as the first insulator and silicon nitride deposited by a PEALD method can be used as the second insulator. Such a structure can inhibit oxidation of the conductor 540 and reduce entry of hydrogen into the conductor 540.

Although the first insulator of the insulator 541 and the second insulator of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

As illustrated in FIG. 12, conductors 610 and 612 serving as wirings may be provided in contact with top portions of the conductors 540*a* and 540*b*. The conductors 610 and 612 are preferably formed using a conductive material containing tungsten, copper, or aluminum as its main component. The conductor can have a stacked-layer structure. The conductor may be a stack of titanium or a titanium nitride and any of the above conductive materials, for example. Note that the conductor may be formed to be embedded in an opening in an insulator.

The structure of the transistor included in the semiconductor device of one embodiment of the present invention is not limited to the structures of the transistors 500 illustrated in FIGS. 12, 13A, 13B, and 14. The structure of the transistor included in the semiconductor device of one embodiment of the present invention may be changed in accordance with circumstances.

Figure 16:
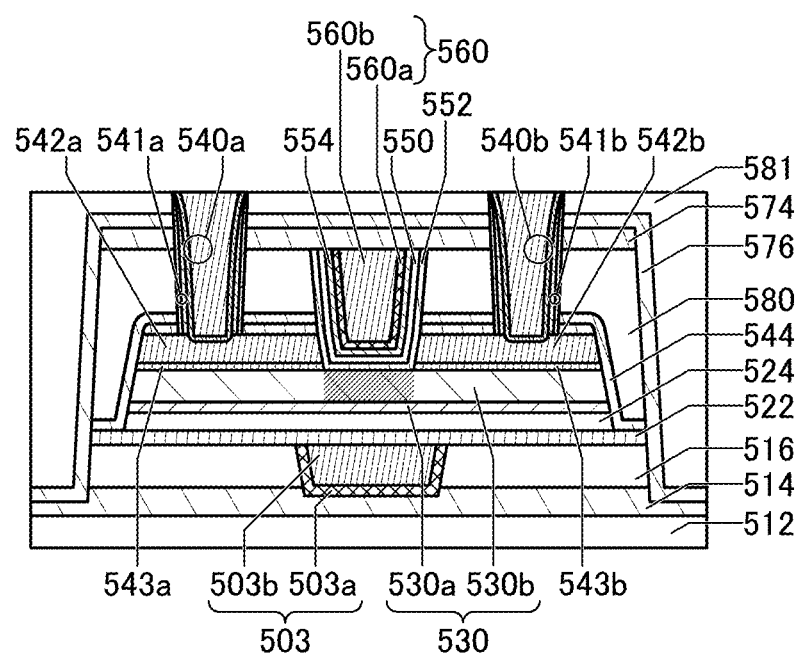
FIG. 16 is a schematic cross-sectional view of a structure example of a transistor.

For example, the transistor 500 illustrated in FIG. 12, FIG. 13A, FIG. 13B, and FIG. 14 may have a structure illustrated in FIG. 16. The transistor in FIG. 16 is different from the transistor 500 illustrated in FIG. 12, FIG. 13A, FIG. 13B, and FIG. 14 in that oxides 543*a* and 543*b* are provided. Note that in this specification and the like, the oxide 543*a* and the oxide 543*b* are collectively referred to as an oxide 543. The cross section in the channel-width direction of the transistor in FIG. 16 can have a structure similar to the cross section of the transistor 500 illustrated in FIG. 13B.

The oxide 543*a* is provided between the oxide 530*b* and the conductor 542*a*, and the oxide 543*b* is provided between the oxide 530*b* and the conductor 542*b*. The oxide 543*a* is preferably in contact with the top surface of the oxide 530*b* and the bottom surface of the conductor 542*a*. The oxide 543*b* is preferably in contact with the top surface of the oxide 530*b* and the bottom surface of the conductor 542*b*.

The oxide 543 preferably has a function of inhibiting oxygen transmission. The oxide 543, which has a function of inhibiting oxygen transmission, is preferably provided between the oxide 530*b* and the conductor 542 serving as the source electrode or the drain electrode, whereby the electrical resistance between the conductor 542 and the oxide 530*b* can be reduced. Such a structure improves the electrical characteristics, field-effect mobility, and reliability of the transistor 500.

A metal oxide containing the element M may be used as the oxide 543. In particular, aluminum, gallium, yttrium, or tin is preferably used as the element M. The concentration of the element M in the oxide 543 is preferably higher than that in the oxide 530*b*. Alternatively, gallium oxide may be used as the oxide 543. A metal oxide such as an In-M-Zn oxide may be used as the oxide 543. Specifically, the atomic ratio of the element M to In in the metal oxide used as the oxide 543 is preferably higher than that in the metal oxide used as the oxide 530*b*. The thickness of the oxide 543 is preferably greater than or equal to 0.5 nm or greater than or equal to 1 nm, and less than or equal to 2 nm, less than or equal to 3 nm, or less than or equal to 5 nm. Note that these minimum and maximum values can be combined with each other. The oxide 543 preferably has crystallinity. The oxide 543 with crystallinity can efficiently inhibit release of oxygen from the oxide 530. When the oxide 543 has a hexagonal crystal structure, for example, release of oxygen from the oxide 530 can sometimes be inhibited.

An insulator 582 is provided over the insulator 581, and an insulator 586 is provided over the insulator 582.

A substance having a barrier property against oxygen and hydrogen is preferably used for the insulator 582. Thus, the insulator 582 can be formed using a material similar to that for the insulator 514. For the insulator 582, a metal oxide such as aluminum oxide, hafnium oxide, or tantalum oxide is preferably used, for example.

The insulator 586 can be formed using a material similar to that for the insulator 320. In the case in which a material with a relatively low dielectric constant is used for these insulators, the parasitic capacitance between wirings can be reduced. A silicon oxide film or a silicon oxynitride film can be used as the insulator 586, for example.

Next, the capacitor 600 and peripheral wiring or plug included in the semiconductor device illustrated in FIG. 12 and FIG. 14 will be described. Note that the capacitor 600 and the wiring and/or the plug are provided above the transistor 500 illustrated in FIG. 12 and FIG. 14.

The capacitor 600 includes, for example, conductors 610 and 620, and an insulator 630.

The conductor 610 is provided over one of the conductors 540a and 540b, the conductor 546, and the insulator 586. The conductor 610 serves as one of the pair of electrodes of the capacitor 600.

The conductor 612 is provided over the other of the conductors 540a and 540b and the insulator 586. The conductor 612 serves as a plug, a wiring, or a terminal that electrically connects the transistor 500 to a circuit element, a wiring or the like provided above the transistor 500.

The conductors 612 and 610 can be formed at the same time.

The conductors 612 and 610 can be formed using a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film). Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductors 612 and 610 each have a single-layer structure in FIG. 12; however, one embodiment of the present invention is not limited thereto, and a stacked-layer structure of two or more layers may be used. For example, between a conductor having a barrier property and a conductor having high conductivity, a conductor that is highly adhesive to the conductor having a barrier property and the conductor having high conductivity may be formed.

An insulator 630 is provided over the insulator 586 and the conductor 610. The insulator 630 serves as a dielectric between the pair of electrodes of the capacitor 600.

For the insulator 630, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride or zirconium oxide can be used. The insulator 630 can be formed to have a stacked-layer structure or a single-layer structure using any of the above materials.

For example, the insulator 630 preferably has a stacked-layer structure using a material with high dielectric strength such as silicon oxynitride and a high dielectric constant (high-k) material. In the capacitor 600 having such a structure, a sufficient capacitance can be provided owing to the high dielectric constant (high-k) insulator, and the dielectric strength can be increased owing to the insulator with high dielectric strength, so that the electrostatic breakdown of the capacitor 600 can be prevented.

Examples of the high dielectric constant (high-k) material (material with a high relative permittivity) include gallium oxide, hafnium oxide, and zirconium oxide. Other examples include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, the insulator 630 may have a single-layer structure or a stacked-layer structure using an insulator containing a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST). For the insulator 630, a compound containing hafnium and zirconium may be used. When the semiconductor device is minimized and highly integrated, a gate insulator and a dielectric used for a capacitor become thin, which might cause a problem of leakage current generated in a transistor or a capacitor. When a high-k material is used as a gate insulator and a dielectric used for a capacitor, a gate potential during the transistor operation can be reduced and the capacitance of the capacitor can be ensured while the physical thickness is kept.

In particular, by using a material that can show ferroelectricity for the insulator 630, for example, the capacitor 600 can be used as a ferroelectric capacitor.

The conductor 620 is provided to overlap with the conductor 610 with the insulator 630 positioned therebetween. The conductor 610 serves as an electrode of a pair of electrodes of the capacitor 600.

The conductor 620 can be formed using a conductive material such as a metal material, an alloy material, or a metal oxide material. It is preferable to use a high-melting-point material that has both heat resistance and conductivity, such as tungsten or molybdenum, and especially tungsten is preferred. In the case in which the conductor 620 is formed concurrently with another component such as a conductor, copper (Cu), aluminum (Al), or the like, which is a low-resistance metal material, can be used. For example, the conductor 620 can be formed using a material that can be used for the conductor 610. Furthermore, the conductor 620 may have a single-layer structure or a stacked structure of two or more layers.

An insulator 640 is provided over the conductor 620 and the insulator 630. As the insulator 640, a film having a barrier property that prevents impurities such as hydrogen from diffusing into the region where the transistor 500 is formed is preferably used. Therefore, the insulator 640 can be formed using a material similar to that for the insulator 324.

An insulator 650 is provided over the insulator 640. The insulator 650 can be formed using a material similar to that used for the insulator 320. The insulator 650 may function as a planarization film that covers roughness due to underlying layers. Thus, the insulator 650 can be formed using any of the materials applicable to the insulator 324, for example.

Although the capacitor 600 illustrated in FIG. 12 and FIG. 14 is a planar capacitor, the shape of the capacitor is not limited thereto. For example, the capacitor 600 may be a cylindrical capacitor.

A wiring layer may be provided above the capacitor 600. For example, in FIG. 12, the insulators 411, 412, 413, and 414 are provided in this order over the insulator 650. In addition, a conductor 416 serving as a plug or a wiring is provided in the insulators 411, 412, and 413. The conductor 416 can be provided, for example, in a region overlapping with a conductor 660 to be described below.

In addition, in the insulators 630, 640, and 650, an openings is provided in a region overlapping with the conductor 612, and the conductor 660 is provided to fill the opening in the insulators 630, 640, and 650. The conductor 660 serves as a plug or a wiring that is electrically connected to the conductor 416 included in the above-described wiring layer.

The insulators 411 and 414 are each preferably formed using, for example, an insulator having a barrier property against impurities such as water and hydrogen, like the insulator 324. Thus, the insulators 411 and 414 can each be formed using any of the materials applicable to the insulator 324 and the like, for example.

The insulators 412 and 413 are each preferably formed using, for example, an insulator having a relatively low dielectric constant to reduce the parasitic capacitance generated between wirings, like the insulator 326.

The conductors 612 and 416 can be formed using, for example, materials similar to the materials of the conductors 328 and 330.

Note that this embodiment can be combined with any of the other embodiments in this specification as appropriate.

Embodiment 5

Described in this embodiment is a metal oxide (hereinafter also referred to as an oxide semiconductor) applicable to an OS transistor described in the above embodiments.

A metal oxide preferably contains at least indium or zinc. In particular, indium and zinc are preferably contained. In addition, aluminum, gallium, yttrium, or tin is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and cobalt may be contained.

<Classification of Crystal Structures>

First, the classification of the crystal structures of an oxide semiconductor will be described with reference to FIG. 17A. FIG. 17A is a diagram showing the classification of crystal structures of an oxide semiconductor, typically IGZO (a metal oxide containing In, Ga, and Zn).

As shown in FIG. 17A, an oxide semiconductor is roughly classified into "Amorphous", "Crystalline", and "Crystal". The term "Amorphous" includes a completely amorphous structure. The term "Crystalline" includes c-axis-aligned crystalline (CAAC), nanocrystalline (nc), and cloud-aligned composite (CAC) structures. Note that the term "Crystalline" excludes single crystal, poly crystal, and completely amorphous. The term "Crystal" includes single crystal and poly crystal structures.

Note that the structures in the thick frame in FIG. 17A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 17B shows an XRD spectrum, which is obtained by grazing-incidence XRD (GIXD) measurement, of a CAAC-IGZO film classified into "Crystalline". In FIG. 17B, the horizontal axis represents 2θ [deg.] and the vertical axis represents intensity in arbitrary unit (a. u.). Note that a GIXD method is also referred to as a thin film method or a Seemann-Bohlin method. The XRD spectrum that is shown in FIG. 17B and obtained by GIXD measurement is hereinafter simply referred to as an XRD spectrum in some cases. The CAAC-IGZO film in FIG. 17B has an atomic ratio of In:Ga:Zn=4:2:3 or a neighborhood thereof. The CAAC-IGZO film in FIG. 17B has a thickness of 500 nm.

As shown in FIG. 17B, a clear peak indicating crystallinity is observed in the XRD spectrum of the CAAC-IGZO film. Specifically, a peak indicating c-axis alignment is observed at 2θ of around 31° in the XRD spectrum of the CAAC-IGZO film. As shown in FIG. 17B, the peak at 2θ of around 31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 17C shows a diffraction pattern of the CAAC-IGZO film. FIG. 17C shows a diffraction pattern obtained by the NBED method in which an electron beam is incident in the direction parallel to the substrate. The CAAC-IGZO film in FIG. 17C has an atomic ratio of In:Ga:Zn=4:2:3 or a neighborhood thereof. In the nanobeam electron diffraction method, electron diffraction is performed with a probe diameter of 1 nm.

As shown in FIG. 17C, a plurality of spots indicating c-axis alignment are observed in the diffraction pattern of the CAAC-IGZO film.

<<Structure of Oxide Semiconductor>>

Oxide semiconductors can be classified in a manner different from the one in FIG. 17A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more selected from aluminum, gallium, yttrium, tin, and titanium), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, In—Zn oxide and In—Ga—Zn oxide are suitable because they can inhibit generation of a grain boundary as compared with In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, and the like might decrease the crystallinity of an oxide semiconductor. This means that the CAAC-OS can be referred to as an oxide semiconductor having few impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has higher [In] than [In] in the second region and lower [Ga] than [Ga] in the second region. Moreover, the second region has higher [Ga] than [Ga] in the first region and lower [In] than [In] in the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current (Ion), high field-effect mobility ($\mu$), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$ and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is also preferably reduced. Examples of impurities include hydrogen, nitrogen, alkali metal, alkaline earth metal, iron, nickel, and silicon.

<Impurity>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including, as a semiconductor, an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

Note that this embodiment can be combined with any of the other embodiments in this specification as appropriate.

Embodiment 6

This embodiment will describe examples of a semiconductor wafer including the semiconductor device or the like described in any of the above embodiments and an electronic component including the semiconductor device.

<Semiconductor Wafer>

First, an example of a semiconductor wafer including a semiconductor device and the like is described with reference to FIG. 18A.

Figure 18A:
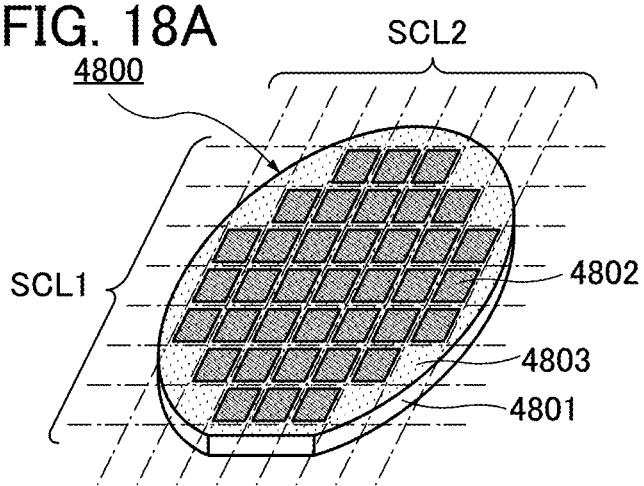
FIG. 18A is a perspective view illustrating an example of a semiconductor wafer.

A semiconductor wafer 4800 illustrated in FIG. 18A includes a wafer 4801 and a plurality of circuit portions 4802 provided on the top surface of the wafer 4801. A portion without the circuit portions 4802 on the top surface of the wafer 4801 is a spacing 4803 that is a region for dicing.

The semiconductor wafer 4800 can be formed by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

Next, a dicing step is performed. The dicing is carried out along scribe lines SCL1 and scribe lines SCL2 (sometimes referred to as dicing lines or cutting lines) indicated by dashed-dotted lines. To perform the dicing step easily, the spacing 4803 is preferably arranged such that a plurality of scribe lines SCL1 are parallel to each other, a plurality of scribe lines SCL2 are parallel to each other, and the scribe lines SCL1 and the scribe lines SCL2 intersect each other perpendicularly.

Figure 18B:
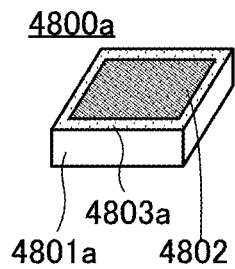
FIG. 18B is a perspective view illustrating an example of a chip.

With the dicing step, a chip 4800a illustrated in FIG. 18B can be cut out from the semiconductor wafer 4800. The chip 4800a includes a wafer 4801a, the circuit portion 4802, and a spacing 4803a. Note that it is preferable to make the spacing 4803a as small as possible. Here, it is preferred that the width of the spacing 4803 between adjacent circuit portions 4802 be substantially the same as the width of the scribe line SCL1 or the scribe line SCL2.

The shape of the element substrate of one embodiment of the present invention is not limited to the shape of the semiconductor wafer 4800 illustrated in FIG. 18A. The element substrate may be a rectangular semiconductor wafer, for example. The shape of the element substrate can be changed as appropriate, depending on a process for fabricating an element and an apparatus for fabricating the element.

<Electronic Component>

Figure 18C:
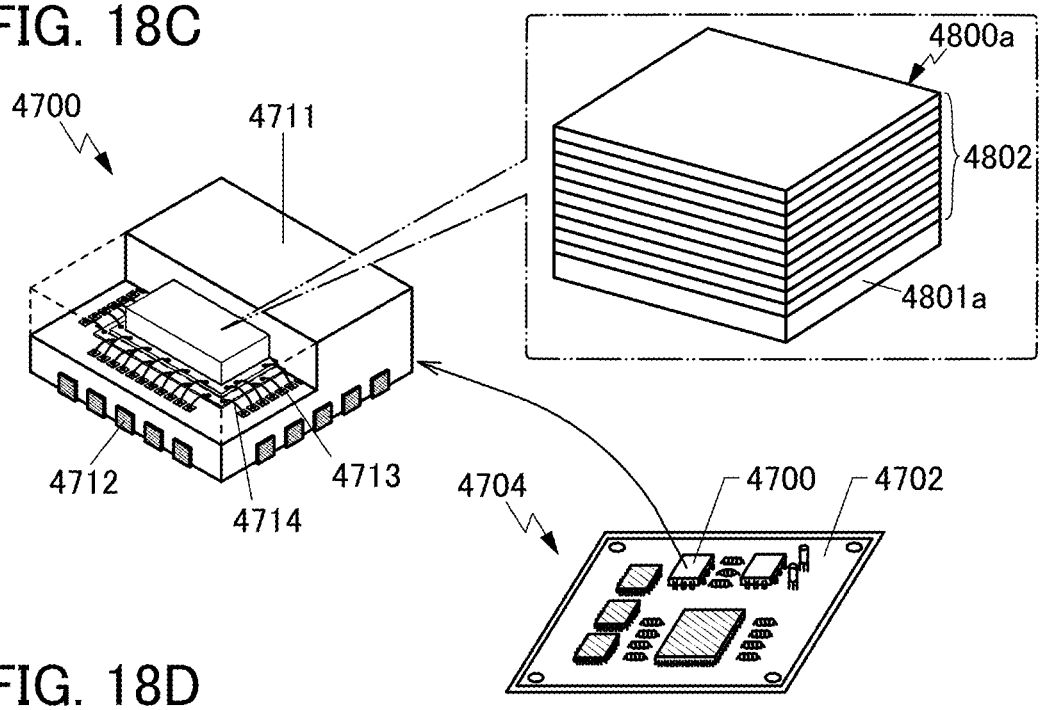
FIGS. 18C and 18D are perspective views illustrating examples of electronic components.

FIG. 18C is a perspective view of an electronic component 4700 and a substrate (a circuit board 4704) on which the electronic component 4700 is mounted. The electronic component 4700 in FIG. 18C includes the chip 4800a in a mold 4711. Note that the chip 4800a illustrated in FIG. 18C has a structure in which the circuit portions 4802 are stacked.

For example, a circuit including the semiconductor device described in any of the above embodiments can be used as the circuit portion 4802. To illustrate the inside of the electronic component 4700, some portions are omitted in FIG. 18C. The electronic component 4700 includes a land 4712 outside the mold 4711. The land 4712 is electrically connected to an electrode pad 4713, and the electrode pad 4713 is electrically connected to the chip 4800a via a wire 4714. The electronic component 4700 is mounted on a printed circuit board 4702, for example. A plurality of such electronic components are combined and electrically connected to each other on the printed circuit board 4702; thus, the circuit substrate 4704 is completed.

Figure 18D:
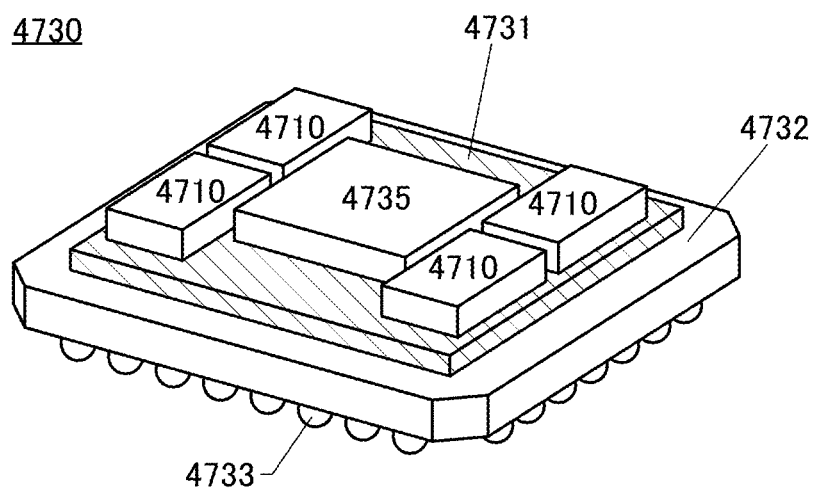

FIG. 18D is a perspective view of an electronic component 4730. The electronic component 4730 is an example of a system in package (SiP) or a multi-chip module (MCM). In the electronic component 4730, an interposer 4731 is provided over a package substrate 4732 (printed circuit board), and a semiconductor device 4735 and a plurality of semiconductor devices 4710 are provided over the interposer 4731.

The electronic component 4730 includes the semiconductor device 4710. The semiconductor devices 4710 can be a memory device such as a high bandwidth memory (HBM). Moreover, an integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings have a single-layer structure or a multi-layer structure. The interposer 4731 has a function of electrically connecting an integrated circuit provided on the interposer 4731 to an electrode provided on the package substrate 4732. Accordingly, the interposer is sometimes referred to as a redistribution substrate or an intermediate substrate. A through electrode may be provided in the interposer 4731 and used to electrically connect the integrated circuit and the package substrate 4732. In the case of using a silicon interposer, a through-silicon via (TSV) can also be used as the through electrode.

A silicon interposer is preferably used as the interposer 4731. The silicon interposer can be manufactured at lower cost than an integrated circuit because it is unnecessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, minute wirings are required to be formed densely on an interposer on which an HBM is mounted. For this reason, a silicon interposer is preferably used as the interposer on which an HBM is mounted.

In an SiP or MCM using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided thereon is less likely to occur. It is preferable to use a silicon interposer especially for a 2.5D package (2.5D mounting) in which a plurality of integrated circuits are arranged side by side on an interposer.

A heat sink (radiator plate) may be provided to overlap with the electronic component 4730. When a heat sink is provided, the heights of integrated circuits provided on the interposer 4731 are preferably the same. For example, in the electronic component 4730 described in this embodiment, the heights of the semiconductor devices 4710 and the semiconductor device 4735 are preferably the same.

An electrode 4733 may be provided on the bottom of the package substrate 4732 to mount the electronic component 4730 on another substrate. FIG. 18D illustrates an example in which the electrode 4733 is formed of a solder ball. Solder balls are provided in a matrix on the bottom of the package substrate 4732, whereby a ball grid array (BGA) can be achieved. Alternatively, the electrode 4733 may be formed of a conductive pin. When conductive pins are provided in a matrix on the bottom of the package substrate 4732, a pin grid array (PGA) can be achieved.

The electronic component 4730 can be mounted on another substrate in a variety of manners other than a BGA and a PGA. For example, a staggered pin grid array (SPGA), a land grid array (LGA), a quad flat package (QFP), a quad flat J-leaded package (QFJ), or a quad flat non-leaded package (QFN) can be employed.

Note that this embodiment can be combined with any of the other embodiments in this specification as appropriate.

Embodiment 7

In this embodiment, a CPU that can include the semiconductor device of any of the above embodiments will be described.

Figure 19:
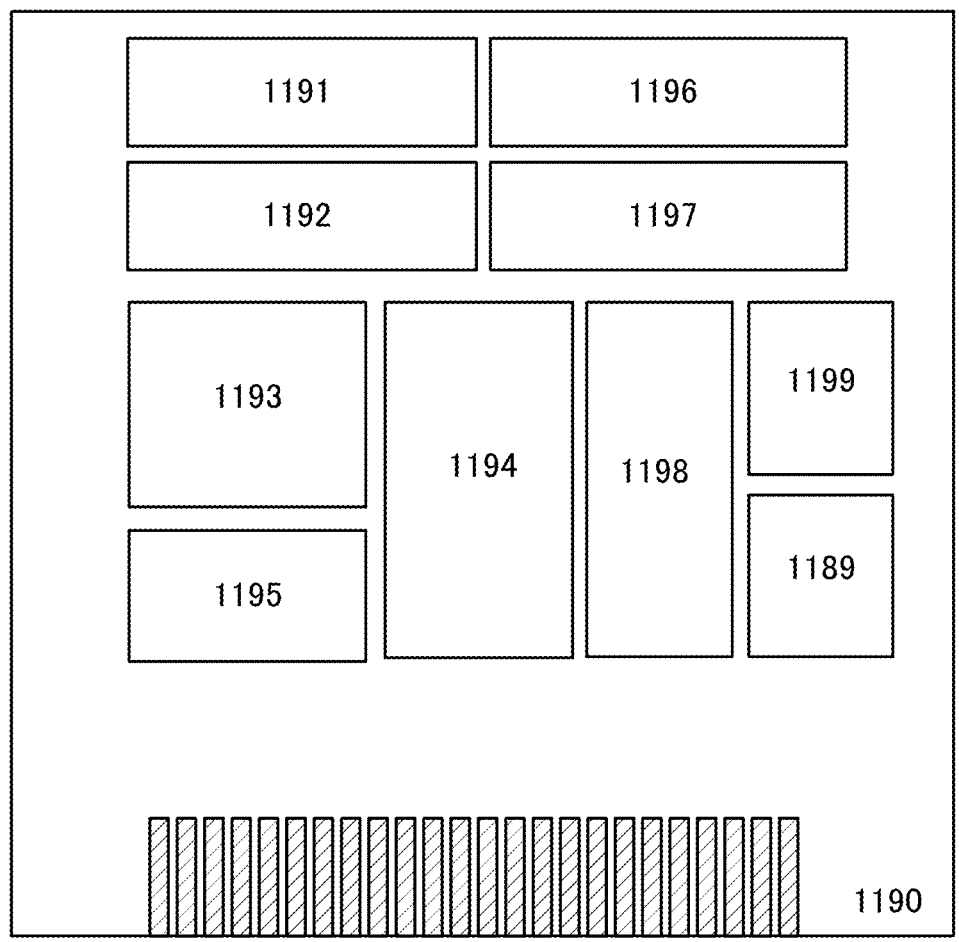
FIG. 19 is a block diagram illustrating a CPU.

FIG. 19 is a block diagram illustrating a configuration example of a CPU including the semiconductor device described in any of the above embodiments.

The CPU illustrated in FIG. 19 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 19 is just an example with a simplified configuration, and an actual CPU has a variety of configurations depending on the application. For example, a CPU may have a GPU-like configuration where a plurality of cores each including the CPU in FIG. 19 or an arithmetic circuit operate in parallel. The number of bits that the CPU can handle with an internal arithmetic circuit or a data bus can be 8, 16, 32, or 64, for example.

An instruction that is input to the CPU through the bus interface 1198 is input to the instruction decoder 1193 and decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 19, memory cells are provided in the register 1196. The semiconductor device described in any of the above embodiments can be used in the register 1196, for example.

In the CPU in FIG. 19, the register controller 1197 selects the type of retention operation in the register 1196 in accordance with an instruction from the ALU 1191. That is, the register controller 1197 selects whether data is held by a flip-flop or by a capacitor in the memory cell included in the register 1196. When data retention by the flip-flop is selected, power supply voltage is supplied to the memory cell in the register 1196. When data retention by the capacitor is selected, the data is rewritten into the capacitor, and supply of power supply voltage to the memory cell in the register 1196 can be stopped.

Note that this embodiment can be combined with any of the other embodiments in this specification as appropriate.

Embodiment 8

This embodiment will describe examples of electronic devices including the semiconductor device described in any of the above embodiments. FIGS. 20A to 20I illustrate electronic devices each including the electronic component 4700 that includes the semiconductor device.

[Mobile Phone]

Figure 20A:
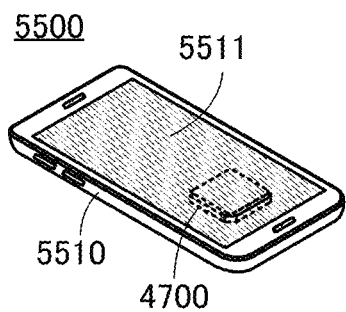
FIG. 20A to FIG. 20I are each a perspective view or a schematic view illustrating an example of a product.

An information terminal 5500 illustrated in FIG. 20A is a mobile phone (a smartphone), that is a type of information terminal. The information terminal 5500 includes a housing 5510 and a display portion 5511. As input interfaces, a touch panel and a button are provided in the display portion 5511 and the housing 5510, respectively.

The semiconductor device described in any of the above embodiments is employed for the information terminal 5500, whereby the power consumption of the information terminal 5500 can be reduced.

[Wearable Terminal]

Figure 20B:
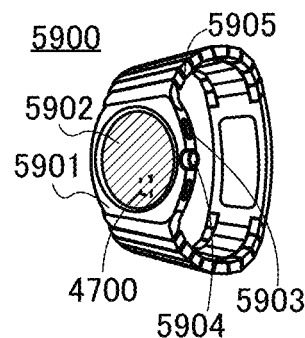

FIG. 20B illustrates an information terminal 5900 as an example of a wearable terminal. The information terminal 5900 includes a housing 5901, a display portion 5902, an operation button 5903, an operator 5904, and a band 5905.

The power consumption of the wearable terminal can be reduced with the use of the semiconductor device described in any of the above embodiments, like the information terminal 5500.

[Information Terminal]

Figure 20C:

FIG. 20C illustrates a notebook information terminal 5300. The notebook information terminal 5300 in FIG. 20C includes, for example, a display portion 5331 in a housing 5330*a* and a keyboard portion 5350 in a housing 5330*b*.

Like the information terminal 5500 described above, the notebook information terminal 5300 uses the semiconductor device described in any of the above embodiments, whereby the power consumption of the notebook information terminal 5300 can be reduced.

Note that although FIGS. 20A to 20C illustrate a smartphone, a wearable terminal, and a notebook information terminal as examples of electronic device, one embodiment of the present invention can also be applied to information terminals other than smartphones, wearable terminals, and notebook information terminals. Examples of the information terminals other than smartphones, wearable terminals, and notebook information terminals include a personal digital assistant (PDA), a desktop information terminal, and a workstation.

[Household Appliance]

Figure 20D:
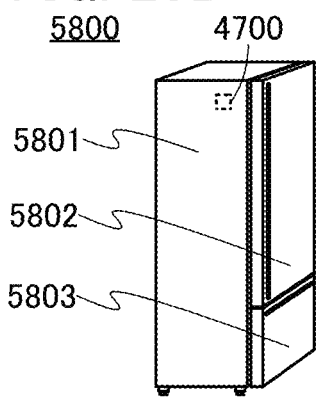

FIG. 20D illustrates an electric refrigerator-freezer 5800 as an example of a household appliance. The electric refrigerator-freezer 5800 includes a housing 5801, a refrigerator door 5802, and a freezer door 5803.

When the semiconductor device described in any of the above embodiments is used in the electric refrigerator-freezer 5800, the electric refrigerator-freezer 5800 can be used for IoT (Internet of Things), for example. The electric refrigerator-freezer 5800 can transmit and receive data on food stored in the electric refrigerator-freezer 5800 and food expiration dates, for example, to/from the above-described information terminal and the like via the Internet, with use of IoT. The electric refrigerator-freezer 5800 can reduce power consumed for transmission of the data.

In this example, the electric refrigerator-freezer is described as an example of a household appliance; other examples of household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

Figure 20E:
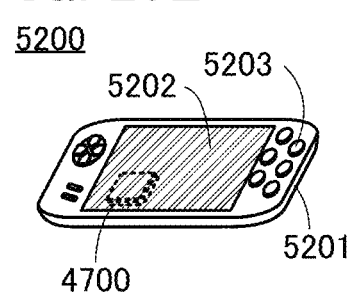

FIG. 20E illustrates a portable game machine 5200 as an example of a game machine. The portable game machine 5200 includes a housing 5201, a display portion 5202, and a button 5203.

An image displayed on the portable game machine 5200 can be output with a display apparatus such as a television device, a personal computer display, a game display, or a head-mounted display.

The portable game machine 5200 including the semiconductor device described in any of the above embodiments can have low power consumption. Furthermore, heat generation from a circuit can be reduced owing to low power consumption; thus, the influence of heat generation on the circuit, the peripheral circuit, and the module can be reduced.

Although FIG. 20E illustrates the portable game machine as an example of a game machine, the electronic device of one embodiment of the present invention is not limited thereto. Examples of the electronic device of one embodiment of the present invention include a stationary game machine, an arcade game machine installed in an entertainment facility (a game center, an amusement park, or the like), and a throwing machine for batting practice installed in sports facilities.

[Moving Vehicle]

The semiconductor device described in any of the above embodiments can be used for an automobile, which is a moving vehicle, and around the driver's seat in an automobile.

Figure 20F:
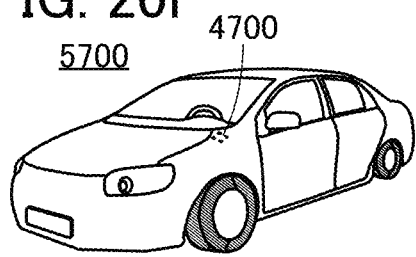

FIG. 20F illustrates an automobile 5700 as an example of a moving vehicle.

An instrument panel showing various kinds of information by displaying a speedometer, a tachometer, a mileage, a fuel meter, a gearshift indicator, air-conditioning settings, and the like is provided around the driver's seat in the automobile 5700. In addition, a display apparatus showing the above information may be provided around the driver's seat.

In particular, the display apparatus can compensate for the view obstructed by the pillar or the like, the blind areas for the driver's seat, and the like by displaying a video taken by an imaging device (not illustrated) provided for the automobile 5700, thereby providing a high level of safety.

The semiconductor device described in any of the above embodiments can be used, for example, for a memory device that can store temporality data necessary for systems such as an autonomous driving system of the automobile 5700 or a system for navigation, risk prediction, or the like.

Note that although an automobile is described above as an example of a moving vehicle, the moving vehicle is not limited to an automobile. Other examples of moving vehicles include a train, a monorail train, a ship, and a flying object (a helicopter, an unmanned aircraft (a drone), an airplane, and a rocket).

[Camera]

The semiconductor device described in any of the above embodiments can be used for a camera.

Figure 20G:
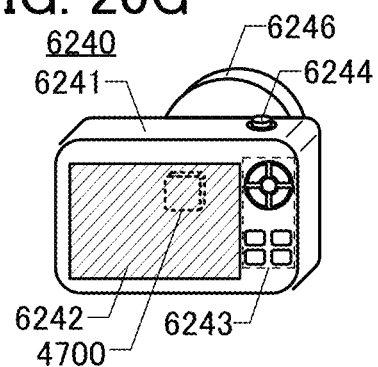

FIG. 20G illustrates a digital camera 6240 as an example of an imaging device. The digital camera 6240 includes a housing 6241, a display portion 6242, operation buttons 6243, a shutter button 6244, and the like. An attachable lens 6246 is attached to the digital camera 6240. Here, the lens 6246 of the digital camera 6240 is detachable from the housing 6241 for replacement; alternatively, the lens 6246 may be inseparable from the housing 6241. Moreover, the digital camera 6240 may be configured to be equipped with a stroboscope, a viewfinder, or the like.

The digital camera 6240 including the semiconductor device described in any of the above embodiments can have low power consumption. Furthermore, heat generation from a circuit can be reduced owing to low power consumption; thus, the influence of heat generation on the circuit, the peripheral circuit, and the module can be reduced.

[ICD]

The semiconductor device described in any of the above embodiments can be used in an implantable cardioverter-defibrillator (ICD).

Figure 20H:
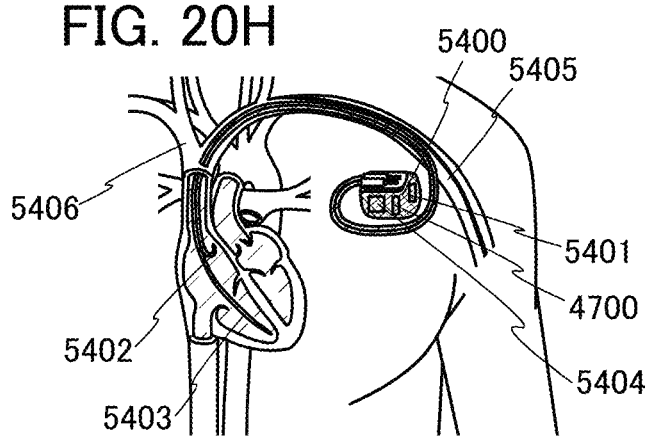

FIG. 20H is a schematic cross-sectional view illustrating an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of them placed in the right ventricle and the end of the other placed in the right atrium.

The ICD main unit 5400 serves as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor, the number of times the treatment with pacing is performed, and the time taken for the treatment, for example, can be stored in the electronic component 4700.

The antenna 5404 can receive power, and the power is charged into the battery 5401. When the ICD main unit 5400 includes a plurality of batteries, the safety can be improved. Specifically, even if one of the batteries in the ICD main unit 5400 is dead, the other batteries can work properly; hence, the batteries also function as an auxiliary power source.

In addition to the antenna 5404 that can receive power, an antenna that can transmit a physiological signal may be provided. For example, a system that monitors the cardiac activity and is capable of monitoring physiological signals such as pulses, respiratory rate, heart rate, and body temperature with an external monitoring device may be constructed.

[Expansion Device for Personal Computer]

The semiconductor device described in any of the above embodiments can be used for a calculator such as a personal computer (PC) and an expansion device for an information terminal.

Figure 20I:
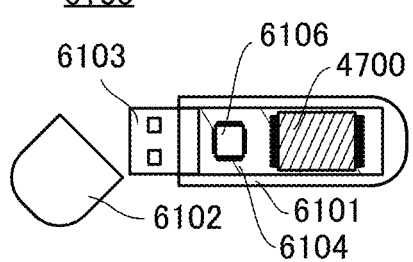

FIG. 20I illustrates, as an example of the expansion device, a portable expansion device 6100 that is externally attached to a PC and includes a chip capable of storing data. When the expansion device 6100 is connected to a PC with a universal serial bus (USB), for example, data can be stored in the chip. FIG. 20I illustrates the portable expansion device 6100; however, the expansion device of one embodiment of the present invention is not limited to this and may be a relatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit including the semiconductor device or the like described in any of the above embodiments. For example, the substrate 6104 is provided with the electronic component 4700 and a controller chip 6106. The USB connector 6103 serves as an interface for connection to an external device.

Although not illustrated, the semiconductor device described in any of the above embodiments can be applied to a computer such as a personal computer (PC), an SD card or a solid state drive (SSD) put in an expansion device for information terminals.

The semiconductor device described in Embodiment 1 or 2 is applied to memory devices included in the above electronic devices, whereby novel electronic devices can be provided.

Note that this embodiment can be combined with any of the other embodiments in this specification as appropriate.

This application is based on Japanese Patent Application Serial No. 2021-112793 filed with Japan Patent Office on Jul. 7, 2021 and Japanese Patent Application Serial No. 2021-112798 filed with Japan Patent Office on Jul. 7, 2021, the entire contents of which are hereby incorporated by reference.

What is claimed is:

1. A semiconductor device comprising:
a circuit comprising a first transistor, a second transistor, and a third transistor, and a fourth transistor,
wherein each of the first transistor and the third transistor is a p-channel transistor and comprises silicon in a channel formation region,
wherein each of the second transistor and the fourth transistor is an n-channel transistor and comprises a metal oxide in a channel formation region,
wherein the metal oxide comprises indium, an element M, and zinc,
wherein the element M is any one of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, and magnesium,
wherein a gate of the first transistor is electrically connected to a gate of the second transistor,
wherein one of a source and a drain of the first transistor is electrically connected to one of a source and a drain of the second transistor,
wherein the other of the source and the drain of the first transistor is electrically connected to a first wiring,
wherein one of a source and a drain of the third transistor is electrically connected to the first wiring through the first transistor,
wherein the other of the source and the drain of the third transistor is electrically connected to the one of the source and the drain of the second transistor through the fourth transistor,
wherein one of a source and a drain of the fourth transistor is electrically connected to the one of the source and the drain of the second transistor, and
wherein each of the first transistor and the second transistor is capable of operating in a subthreshold region.

2. The semiconductor device according to claim 1,
wherein the other of the source and the drain of the second transistor is electrically connected to a second wiring, and
wherein a potential of the first wiring is higher than a potential of the second wiring.

3. The semiconductor device according to claim 1,
wherein each of the second transistor and the fourth transistor further comprises a back gate.

4. A semiconductor device comprising:
a first circuit comprising a first transistor and a second transistor; and
a second circuit comprising a third transistor and a capacitor,
wherein the first transistor is a p-channel transistor and comprises silicon in a channel formation region,
wherein each of the second transistor and the third transistor is an n-channel transistor and comprises a metal oxide in a channel formation region,
wherein the metal oxide comprises indium, an element M, and zinc,
wherein the element M is any one of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, and magnesium,
wherein a gate of the first transistor is electrically connected to a gate of the second transistor,
wherein one of a source and a drain of the first transistor is electrically connected to one of a source and a drain of the second transistor and one of a source and a drain of the third transistor,
wherein the other of the source and the drain of the third transistor is electrically connected to the capacitor, and
wherein each of the first transistor and the second transistor is capable of operating in a subthreshold region.

5. The semiconductor device according to claim 4,
wherein the other of the source and the drain of the first transistor is electrically connected to a first wiring,
wherein the other of the source and the drain of the second transistor is electrically connected to a second wiring, and wherein a potential of the first wiring is higher than a potential of the second wiring.

6. The semiconductor device according to claim 4, wherein each of the second transistor and the third transistor further comprises a back gate.

7. The semiconductor device according to claim 4, wherein the first circuit is a clocked inverter circuit.

8. The semiconductor device according to claim 1, wherein the other of the source and the drain of the fourth transistor is electrically connected to the other of the source and the drain of the third transistor.

9. A semiconductor device comprising:
a circuit comprising a first transistor, a second transistor, and a third transistor, and a fourth transistor,
wherein each of the first transistor and the third transistor is a p-channel transistor and comprises silicon in a channel formation region,
wherein each of the second transistor and the fourth transistor is an n-channel transistor and comprises a metal oxide in a channel formation region,
wherein the metal oxide comprises indium, an element M, and zinc,
wherein the element M is any one of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, and magnesium,
wherein a gate of the first transistor is electrically connected to a gate of the second transistor,
wherein one of a source and a drain of the first transistor is electrically connected to one of a source and a drain of the second transistor,
wherein the other of the source and the drain of the first transistor is electrically connected to a first wiring through the third transistor,
wherein one of a source and a drain of the third transistor is electrically connected to the first wiring,
wherein the other of the source and the drain of the third transistor is electrically connected to the one of the source and the drain of the second transistor through the first transistor,
wherein one of a source and a drain of the fourth transistor is electrically connected to the one of the source and the drain of the second transistor, and
wherein each of the first transistor and the second transistor is capable of operating in a subthreshold region.

10. The semiconductor device according to claim 9, wherein the other of the source and the drain of the second transistor is electrically connected to a second wiring, and
wherein a potential of the first wiring is higher than a potential of the second wiring.

11. The semiconductor device according to claim 9, wherein each of the second transistor and the fourth transistor further comprises a back gate.

12. The semiconductor device according to claim 9, wherein the other of the source and the drain of the fourth transistor is electrically connected to a third wiring.

* * * * *